(12) United States Patent
Yamawaku et al.

(10) Patent No.: US 9,111,747 B2
(45) Date of Patent: Aug. 18, 2015

(54) FILM DEPOSITION APPARATUS, SUBSTRATE PROCESSING APPARATUS AND FILM DEPOSITION METHOD

(71) Applicant: Tokyo Electron Limited, Tokyo (JP)

(72) Inventors: Jun Yamawaku, Yamanashi (JP); Chishio Koshimizu, Yamanashi (JP); Mitsuhiro Tachibana, Iwate (JP); Hitoshi Kato, Iwate (JP); Takeshi Kobayashi, Iwate (JP); Shigehiro Miura, Iwate (JP); Takafumi Kimura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/916,847

(22) Filed: Jun. 13, 2013

(65) Prior Publication Data
US 2013/0337635 A1 Dec. 19, 2013

(30) Foreign Application Priority Data

Jun. 15, 2012 (JP) ................................ 2012-136176
Dec. 13, 2012 (JP) ................................ 2012-272300
Mar. 27, 2013 (JP) ................................ 2013-066665

(51) Int. Cl.
| | |
|---|---|
| *H01L 21/31* | (2006.01) |
| *H01L 21/02* | (2006.01) |
| *C23C 16/455* | (2006.01) |
| *C23C 16/509* | (2006.01) |
| *H01L 21/687* | (2006.01) |

(52) U.S. Cl.
CPC ...... *H01L 21/02104* (2013.01); *C23C 16/4554* (2013.01); *C23C 16/45519* (2013.01); *C23C 16/45551* (2013.01); *C23C 16/509* (2013.01); *H01L 21/0217* (2013.01); *H01L 21/0228* (2013.01); *H01L 21/0234* (2013.01); *H01L 21/02164* (2013.01); *H01L 21/02167* (2013.01); *H01L 21/02274* (2013.01); *H01L 21/68764* (2013.01); *H01L 21/68771* (2013.01)

(58) Field of Classification Search
CPC ........................... C23C 14/345; C23C 14/352
See application file for complete search history.

(56) References Cited

U.S. PATENT DOCUMENTS

| | | | |
|---|---|---|---|
| 6,167,837 B1* | 1/2001 | Cook ........................ | 118/723 E |
| 2003/0102087 A1* | 6/2003 | Ito et al. ................... | 156/345.46 |
| 2004/0163764 A1* | 8/2004 | Collins et al. ............ | 156/345.48 |
| 2006/0073362 A1* | 4/2006 | Ishiyama ................... | 428/848.1 |
| 2007/0218702 A1* | 9/2007 | Shimizu et al. ............... | 438/758 |

FOREIGN PATENT DOCUMENTS

| | | |
|---|---|---|
| JP | 08-213378 | 8/1996 |
| JP | 2010-239102 | 10/2010 |
| JP | 2011-040574 | 2/2011 |

* cited by examiner

*Primary Examiner* — Zandra Smith
*Assistant Examiner* — Andre' C Stevenson
(74) *Attorney, Agent, or Firm* — IPUSA, PLLC

(57) ABSTRACT

A film deposition apparatus configured to perform a film deposition process on a substrate in a vacuum chamber includes a turntable configured to rotate a substrate loading area to receive the substrate, a film deposition area including at least one process gas supplying part configured to supply a process gas onto the substrate loading area and configured to form a thin film by depositing at least one of an atomic layer and a molecular layer along with a rotation of the turntable, a plasma treatment part provided away from the film deposition area in a rotational direction of the turntable and configured to treat the at least one of the atomic layer and the molecular layer for modification by plasma, and a bias electrode part provided under the turntable without contacting the turntable and configured to generate bias potential to attract ions in the plasma toward the substrate.

17 Claims, 50 Drawing Sheets

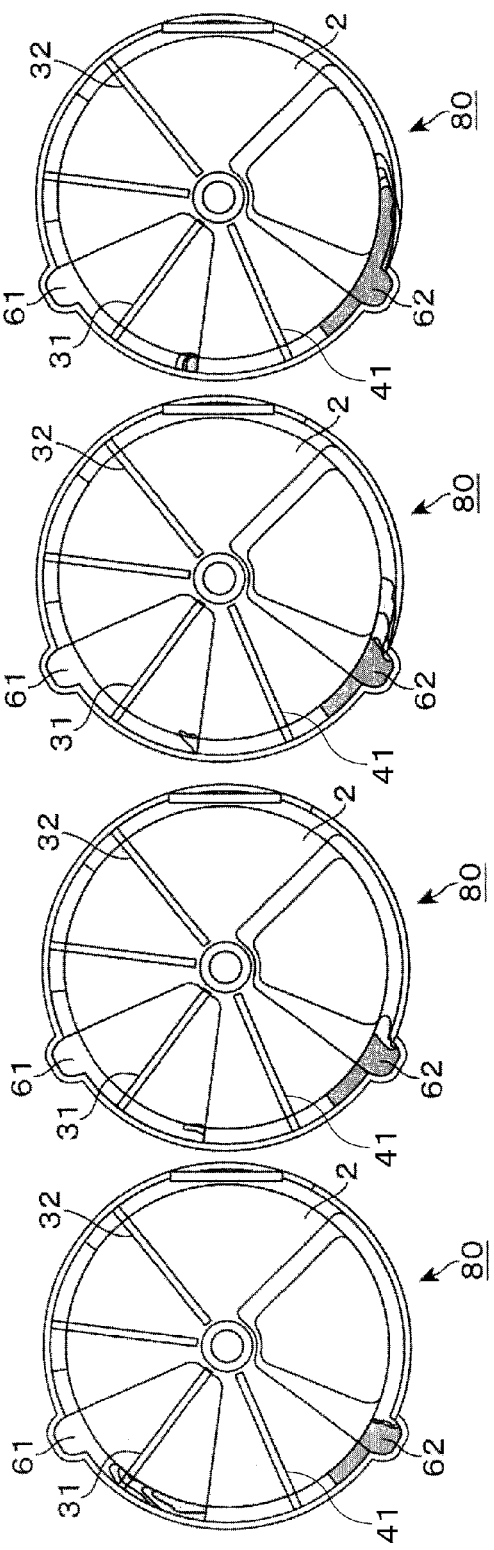
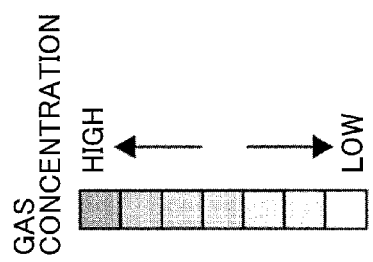

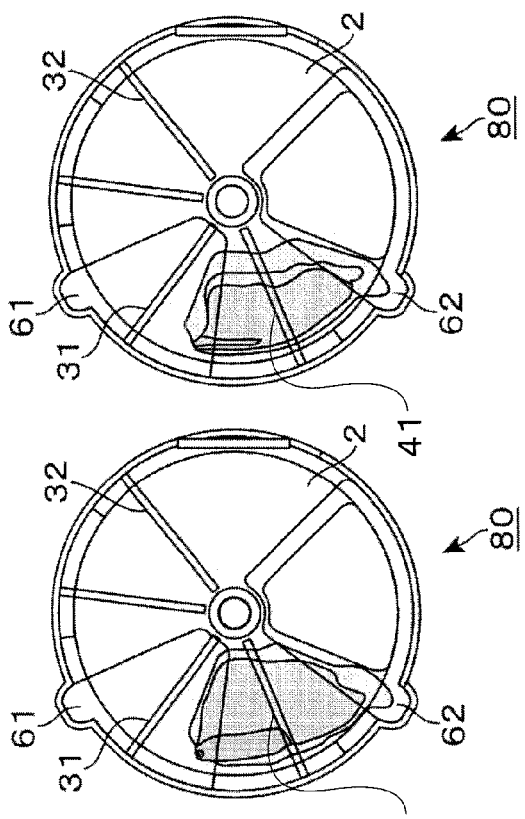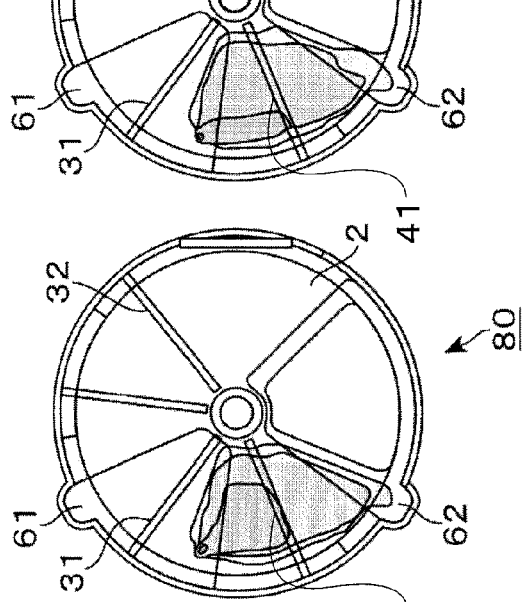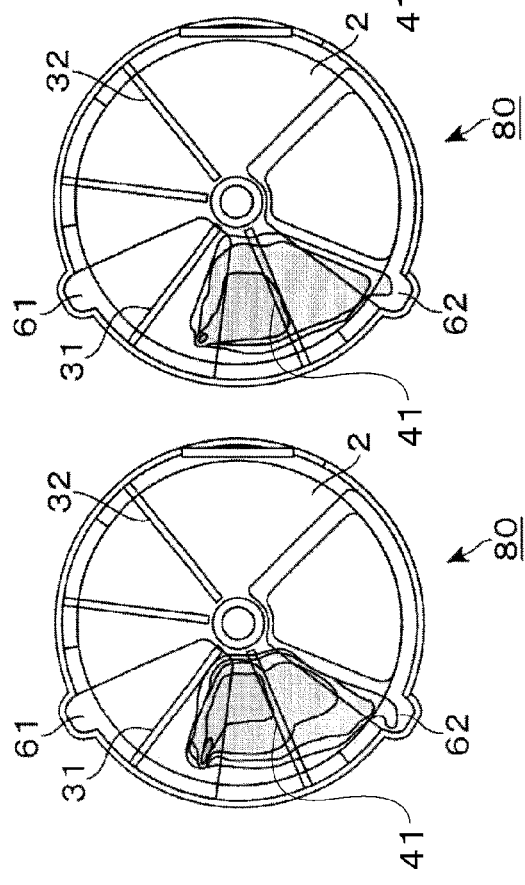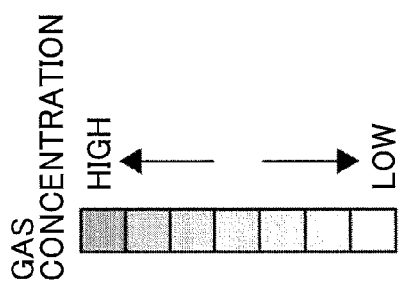

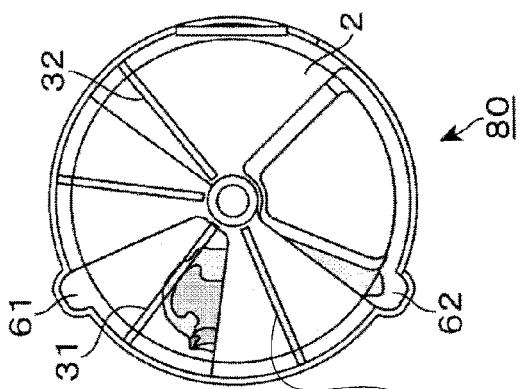
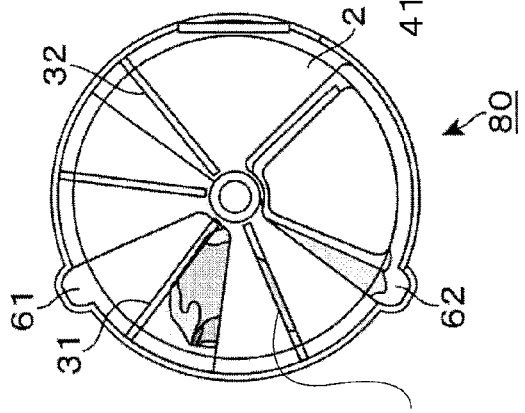
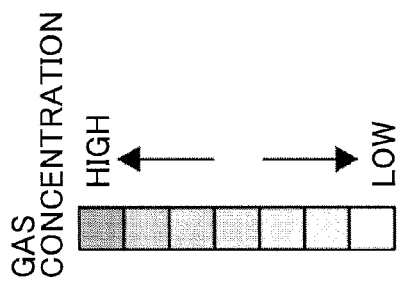
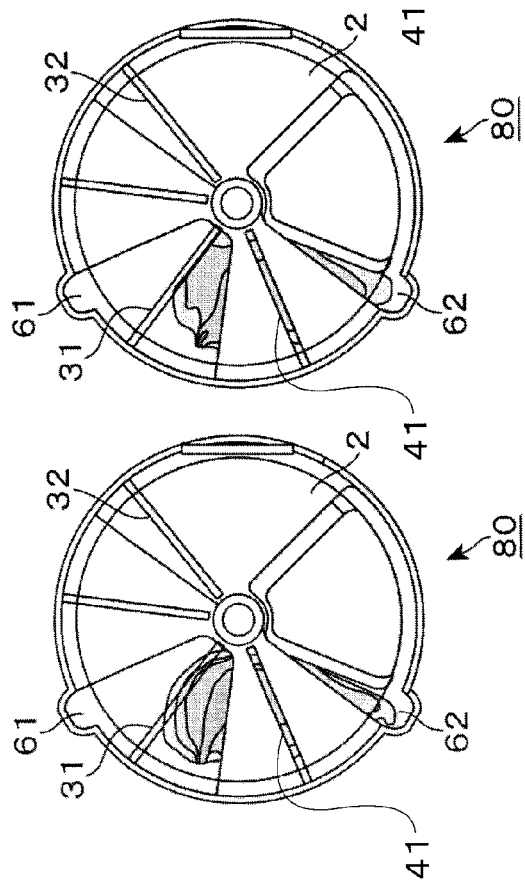

ROTATIONAL DIRECTION OF TURNTABLE

FILM DEPOSITION APPARATUS, SUBSTRATE PROCESSING APPARATUS AND FILM DEPOSITION METHOD

CROSS-REFERENCE TO RELATED APPLICATIONS

This patent application is based upon and claims the benefit of priority of Japanese Patent Application No. 2012-136176, filed on Jun. 15, 2012, Japanese Patent Application No. 2012-272300, filed on Dec. 13, 2012, and Japanese Patent Application No. 2013-66665, filed on Mar. 27, 2013, the entire contents of which are incorporated herein by reference.

BACKGROUND OF THE INVENTION

1. Field of the Invention

The present invention relates to a film deposition apparatus, a substrate processing apparatus and a film deposition method that perform a plasma treatment on a substrate.

2. Description of the Related Art

An ALD (Atomic Layer Deposition) method is known, for example, as one of the methods of depositing a thin film such as a silicon oxide film (i.e., $SiO_2$) on a substrate such as a semiconductor wafer (which is called a "wafer" hereinafter), as disclosed in Japanese Patent Application Laid-Open Publication No. 2010-239102. In this apparatus, five wafers are arranged on a turntable in a circumferential direction, and a plurality of gas nozzles is arranged above the turntable. The apparatus deposits a reaction product on the wafers in a layer-by-layer manner by supplying a plurality of kinds of reaction gases that react with each other on the respective rotating wafers.

In such an ALD method, an apparatus is known that provides a member to perform the plasma modification at a position away from the gas nozzle in the circumferential direction to perform a plasma modification for the respective reaction product deposited on the wafers, as disclosed in Japanese Patent Application Laid-Open Publication No. 2011-40574. However, when a concave portion such as a hole or a groove (trench) having a high aspect ratio such as one more than tens or one hundred in a surface of the wafer, a degree of the modification may vary in a depth direction of the concave portion. In other words, when the concave portion with the high aspect ratio is formed, the plasma (which is more specifically, argon ions) is unlikely to go into the concave portion. Moreover, because the plasma treatment and the film deposition process are performed together in a vacuum chamber, a process pressure in the vacuum chamber is higher than a vacuum atmosphere in which the plasma can remain active preferably. Due to this, the plasma is likely to be deactivated when the plasma contacts an inner wall of the concave portion, which also causes the degree of modification to vary in the depth direction of the concave portion. Furthermore, even when the concave portion is not formed in the wafer, in order to perform the modification treatment while the turntable rotates one revolution, in other words, in order to preferably perform modification in a narrow area between gas nozzles adjacent to each other, high-density plasma needs to be formed in the vicinity of the wafer.

Japanese Patent Application Laid-Open Publication No. 8-213378 discloses an apparatus that applies a bias voltage to a lower electrode, but does not disclose a technique that rotates a wafer by using a turntable.

SUMMARY OF THE INVENTION

Embodiments of the present invention provide a novel and useful film deposition apparatus, substrate processing apparatus and film deposition method solving one or more of the problems discussed above.

More specifically, embodiments of the present invention provide a film deposition apparatus, a substrate processing apparatus and a film deposition method that can perform a uniform plasma treatment in a depth direction of a concave portion formed in a surface of a substrate while performing the plasma treatment on the substrate rotating by a turntable.

According to one embodiment of the present invention, there is provided a film deposition apparatus configured to perform a film deposition process on a substrate in a vacuum chamber, the film deposition apparatus includes a turntable configured to rotate a substrate loading area to receive the substrate, a film deposition area including at least one process gas supplying part configured to supply a process gas onto the substrate loading area and configured to form a thin film by depositing at least one of an atomic layer and a molecular layer along with a rotation of the turntable, a plasma treatment part provided away from the film deposition area in a rotational direction of the turntable and configured to treat the at least one of the atomic layer and the molecular layer for modification by plasma generated by converting a plasma generating gas to the plasma, a bias electrode part provided under the turntable without contacting the turntable and configured to generate bias potential to attract ions in the plasma toward the substrate, and an evacuation mechanism configured to evacuate the vacuum chamber.

According to another embodiment of the present invention, there is provided a substrate processing apparatus that includes a turntable configured to rotate a substrate loading area to receive the substrate, a plasma treatment part configured to convert a plasma generating gas to plasma and configured to supply the plasma to the substrate loading area in order to perform a plasma treatment on the substrate, a bias electrode part provided under the turntable without contacting the turntable and configured to generate bias potential to attract ions in the plasma toward the substrate, and an evacuation mechanism configured to evacuate the vacuum chamber.

According to another embodiment of the present invention, there is provided a film deposition method that includes steps of loading a substrate on a substrate loading area on a turntable, the substrate including at least one concave portion formed in a surface thereof, rotating the substrate loading area by rotating the turntable, depositing at least one of a molecular layer and an atomic layer on the substrate by supplying the process gas onto the substrate on the substrate loading area, supplying a plasma generating gas in the vacuum chamber and converting the plasma generating gas to plasma, thereby performing a modification treatment of at least one of the molecular layer and the atomic layer, attracting the plasma toward the substrate by applying a bias voltage to the substrate, and evacuating the vacuum chamber.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 39A though 39D are property diagrams showing results of simulations performed in an embodiment of the present invention;

FIGS. 40A through 40D are property diagrams showing results of simulations performed in an embodiment of the present invention;

FIGS. 41A through 41D are property diagrams showing results of simulations performed in an embodiment of the present invention;

DETAILED DESCRIPTION OF THE PREFERRED EMBODIMENTS

A description is given below, with reference to drawings of embodiments of the present invention. To begin with, a description is given below of a substrate processing apparatus of an embodiment of the present invention applied to a film deposition apparatus, with reference to FIGS. 1 through 9. As shown in FIGS. 1 through 4, this film deposition apparatus includes a vacuum chamber 1 having an approximately circular planar shape, and a turntable 2 provided in the vacuum chamber 1, having a rotational center that coincides with a center of the vacuum chamber 1, and made of an insulator such as quartz. The film deposition apparatus is configured to perform a film deposition process and a plasma modification treatment on a wafer W. The film deposition apparatus, as described below, even when a concave portion having an aspect ratio of ten or more to two hundred or less such as dozens of aspect ratio or more than one hundred aspect ratio is formed in a surface of the wafer W, is configured to make a degree of a plasma modification in a depth direction of the concave portion uniform by attracting the plasma to the wafer W side. Subsequently, before a detailed description is given of a bias electrode part 120 that is a main part of the film deposition apparatus, a description is given of respective parts of the film deposition apparatus.

Figure 1:
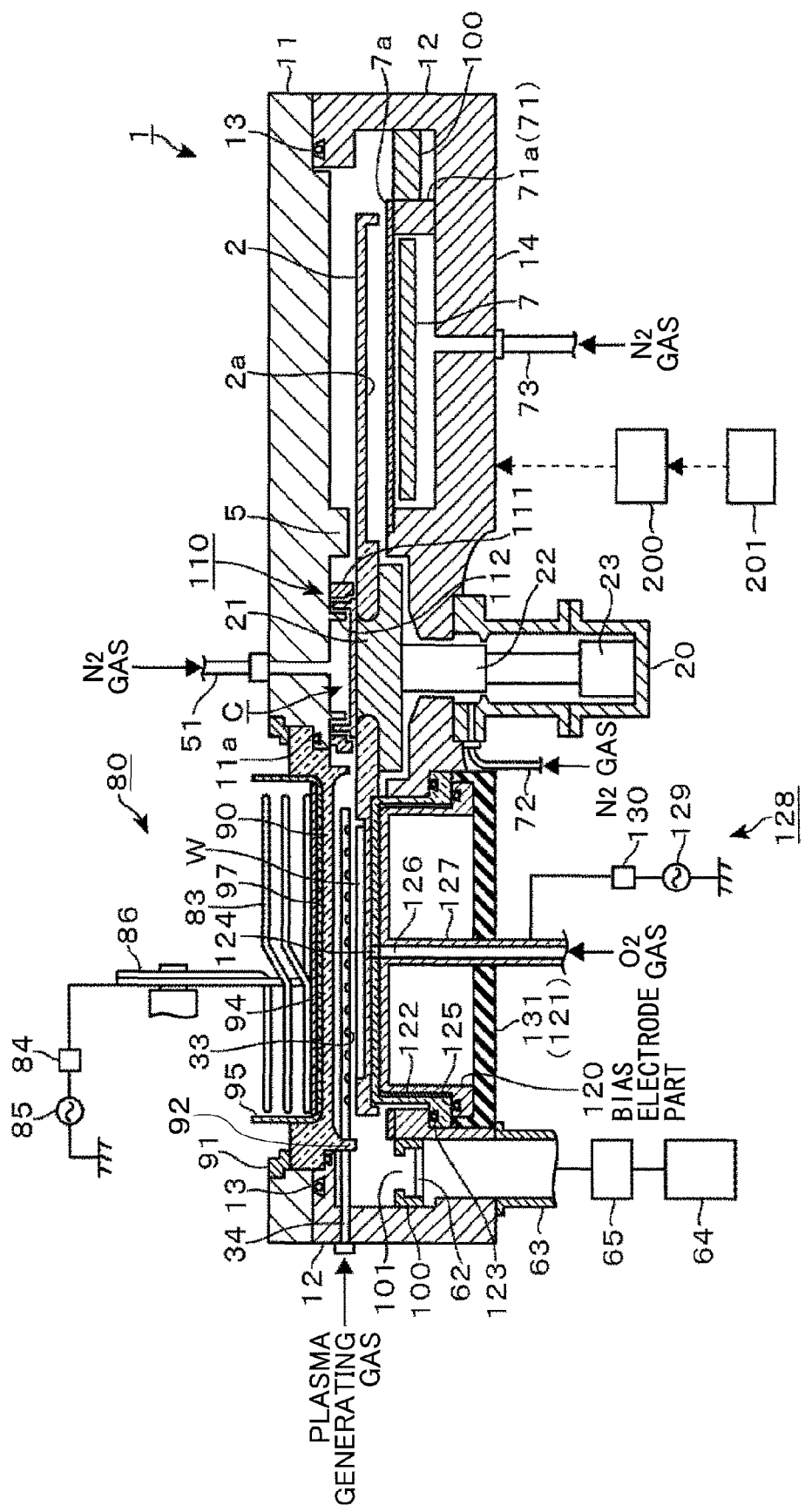
FIG. 1 is a vertical cross-sectional side view illustrating an example of a film deposition apparatus of an embodiment of the present invention.

The vacuum chamber 1 includes a ceiling plate 11 and a chamber body 12, and the ceiling plate 11 is configured to be attachable to and detachable from the chamber body 12. A separation gas supply pipe 51 for supplying a nitrogen ($N_2$) gas as a separation gas is connected to a center portion in an upper surface of the ceiling plate 11 to prevent different process gases from being mixed with each other in a center area C in the vacuum chamber 1. In FIG. 1, a seal member, for example, an O-ring 13 is provided in a periphery in an upper surface of the chamber body 12.

As shown in FIG. 1, a heater unit 7 that is a heating mechanism is provided above a bottom portion 14 of the vacuum chamber 1, and is configured to heat the wafer W on the turntable 2 through the turntable 2 up to a predetermined film deposition temperature, for example, 300 degrees. In FIG. 1, a cover member 71a is provided on the lateral side of the heater unit 7, and a covering member 7a covers the heater unit 7 from the above. Moreover, a purge gas supply pipe 73 for purging a space in which the heater unit 7 is arranged is provided at a plurality of positions along a circumferential direction in the bottom portion 14 under the hater unit 7.

The turntable 2 is fixed to a core portion 21 having an approximately cylindrical shape at the center portion, and is configured to be rotatable by a rotational shaft 22 connected to a lower surface of the core portion 21 and extending in a vertical direction, around the vertical axis in a clockwise direction in this example. In FIG. 1, a drive part (i.e. a rotation mechanism) 23 is provided to rotate the rotational shaft 22 around the vertical axis, and a case body 20 houses the rotational shaft 22 and the drive part 23. A flange part on the upper surface side of the case body 20 is hermetically attached to the lower surface of the bottom portion 14 of the vacuum chamber 1. Furthermore, a purge gas supply pipe 72 for supplying a nitrogen gas as a purge gas to a lower area of the turntable 2 is connected to the case body 20. The outer circumference of the core portion 21 in the bottom portion 14 of the vacuum chamber 1 is formed in a ring shape so as to approach from the lower side, and forms a protrusion portion 12a.

Figure 3:
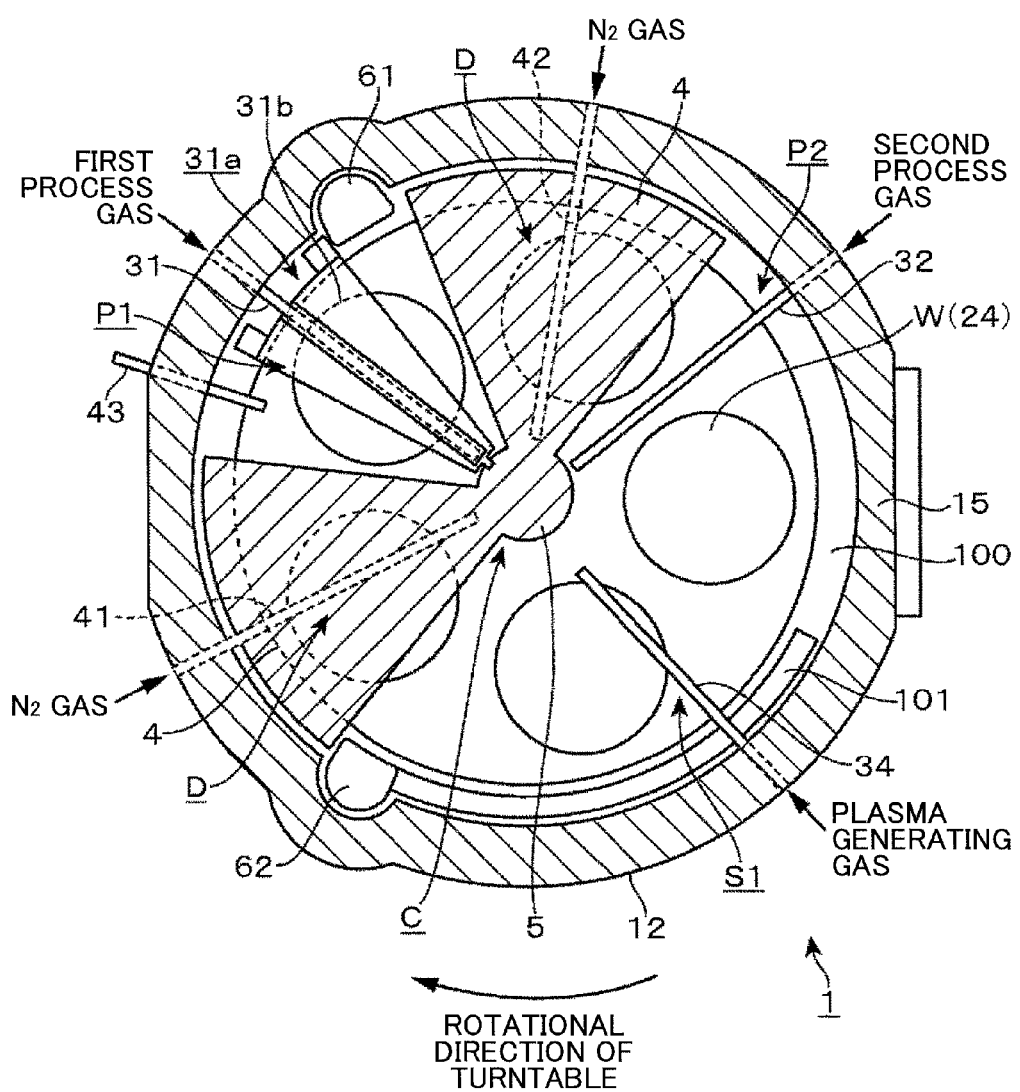
FIG. 3 is a first horizontal cross-sectional plan view illustrating the film deposition apparatus.
Figure 4:
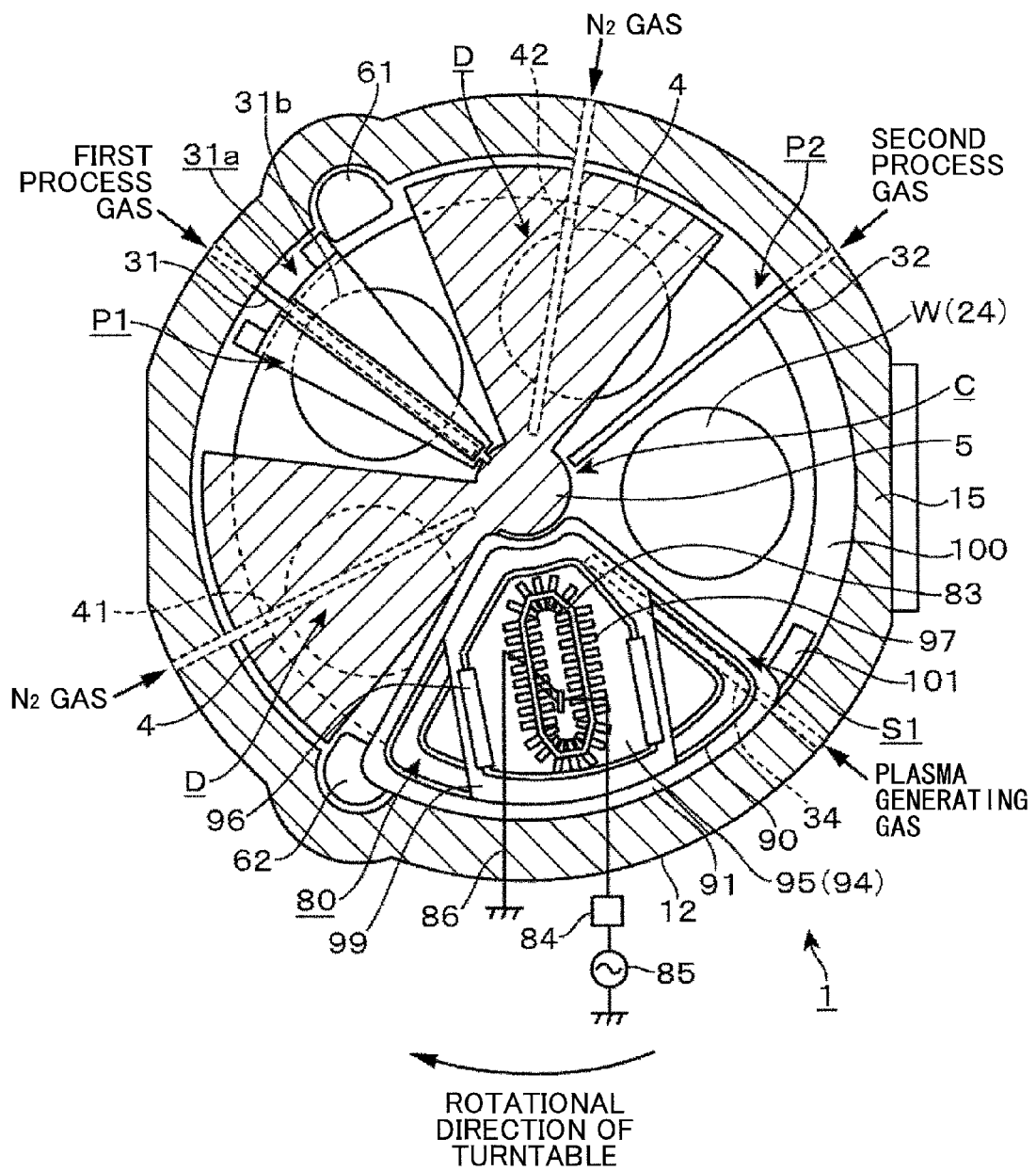
FIG. 4 is a second horizontal cross-sectional plan view illustrating the film deposition apparatus.
Figure 5:
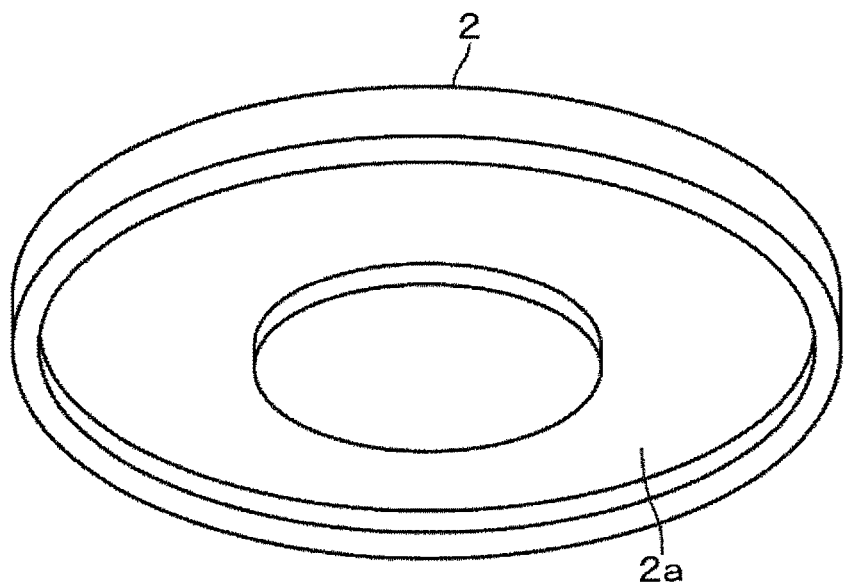
FIG. 5 is a perspective view illustrating a turntable of the film deposition apparatus.

As shown in FIGS. 3 and 4, circular concave portions 24 are provided as a substrate loading area to hold the wafer W by laying down the wafer W therein. The concave portions 24 are formed at a plurality of locations, for example, at five locations along a rotational direction (i.e. circumferential direction) of the turntable 2. As shown in FIGS. 5 though 9, the lower surface of the turntable 2 forms a groove portion 2a that is a concave portion to house the bias electrode portion 120 by being depressed in a ring shape concentrically to the turntable 2, so as to make a dimension h between the bottom surfaces of the respective concave portions 24 and the lower surface of the turntable 2 (i.e., a board thickness dimension h of the turntable 2) as small as possible. The board thickness dimension h is, for example, 6 mm to 20 mm. The bias electrode part 120 described below is arranged so that an upper surface of the bias electrode part 120 is positioned in the groove portion 2a. Here, FIG. 5 illustrates a perspective view when the turntable 2 is seen from the lower side.

Six nozzles 31, 32, 34, 41, 42 and 43 each made of, for example, quartz are arranged in a radial fashion at intervals in the circumferential direction of the vacuum chamber 1 at respective positions opposite to a passing area of the concave portions 24. These respective nozzles 31, 32, 34, 41, 42 and 43 are each installed, for example, so as to horizontally extend facing the wafer W from the outer peripheral wall of the vacuum chamber 1 toward the center area C. In this example, the plasma generating gas nozzle 34, the separation gas nozzle 41, the cleaning gas nozzle 43, the first process gas nozzle 31, the separation gas nozzle 42, and the second process gas nozzle 32 are arranged in this order in a clockwise fashion (i.e., the rotational direction of the turntable 2) when seen from a transfer opening 15 described below. Here, the drawings other than FIG. 3 omit the cleaning gas nozzle 43.

Figure 2:
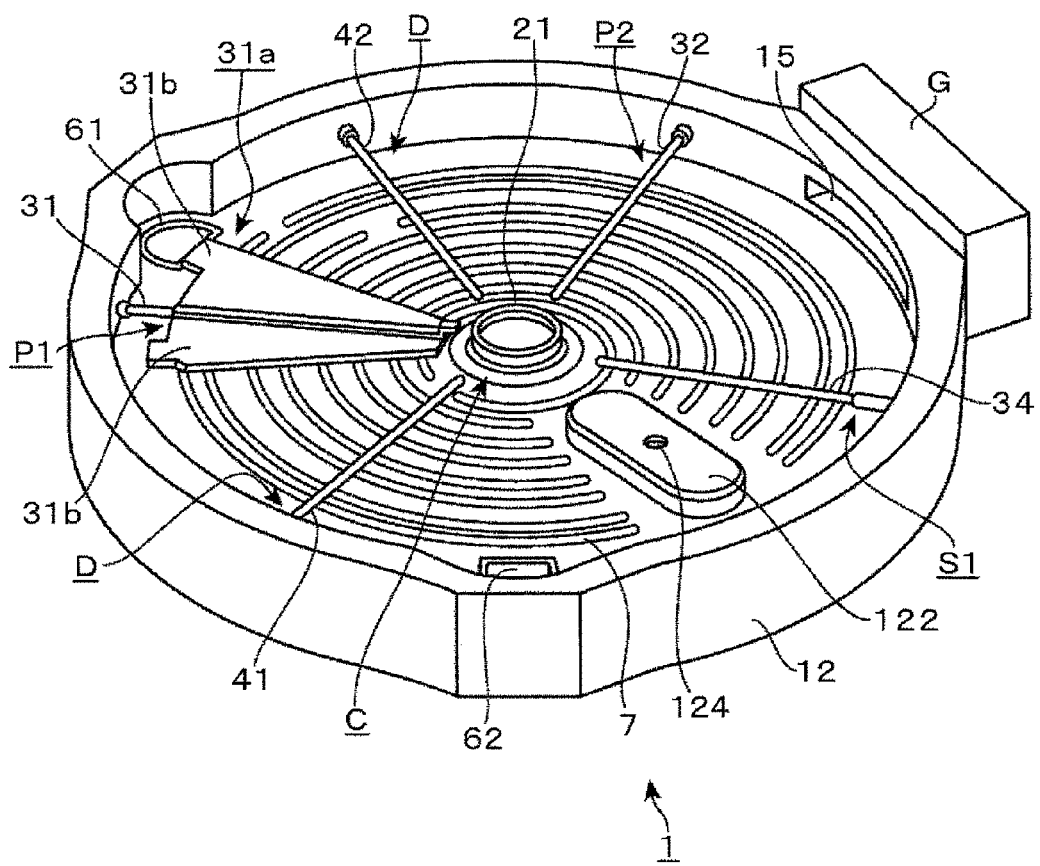
FIG. 2 is a perspective view of the film deposition apparatus.

The process gas nozzles 31 and 32 respectively form a first process gas supply part and a second process gas supply part, and the plasma generating gas nozzle 34 forms a plasma generating gas supply part. In addition, the separation gas nozzles 41 and 42 respectively form separation gas supply parts. Here, FIGS. 2 and 3 illustrate a state of a plasma treatment part 80 and a casing 90 described below removed from the chamber body 12 so as to make the plasma generating gas nozzle 34 visible. FIG. 4 illustrates a state of the plasma treatment part 80 and the casing 90 installed in the chamber body 12. Moreover, FIG. 2 illustrates a state of the turntable 2 also removed from the chamber body 12.

The respective nozzles 31, 32, 34, 41 and 42 are connected to the following respective gas sources (not shown in the drawings) through a flow rate controlling valve. That is to say, the first process gas nozzle 31 is connected to a supply source of a first process gas including Si (silicon) such as BTBAS (Bis(tertiary-butyl-amino)silane), $SiH_2(NH-C(CH_3)_3)_3)_2$ gas or the like. The second process gas nozzle 32 is connected to a supply source of second process gas such as a mixed gas of an ozone ($O_3$) gas and an oxygen ($O_2$) gas (which is more specifically an oxygen gas supply source including an ozonizer). The plasma generating gas nozzle 34 is connected to a supply source of a plasma generating gas composed of a mixed gas, for example, of an argon (Ar) gas and an oxygen gas. The separation gas nozzles 41 and 42 are respectively connected to a gas supply source of a nitrogen gas that is the separation gas. The cleaning gas nozzle 43 is connected to a supply source of a cleaning gas (e.g., a fluorine ($F_2$) gas, a chlorine ($Cl_2$) gas, or a gas containing the fluorine and the chlorine ($ClF_3$)). A plurality of gas discharge holes 33 is respectively formed, for example, in the lower surfaces of these gas nozzles 31, 32, 34, 41 and 42, and is arranged at a plurality of locations along the radial direction of the turntable 2, for example, at regular intervals. The cleaning gas nozzle 43 is open on the slightly center area C side of the outer edge of the turntable 2.

Above the first process gas nozzle 31, a nozzle cover (fin) 31a is arranged to circulate the gas discharged from the nozzle 31 along the wafer W. The nozzle cover 31a is formed throughout a lengthwise direction of the nozzle 31 and along an outer wall surface of the nozzle 31, and end portions 31b on both sides of the nozzle cover 31a horizontally extend so as to form an approximate sector shape as seen from a planar perspective. Outer periphery regions of the end portions 31b are respectively folded downward so as to be along the outer edge of the turntable 2. The nozzle cover 31a is supported by the ceiling plate 11 of the vacuum chamber 1 and the above-mentioned covering member 7a.

Areas under the process gas nozzles 31 and 32 respectively become a first process area P1 (a film deposition area) to adsorb the first process gas onto the wafer W, and a second process area P2 to react a second process gas with a component of the first process gas adsorbed on the wafer W. An area below the plasma generating gas nozzle 34, as described below, becomes a modification area S1 to perform a plasma modification treatment on the wafer W. The separation gas nozzles 41 and 42 are respectively provided to form separation areas D for separating the first process area P1 and the second process area P2 from each other. As shown in FIGS. 3 and 4, approximately sectorial convex portions 4 are provided on the ceiling plate 11 of the vacuum chamber 1 in the separation areas D, and the separation gas nozzles 41 and 42 are housed in the convex portions 4. Accordingly, on both sides in the circumferential direction of the turntable 2 of the separation gas nozzles 41 and 42, low ceiling surfaces that are the lower surfaces of the convex portions 4 are arranged to prevent the respective process gases from being mixed with each other, and higher ceiling surfaces higher than the low ceiling surfaces are arranged on both sides in the circumferential direction of the low ceiling surfaces. The outer edge portions of the convex portions 4 (i.e., regions of the outer edge side of the vacuum chamber 1) are perpendicularly folded downward so as to face the outer edge surface of the turntable 2 and to be slightly apart from the chamber body 12 in order to prevent the respective process gases from being mixed with each other.

Figure 6:
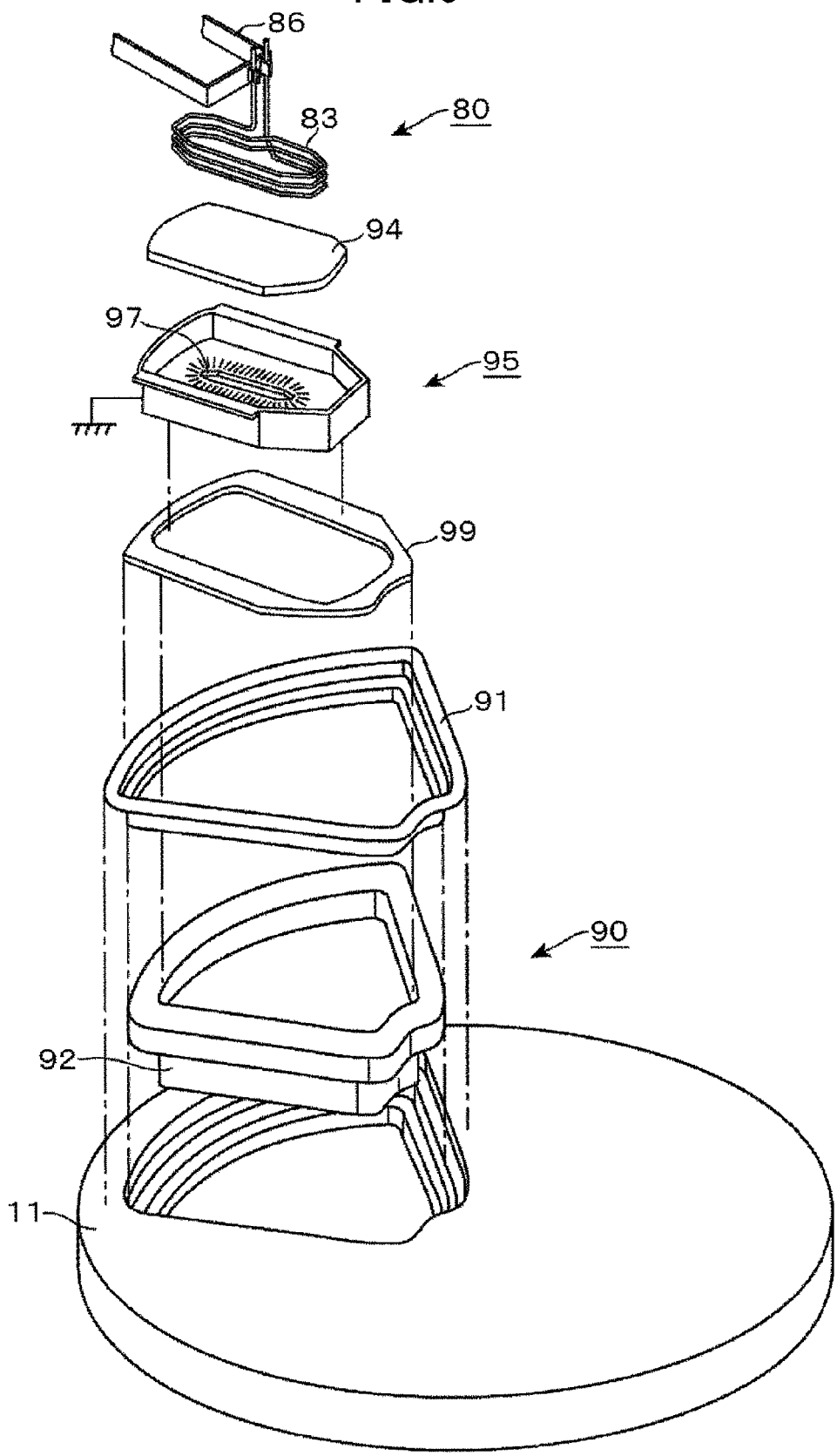
FIG. 6 is an exploded perspective view illustrating a plasma treatment part of the film deposition apparatus.

Next, a description is given of the plasma treatment part 80. As illustrated in FIGS. 1 and 6, the plasma treatment part 80 is configured to wind an antenna 83 made of a metal wire in a coil form, and arranged to cross the passing area of the wafer W from the center portion side to the outer edge side of the turntable 2 as seen from a planar perspective. As shown in FIG. 4, the antenna 83 forms an approximate octagon shape so as to surround a zonal area extending along the radial direction of the turntable 2. Moreover, the antenna 83 is connected to a radio frequency power source 85 of an output power of, for example, 5000 W with a frequency of, for example, 13.56 MHz through a matching box 84, and is arranged to be hermetically zoned from the inside area of the vacuum chamber 1. More specifically, the ceiling plate 11 above the plasma generating gas nozzle 34 is open to form an approximate sector shape as seen from a planar perspective, and the opening is hermetically blocked by the casing 90 made of, for example, quartz and the like. This casing 90 includes a periphery portion that horizontally extends throughout the circumference in a flange form, and a central part formed to be depressed toward the inner area of the vacuum chamber 1, and houses the antenna 83 therein. In FIG. 1, a seal member 11a is provided between the casing 90 and the ceiling plate 11, and a pressing member 91 is provided is to press the periphery portion of the casing 90 downward. Moreover, in FIG. 1, a connecting electrode 86 is provided to electrically connect the plasma processing part 80, the matching box 84 and the radio frequency power source 85 with each other.

As shown in FIGS. 1 and 6, a peripheral portion of the lower surface of the casing 90 perpendicularly extends downward (toward the turntable 2) throughout the circumference and forms a protruding portion 92 for gas restriction to prevent a nitrogen gas and an ozone gas from entering an area under the casing 90. The plasma generating gas nozzle 34 is housed in the area surrounded by an inner periphery of the protruding portion 92, the lower surface of the casing and the upper surface of the turntable 2.

As shown in FIGS. 1, 4 and 6, a boxy Faraday shield 95 whose upper surface is open is arranged between the casing 90 and the antenna 83. This Faraday shield 95 is made of a metal plate having a conductive plate-like body, and is grounded. Slits 97 are formed in a bottom surface of the Faraday shield 95 to prevent an electric field component of an electric field and a magnetic field (an electromagnetic field) generated by the antenna 83 from going toward the lower wafer W and to pass through the magnetic field to the wafer W. The slits 97 are individually formed to extend in a direction perpendicular to the winding direction of the antenna 83, and arranged throughout the circumferential direction along the antenna 83 at intervals under the antenna 83. An insulating plate 94 made of, for example, quartz is provided between the Faraday shield 95 and the antenna 83 to obtain insulation therebetween.

Figure 7:
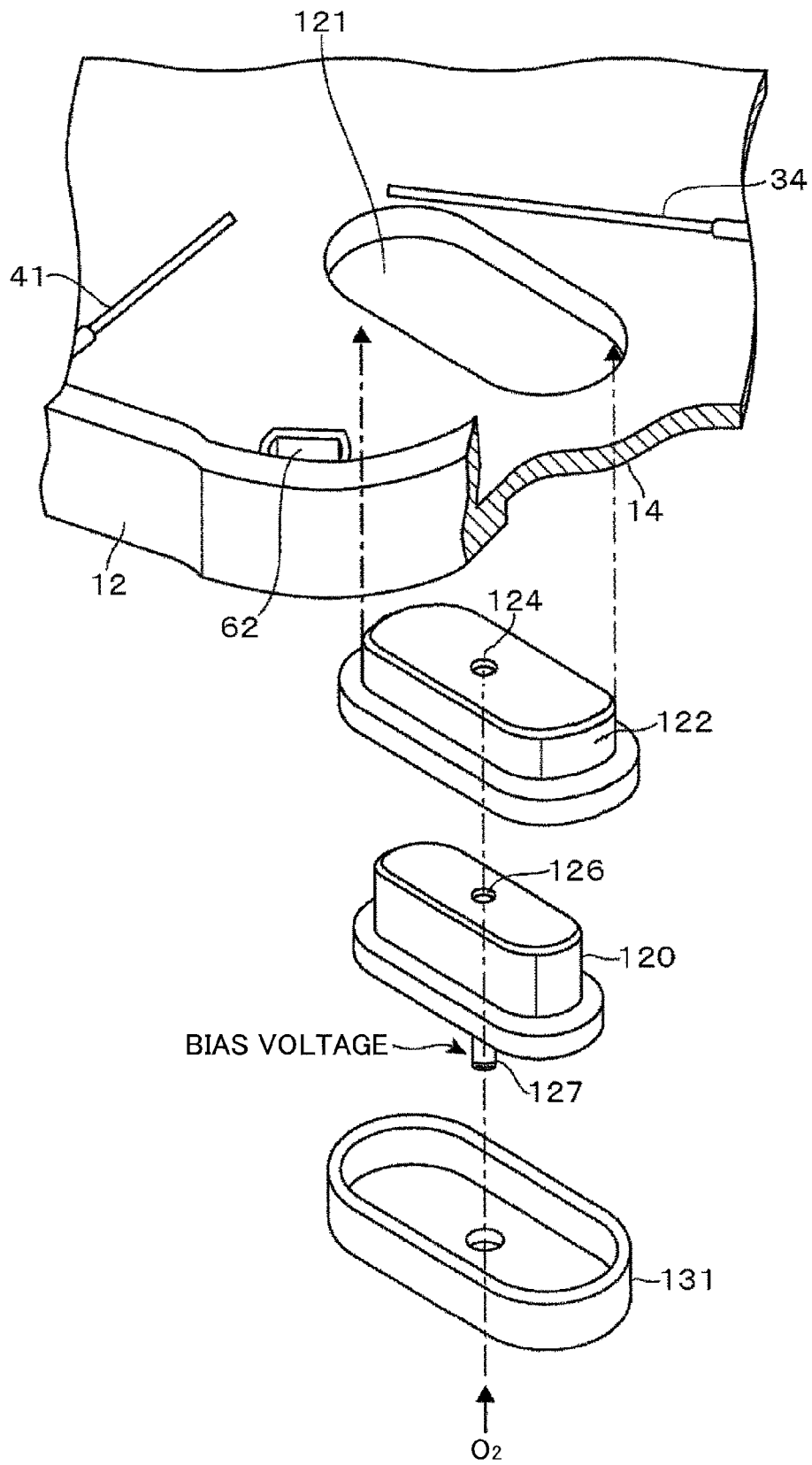
FIG. 7 is an exploded perspective view illustrating a bias electrode part of the film deposition apparatus.

Next, a description is given below of the bias electrode part 120 of the embodiment of the present invention. The bias electrode part 120 is to draw the plasma generated by the plasma treatment part 80, and is hermetically arranged, obtaining insulation to the inside of the vacuum chamber 1, so as not to contact the turntable 2 on the back side of the turntable 2. In other words, as shown in FIGS. 1 and 7, an opening 121 is formed in the bottom portion 14 of the vacuum chamber 1 under the plasma treatment part 80, and is open to form an elliptical shape equal to or larger than an area where the antenna 83 is arranged as seen from a planar perspective. In this opening 121, an insulating member 122 formed to be an elliptical shape similarly to the opening 121 as seen from a planar perspective is provided. The insulating member 122 is formed to be a hollow and approximately cylindrical shape having an open lower end. A circumference edge on the lower end side of the insulating member 122 extends outward throughout the circumferential direction in a flange form, and hermetically contacts the bottom portion 14 of the vacuum chamber 1 through a seal member 123 such as an O-ring provided in its upper surface along the circumferential direction (see FIG. 1). When an area between the insulating member 122 and the turntable 2 is called "a plasma unexcited area" S2, a gas discharge hole 124 penetrating the insulating member 122 in a vertical direction is formed in an approximate central part of the upper surface of the insulating member 122 in order to discharge a plasma prevention gas described below to the plasma unexcited area S2. In this example, the insulating member 122 is made of, for example, quartz.

In the insulating member 122, the bias electrode part 120 is provided, and is formed to be a size smaller than the insulating member 122. More specifically, the bias electrode part 120 has an open lower end, forms an approximate cylindrical shape having a circumference edge on the lower end side extending in a flange form to be modeled after the inner circumferential surface, and is made of a conductive member such as nickel (Ni), copper (Cu) of the like. The circumferential edge on the lower end side in the bias electrode plate 120 is arranged to be located inner than the outer edge portion of the insulating body, and is hermetically arranged to the insulating member 122 through a seal member 125 such as O-ring provided on the upper surface side of the circumference edge lower end side. Accordingly, the bias electrode part 120 is arranged so as not to contact the turntable 2 (so as to be non-contact), and to be electrically isolated from the vacuum chamber 1.

In approximately the central part of the bias electrode part 120, a through-hole 126 that penetrates through the bias electrode part 120 in the vertical direction is formed so as to correspond to the arranged position of the gas discharge hole 124 of the insulating member 122. As shown in FIG. 1, a gas supply passage 127 made of a conductive material is hermetically provided under through-hole 126 to supply the plasma prevention gas to the plasma unexcited area S2. A negative bias voltage application part 128 is connected to a flow passage member constituted of the gas supply passage 127 to attract the plasma to the wafer W. More specifically, the bias voltage application part 128 is constituted of a radio frequency power source 129 whose output power is, for example, 500 to 5000 W with a frequency of 50 kHz to 40 MHz, and a matching box 130.

Here, a description is given below of why the plasma prevention gas is supplied to the plasma unexcited area S2. The bias electrode part 120 is arranged so as not to contact the turntable 2, and is electrically isolated from the wafer W. Hence, the bias voltage is applied to the wafer W from the bias electrode part 120 by electrostatic induction without contact through the insulating member 122, the plasma unexcited area S2 and the turntable 2 as described below. Because of this, when plasma is generated in the plasma unexcited area S2, the electrostatic induction may not be caused through the plasma unexcited area S2. Moreover, if the plasma is generated in the plasma unexcited area S2, a part or most of the electricity supplied from the radio frequency power source 129 to the bias electrode part 120 is wasted. Therefore, to prevent the generation of plasma in the plasma unexcited area S2, a gas more unlikely to be activated than the gas in the atmosphere of the other area under the turntable 2 (i.e., nitrogen gas) is supplied to the plasma unexcited area S2. Furthermore, because the higher a degree of vacuum becomes, the more likely the plasma is generated, a flow rate of the plasma prevention gas is set so that a gas pressure in the plasma unexcited area S2 is higher than that in the other areas and the modification area S1. In addition, the generation of plasma is suppressed by more lowering the frequency of the radio frequency power source 129 than the frequency of the radio frequency power source 85 in the plasma treatment part 80. The plasma prevention gas includes, for example, an oxygen ($O_2$) gas, a chlorine ($Cl_2$) gas or a fluorine ($F_2$) gas, and is the oxygen gas in this example.

Figure 8:
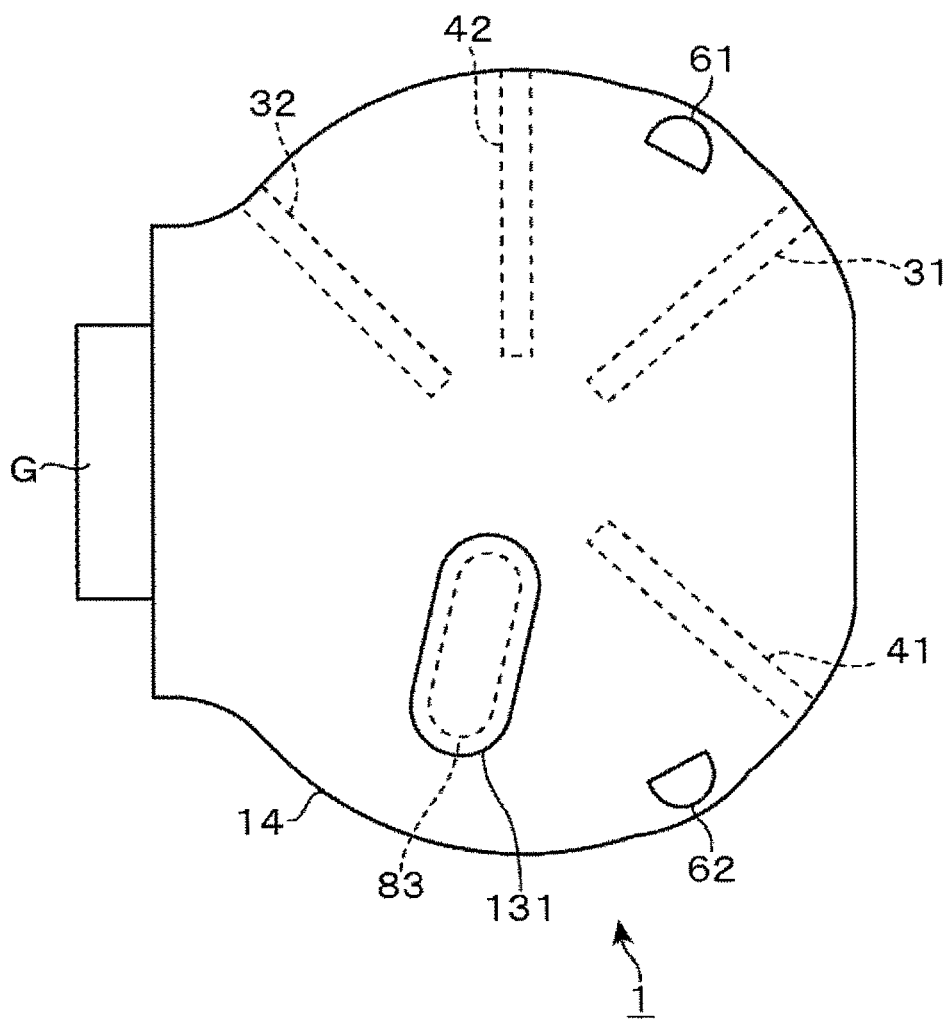
FIG. 8 is a plan view illustrating a configuration of the film deposition apparatus of the embodiment when seen from a back surface side.
Figure 9:
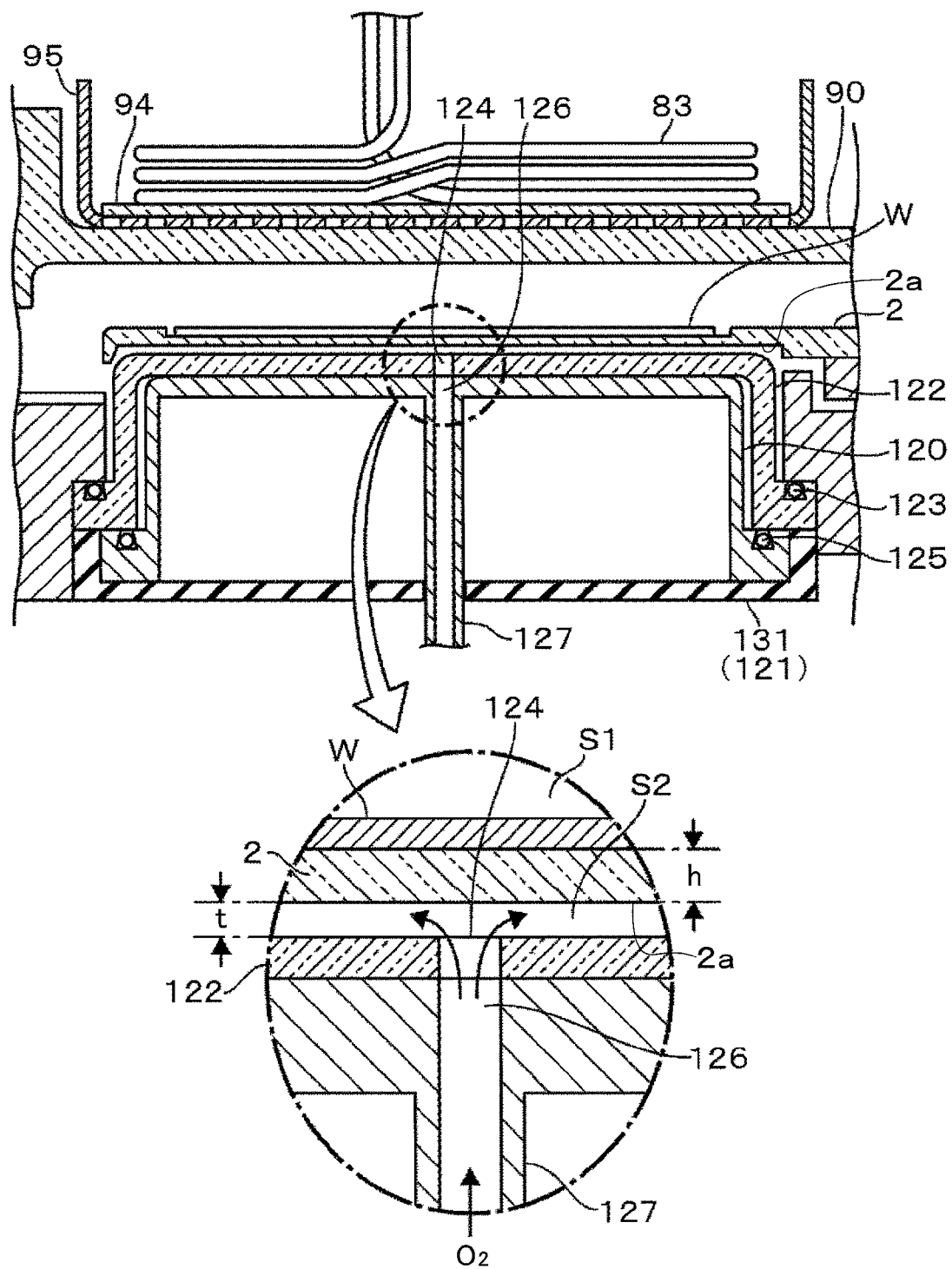
FIG. 9 is an enlarged vertical cross-sectional view illustrating the plasma treatment part and the bias electrode part.

A sealing member 131 made of, for example, quartz, and formed to be an approximately circular plate is arranged under the bias electrode part 120. An outer edge of the sealing member 131 stands toward the above insulating member 122 throughout the circumferential direction between the bottom portion 14 of the vacuum chamber 1 and the circumference edge of the bias electrode part 120. Accordingly, by inserting the insulating member 122, the bias electrode part 120 and the sealing member 131 into the vacuum chamber 1 from the lower side in this order, and by fixing the sealing member 131 to the bottom portion 14 by, for example, a bolt or the like that is not shown in the drawings, the insulating member 122 hermetically contacts the vacuum chamber 1. Moreover, the bias electrode part 120 hermetically contacts the insulating member 122. Furthermore, the sealing member 131 isolates the vacuum chamber 1 from the bias electrode part 120. In addition, as shown in the lower part of FIG. 9 by being enlarged, the upper surface of the insulating member 122 is located in the groove portion 2a of the lower side of the turntable 2, and the wafer on the turntable 2 and the bias electrode part 120 are parallel to each other in a plane. A distance dimension t between the lower surface of the turntable 2 and the upper surface of the insulating member 122 is, for example, 0.5 to 3 mm. FIG. 8 illustrates a plan view of the vacuum chamber 1 when seen from the bottom side, and the sealing member 131 is formed to be larger than the area where the antenna 83 is wound around at the position thereof. In FIG. 7, seal members 123 and 125 are omitted.

A ring-shaped side ring 100 is arranged at a position slightly lower than the turntable 2 and outer edge side of the turntable 2, and evacuation openings 61 and 62 are formed in an upper surface of the side ring 100 at two locations so as to be distant in the circumferential direction from each other. In other words, two evacuation ports are formed in the bottom portion 14 of the vacuum chamber 1, and the evacuation openings 61 and 62 are formed at the positions corresponding to the two evacuation ports. When one is called a first evacuation opening 61 and the other is called a second evacuation opening 62 of the two evacuation openings 61 and 62, the first evacuation opening 61 is formed at a position closer to the separation area D between the first process gas nozzle 31 and the separation area D on the downstream side of the first process gas nozzle 31 in the rotational direction of the turntable 2. The second evacuation opening 62 is formed at a position closer to the separation area D between the plasma generating gas nozzle 34 and the separation area D on the downstream side of the plasma generating gas nozzle 34 in the rotational direction of the turntable 2.

The first evacuation opening 61 is to evacuate the first process gas and the separation gas. The second evacuation opening 62 is to evacuate the plasma generating gas in addition to the second process gas and the separation gas. A groove-like gas flow passage 101 is formed in the upper surface of the of the side ring 100 on the outer edge side of the casing 90 to circulate the gas to the second evacuation opening 62 while avoiding the casing 90. The first evacuation opening 61 and the second evacuation opening 62 are, as shown in FIG. 1, respectively connected to evacuation mechanisms such as vacuum pumps 64 through evacuation pipes 63 including pressure controllers 65 such as butterfly valves.

As shown in FIG. 3 and the like, in the center portion on the lower surface of the ceiling plate 11, a protrusion portion 5 is provided that is continuously formed into an approximate ring shape from the portion on the center area C side of the convex portions 4 and whose lower surface is formed into the same height as the lower surface of the convex portions 4. As shown in FIG. 1, above the core portion 21 closer to the rotational center side of the turntable than the protrusion portion 5, a labyrinth structure 110 is arranged to suppress the first process gas and the second process gas from being mixed with each other in the center area C. The labyrinth structure 110 adopts a structure that includes a first wall portion 111 vertically extending from the ceiling plate 11 toward the turntable 2 throughout the circumferential direction and a second wall portion 112 vertically extending from the turntable 2 side toward the ceiling plate 11 throughout the circumferential direction that are formed alternately in the radial direction of the turntable 2.

As shown in FIGS. 2 through 4, a transfer opening 15 is provided in the side wall of the vacuum chamber 1 to transfer the wafer W between a transfer arm that is not shown in the drawings but provided outside the vacuum chamber 1 and the turntable 2. The transfer opening 15 is configured to be hermetically openable and closable by a gate valve G. In addition, because the wafer W is transferred into or from the concave portions 24 at a position facing the transfer opening 15 with the transfer arm, lift pins for transfer to lift up the wafer W from the back side by penetrating through through-holes formed in the concave portion 24 and the lifting mechanism (none of which are shown in the drawing) are provided at the position corresponding to the transfer position under the turntable 2.

Moreover, a control part 200 constituted of a computer to control operation of the whole apparatus is provided in this film deposition apparatus, and a program to implement the film deposition process and the modification treatment that are described below is stored in a memory of the control part 200. This program is constituted of instructions of step groups to cause the apparatus to implement operations described below, and is installed from a memory unit 201 to be a storage medium such as a hard disk, a compact disc, a magnetic optical disc, a memory card and a flexible disc into the control part 200.

Figure 10:
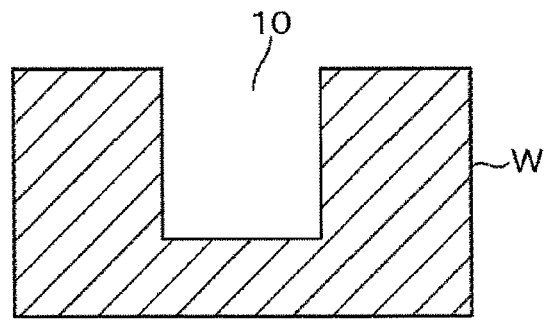
FIG. 10 is a vertical cross-sectional view schematically illustrating a substrate to be processed by a film deposition process by the film deposition apparatus.

Next, a description is given of operation in the embodiment. To begin with, the gate valve G is opened, and while rotating the turntable 2 intermittently, for example, five wafers W are loaded on the turntable 2 through the transfer opening 15 by the transfer arm not shown in the drawings. As shown in FIG. 10, a concave portion 10 including a groove, a hole and the like is formed in a surface of each of the wafers W, and an aspect ratio of the concave portion 10 (i.e., a depth dimension of the concave portion 10/a width dimension of the concave portion 10) is, for example, from tens to over one hundred. Next, the gate valve G is closed, and the turntable 2 is rotated at, for example, 2 to 120 rpm in a clockwise fashion while the inside of the vacuum chamber 11 is kept being evacuated by the vacuum pump 64. Then the wafer W is heated by the heater unit 7, for example, up to about 300 degrees.

Subsequently, the process gas nozzles 31, 33 respectively discharge a first process gas and a second process gas, and the plasma generating gas nozzle 34 discharges a plasma generating gas. Moreover, the gas supply passage 127 discharges a plasma prevention gas to the plasma unexcited area S2 so that a gas pressure of the plasma unexcited area S2 is higher than that in the modification area S1. In other words, the distance dimension t between the turntable 2 and the insulating member 122 is so narrow that the plasma prevention gas is unlikely to be exhausted from the plasma unexcited area S2 when the plasma prevention gas is supplied to the plasma unexcited area S2. Accordingly, the plasma unexcited area S2 becomes a positive pressure. The plasma prevention gas flows through the lower side of the turntable 2 and is evacuated from the evacuation opening 62.

Furthermore, the separation gas nozzles 41 and 42 discharge a separation gas at a predetermined flow rate, and the separation gas supply pipe 51 and the purge gas supply pipe 71 and 72 discharge a nitrogen gas at predetermined flow rates. Then, the pressure controller 65 adjusts a pressure in the vacuum chamber 11 at a preliminarily set processing pressure. In addition, radio frequency power is supplied to the plasma treatment part 80 and the bias electrode part 120.

Figure 11:
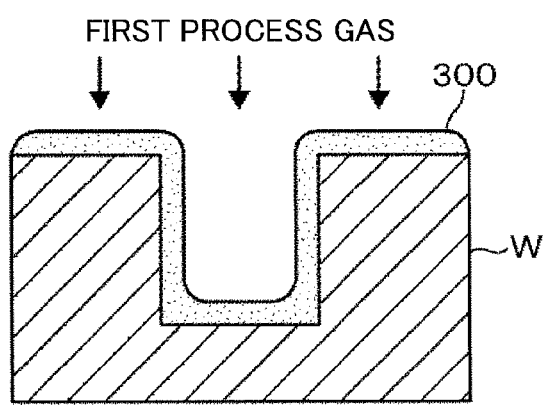
FIG. 11 is a first vertical cross-sectional view schematically illustrating a manner of depositing a film on the substrate.
Figure 12:
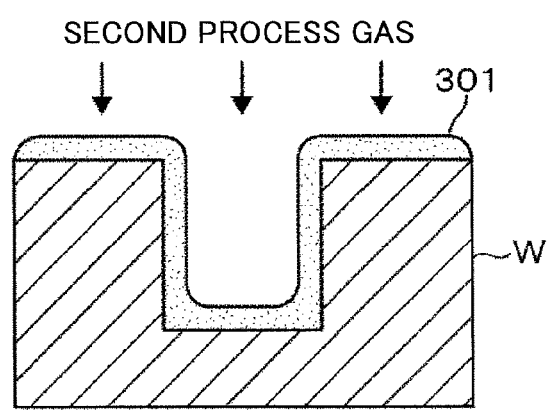
FIG. 12 is a second vertical cross-sectional view schematically illustrating a way of depositing a film on the substrate.

As shown in FIG. 11, in the first process area P1, a component of the first process gas is adsorbed on the surface of the wafer W and an adsorbed layer 300 is deposited. Next, as shown in FIG. 12, in the second process area P2, the adsorbed layer 300 is oxidized, and one or a plurality of layers of a molecular layer of silicon oxide film ($SiO_2$) of a thin film component is deposited, by which a reaction layer 301 of a reaction product is formed. Sometimes impurities such as water (i.e., OH group) or an organic substance may remain in the reaction layer 301 due to, for example, a residual group contained in the first process gas.

Figure 13:
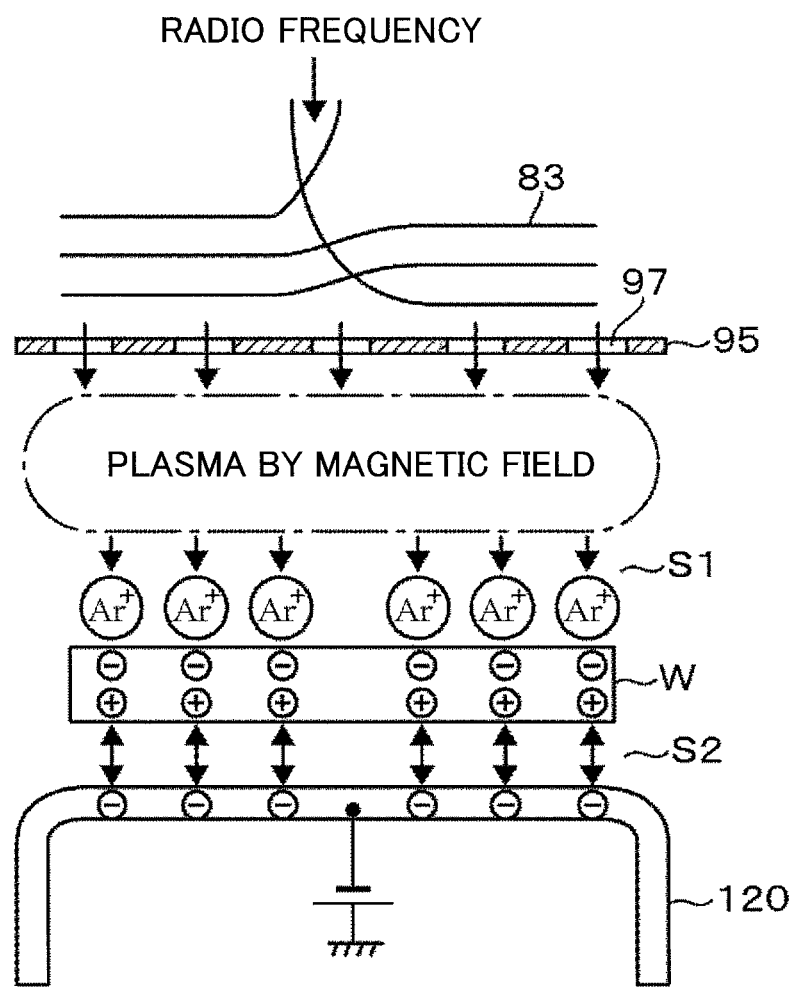
FIG. 13 is a first vertical cross-sectional view illustrating a way of performing a plasma modification treatment on the wafer.

As schematically shown in FIG. 13, an electric field and a magnetic field are generated in the plasma treatment part 80 by the radio frequency power supplied from the radio frequency power source 85. The electric field of the electric field and the magnetic field is reflected or absorbed (damped) by the Faraday shield 95, and is prevented from entering the vacuum chamber 1. On the other hand, because the slits 97 are formed in the Faraday shield 95, the magnetic field reaches the modification area S1 in the vacuum chamber 1 by passing through the slits 97 and the bottom of the casing 90.

Accordingly, the plasma generating gas discharged from the plasma generating gas nozzle 34 is activated by the magnetic field, and plasma such as ions (e.g., argon ions: $Ar^+$) or radicals is generated. As discussed above, because the antenna 83 is arranged to surround the zonal area extending in the radial direction of the turntable 2, this plasma is formed into an approximate linear shape so as to extend in the radial direction under the antenna 83. When the wafer W contacts the plasma, the modification treatment of the reaction layer 301 is carried out. More specifically, by allowing the plasma to collide with the surface of the wafer W, impurities such as water, an organic substance or the like are released, or densification (density growth) of the reaction layer 301 is caused by occurrence of rearrangement of elements in the reaction layer.

Here, as shown in FIG. 13, at a certain moment when the radio frequency power source 129 supplies the radio frequency power to the bias electrode part 120, a negative direct-current voltage is applied to the bias electrode part 120. In other words, the plasma generated by the radio frequency power source 129 supplies electrons to the bias electrode part 120, and the bias electrode part 120 is charged negatively. Furthermore, as discussed above, the bias electrode part 120 and the wafer W do not contact with each other, and are electrically isolated from each other. Because of this, when the wafer W reaches the upper side of the bias electrode part 120, the negative direct-current voltage of the bias electrode part 120 causes bias of an electric charge in a thickness direction of the wafer W by electrostatic induction. In other words, the electrons in the wafer W moves to the surface side of the wafer W by a repulsive force of the negative direct-current voltage. The movement of the electrons (i.e., an amount of the electric charge on the surface side of the wafer W) is uniform throughout the surface of the wafer W because the upper surface of the bias electrode part 120 is arranged to be parallel to the wafer W.

In contrast, at another moment when the radio frequency power source 129 supplies the radio frequency power to the bias electrode part 120, a positive direct-current voltage is applied to the bias electrode part 120. Because of this, a positive electric charge (i.e., a proton) is likely to move to the bias electrode part 120 from the radio frequency power source 129. However, as discussed above, the radio frequency power source 129 uses the high frequency such as 13.56 MHz, and the positive direct-current voltage and the negative direct-current voltage switches at a high speed. Hence, a time period when the positive direct-current voltage is applied to the bias electrode part 120 (i.e., a time period when a polarity applied from the radio frequency power source 129 is maintained) is a degree of 1/13,560,000 seconds, which is very short. In addition, a proton mass is about three times as heavy as that of an electron, and therefore, the proton is more unlikely to move than the electron. Due to this, the polarity of the radio frequency power source 129 switches before the protons reach the bias electrode part 120 from the radio frequency power source 129 while the electrons immediately reach the bias electrode part 120, and as a result, the bias electrode part 120 remains charged negatively.

Figure 14:
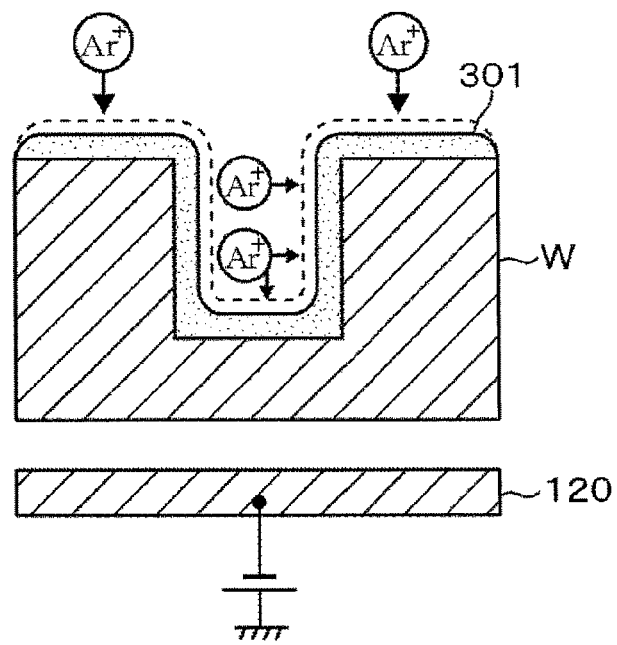
FIG. 14 is a second vertical cross-sectional view schematically illustrating a way of performing the plasma modification treatment on the wafer.

Thus, because the negative electric charges of the surface of the wafer attract the positive ions in the modification area S1, which are more specifically argon ions, to the wafer W side, high-density plasma is formed in the vicinity of the wafer W. By doing this, as shown in FIG. 14, even if the aspect ratio of the concave portion 10 is great, that is to say, even if the depth dimension of the concave portion 10 is great, the plasma goes up to the bottom of the concave portion 10. This enables the modification treatment to be performed uniformly throughout the surface of the wafer W and on the concave portion 10 throughout the depth direction. After that, by continuing to rotate the turntable 2, the adsorption of the adsorbed layer 300, the production of the reaction layer 301, and the modification treatment of the reaction layer 301 are performed a plurality of times in this order, and the reaction layers 301 are deposited in a layer-by-layer manner, thereby forming a thin film. This thin film has a high-density and uniform film quality across the surface of the wafer W and throughout the depth direction of the concave portion 10. Here, FIGS. 13 and 14 schematically illustrate the plasma treatment part 80, the bias electrode part 120 and the wafer W.

While performing a series of processes, due to the gas flow passage 101 formed in the side ring 100 provided at the outer edge side of the casing 90, each gas is evacuated through the gas flow passage 101 so as to flow away the casing 90. Moreover, the protruding portion 92 provided on the lower end side of the periphery portion of the casing 90 prevents the nitrogen gas or the ozone gas from entering the casing 90.

Furthermore, because the nitrogen gas is supplied to the separation area D between the first process area P1 and the second process area P2, the first process gas, the second process gas and the plasma generating gas are evacuated without being mixed with each other. In addition, since a purge gas is supplied to an area under the turntable 2, the gas likely to diffuse the area under the turntable 2 is pushed back toward the evacuation openings 61 and 62 by the purge gas.

According to the above embodiment, the plasma treatment part 80 is provided away from the respective process gas nozzles 31 and 32 in the rotational direction of the turntable 2, and the bias electrode part 120 is provided at a location opposite to the plasma treatment part 80 under the turntable 2 without contacting the turntable 2. The bias voltage application part applies the bias voltage to the bias electrode part 120. By doing this, the bias voltage can be applied to the wafer W without contacting the wafer W, and the plasma (i.e., argon ions) can be attracted to the wafer W side. Accordingly, the high-density plasma can be formed in the vicinity of the wafer W, and even if a concave portion 10 having a high aspect ratio is formed in the surface of the wafer W, the plasma modification treatment can be carried out uniformly throughout the depth direction of the concave portion 10, and a thin film having a preferable uniform film quality can be formed.

Moreover, by providing the groove portion 2a in the lower surface of the turntable 2, and by making the distance dimension t of the plasma unexcited area S2 extremely small, the bias electrode part 120 is arranged close to the wafer W on the turntable 2. Because of this, even if the radio frequency power source 129 does not supply high power, the plasma can be attracted toward the wafer W. Furthermore, because the high-density plasma can be formed in the vicinity of the wafer W, the plasma treatment can be performed even in the narrow area where the nozzles 31, 32, 41 and 42 are arranged in the circumferential direction. In other words, the film deposition process of the reaction layer 301 and the plasma modification treatment of the reaction layer 301 are performed together while reducing a diameter dimension of the vacuum chamber 1 as seen from a planar perspective, that is to say, while preventing the apparatus from being larger. Hence, the embodiment of the present invention can be applied not only to the wafer W in which the concave portion 10 is formed, but also to a wafer W in which such a concave portion 10 is not formed.

Figure 15:
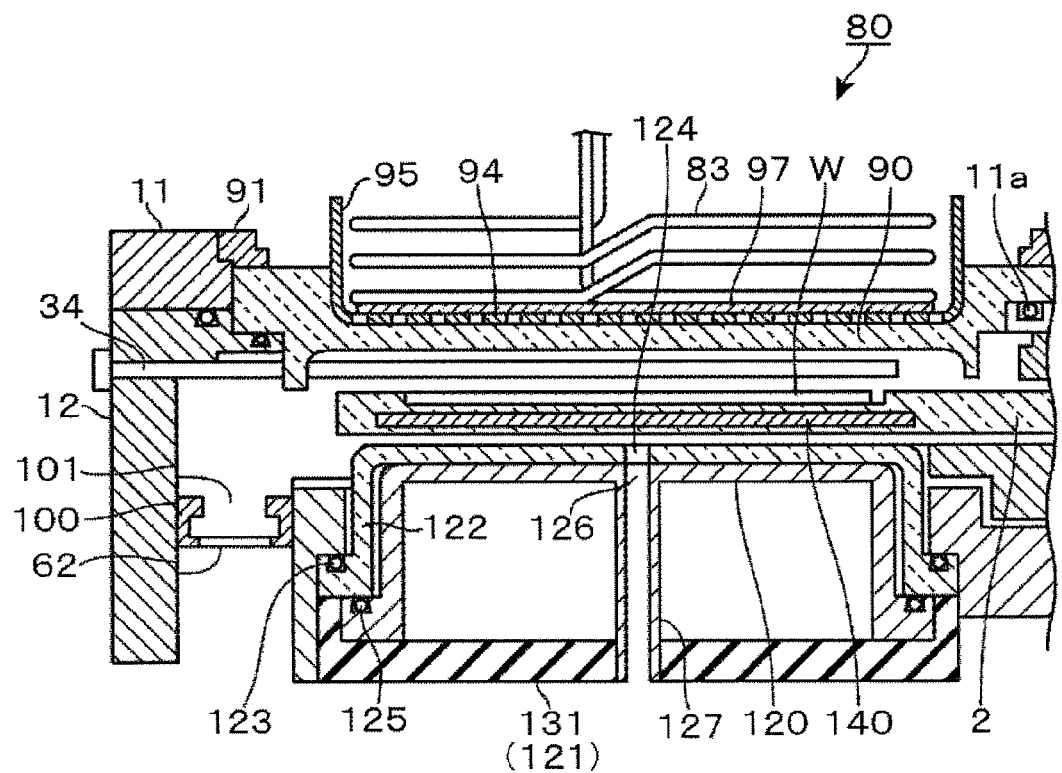
FIG. 15 is a vertical cross-sectional view illustrating a second example of the film deposition apparatus.
Figure 16:
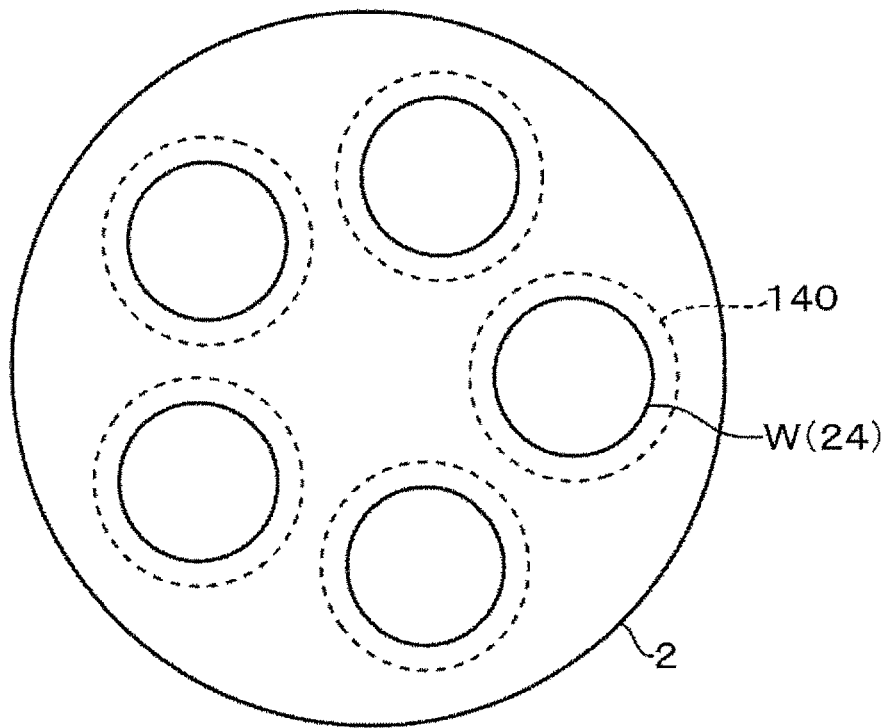
FIG. 16 is a plan view illustrating a turntable of the second example of the film deposition apparatus.

Next, a description is given of other examples other than the above-described film deposition. FIGS. 15 and 16 illustrate an example of including plate-like auxiliary electrode parts 140 within the turntable 2 under the respective concave portions 24 without providing the groove portion 2a in the lower surface of the turntable 2. The respective auxiliary electrode parts 140 are formed to be a size larger than the concave portions 24 as seen from a planar perspective, and are arranged so that the center positions of the auxiliary electrodes part 140 coincide with the center positions of the concave portions 24. More specifically, the auxiliary electrode parts 140 are formed to have a diameter dimension 10 to 50 mm larger than that of the wafers W (e.g., 300 mm) as seen from a planar perspective. The respective auxiliary electrode parts 140 are electrically insulated from the bias electrode part 120 and the wafers W on the turntable 2 because the turntable 2 is made of an insulator. A thickness dimension d of the auxiliary electrode parts 140 is, for example, 0.5 mm to 10 mm. Moreover, the auxiliary electrode parts 140 are made of a conductive material such as carbon (C). The distance dimension between the lower surface of the turntable 2 and the insulating member 122 is, for example, about 0.5 mm to 5 mm.

Figure 17:
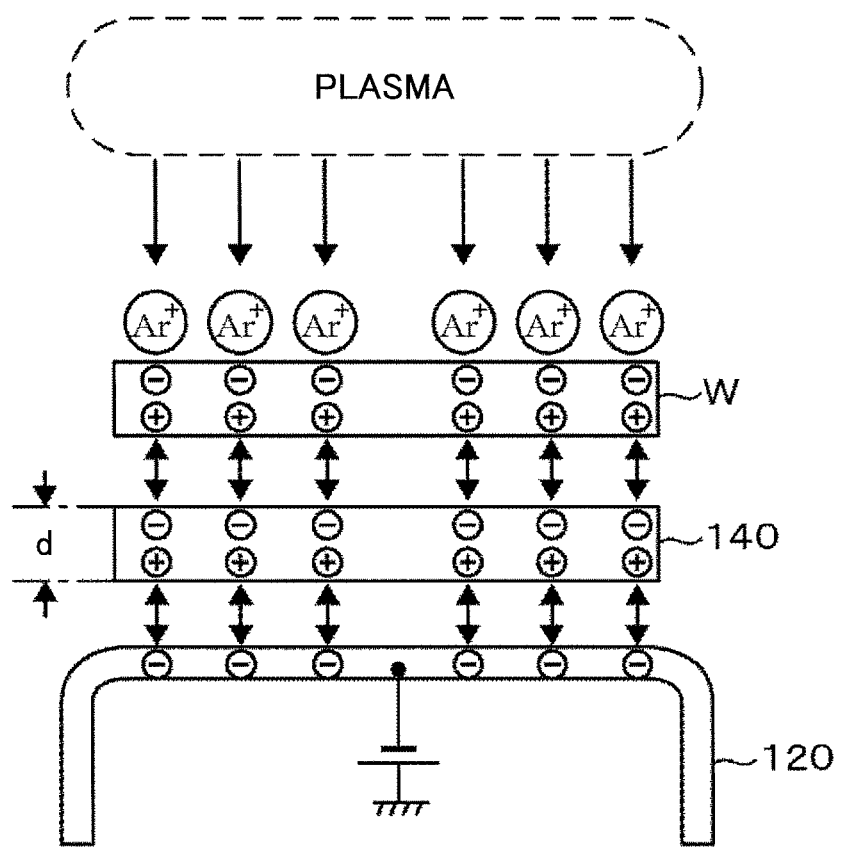
FIG. 17 is a schematic view illustrating operation of the second example of the film deposition apparatus.

In this manner, as shown in FIG. 17, by providing the auxiliary electrode parts 140, an electro induction is caused between the bias electrode part 120 and the auxiliary electrode parts 140. More specifically, a positive electric charge is caused on the lower side of the auxiliary electrode parts 140 and a negative electric charge is caused on the upper side of the auxiliary electrode parts 140. Hence, an electric induction is similarly caused between the auxiliary electrode parts 140 and the wafers W, a negative charge is caused on the upper surface side of the wafers W. Due to this, the plasma (i.e., argon ions) can be attracted toward the wafer W similarly to the above embodiment, which means that the bias electrode part 120 and the wafer W can get closer by the thickness dimension of the auxiliary electrode parts 140. Accordingly, compared to a case without the auxiliary electrode parts 140, or compared to a case of providing the bias electrode 120 greatly away from the wafer W, the radio frequency power source 129 is not required to supply a so great power value to the bias electrode part 120. In addition, because providing the groove portion 2a in the turntable 2 is not required, strength of the turntable 2 is improved compared to a case of providing the groove portion 2a.

Figure 18:
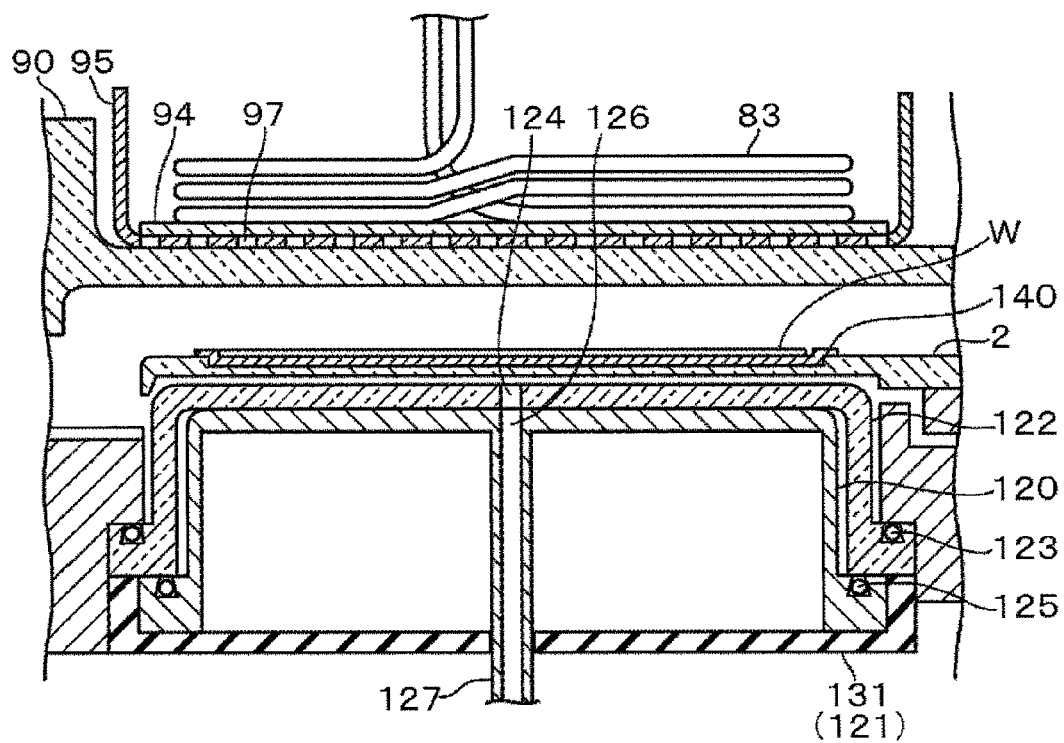
FIG. 18 is an enlarged vertical cross-sectional view illustrating a part of another example of a turntable.

Such auxiliary electrode parts 140 may be formed into a ring shape along the rotational direction of the turntable 2, instead of providing the location under the respective concave portions 24, as well as the above groove portion 2a so as to cross the concave portions 24 at the lower position of the concave portions 24. Moreover, as shown in FIG. 18, the auxiliary electrode parts 140 may be arranged in the concave portions 24 instead of burying the auxiliary electrode parts 140 in the turntable 2 as long as the auxiliary electrode parts 140 are provided between the wafers W and the bias electrode part 120. In this case, the wafers W are stacked on the auxiliary electrode parts 140 in the concave portions 24. Furthermore, the auxiliary electrode parts 140 may be pasted to the lower surface of the turntable 2. In addition, the groove portion 2a may be formed in the lower surface of the turntable 2 while the auxiliary electrode parts 140 may be provided at the turntable 2.

Figure 19:
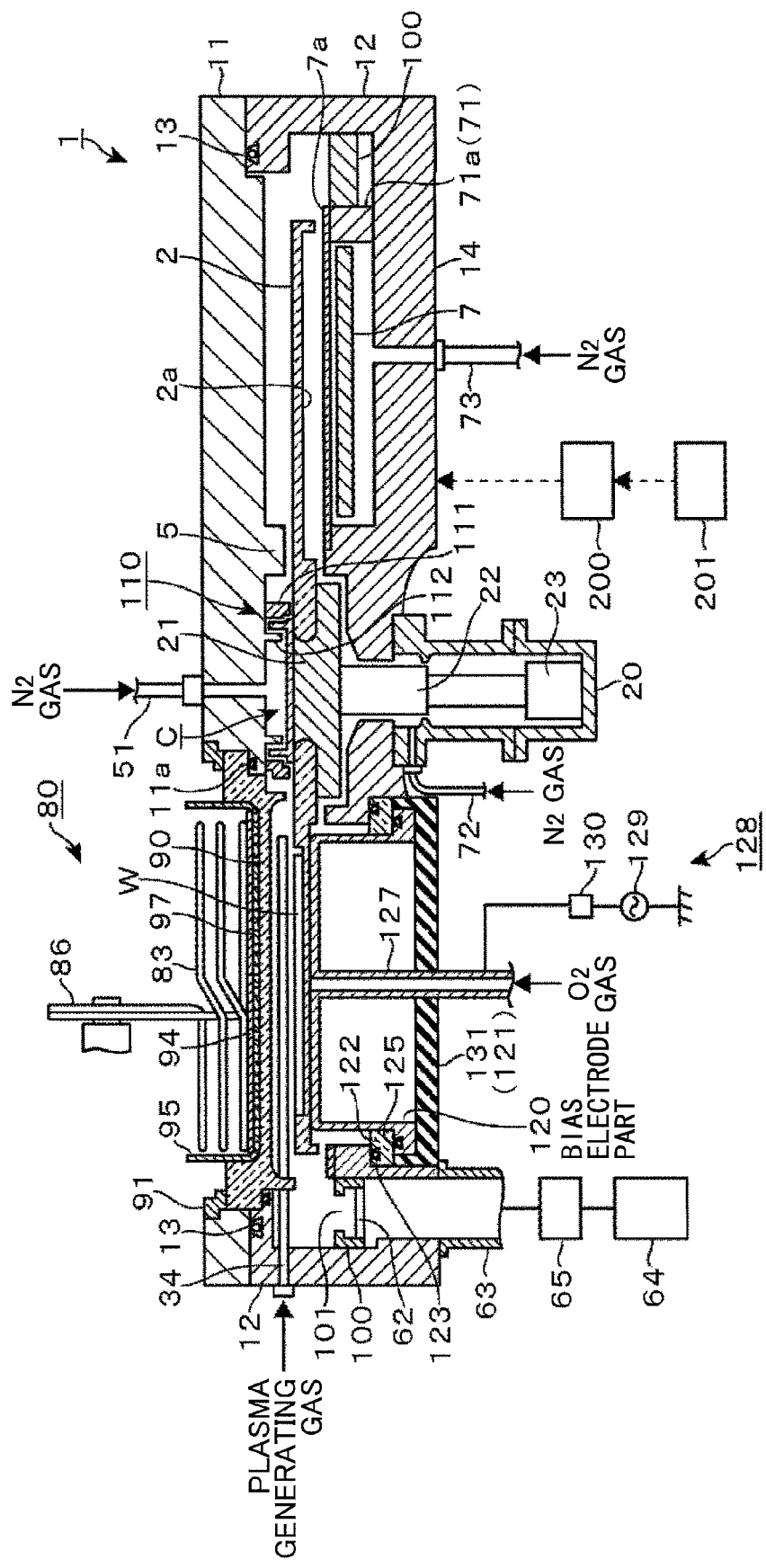
FIG. 19 is a vertical cross-sectional view illustrating another example of the film deposition apparatus.

Moreover, though the insulating member 122 is provided between the vacuum chamber 1 and the bias electrode part 120 to electrically insulate the bias electrode part 120 from the vacuum chamber 1, as shown in FIG. 19, the insulating member may not be provided between the turntable 2 and the bias electrode part 120. More specifically, a insulating member 120 formed into a ring shape so as to surround the bias electrode part 120 may be arranged between the bottom portion 14 of the vacuum chamber 1 and the lower end side of the outer edge portion of the bias electrode part 120. A dimension between the turntable 2 and the bias electrode part 120 is set to be the same as the above-mentioned distance dimension t. In this case, because the bias electrode part 120 can be close to the turntable 2 by the thickness dimension of the insulating member 122, the power value supplied from the radio frequency power source 129 to the bias electrode part 120 can be reduced.

Figure 20:
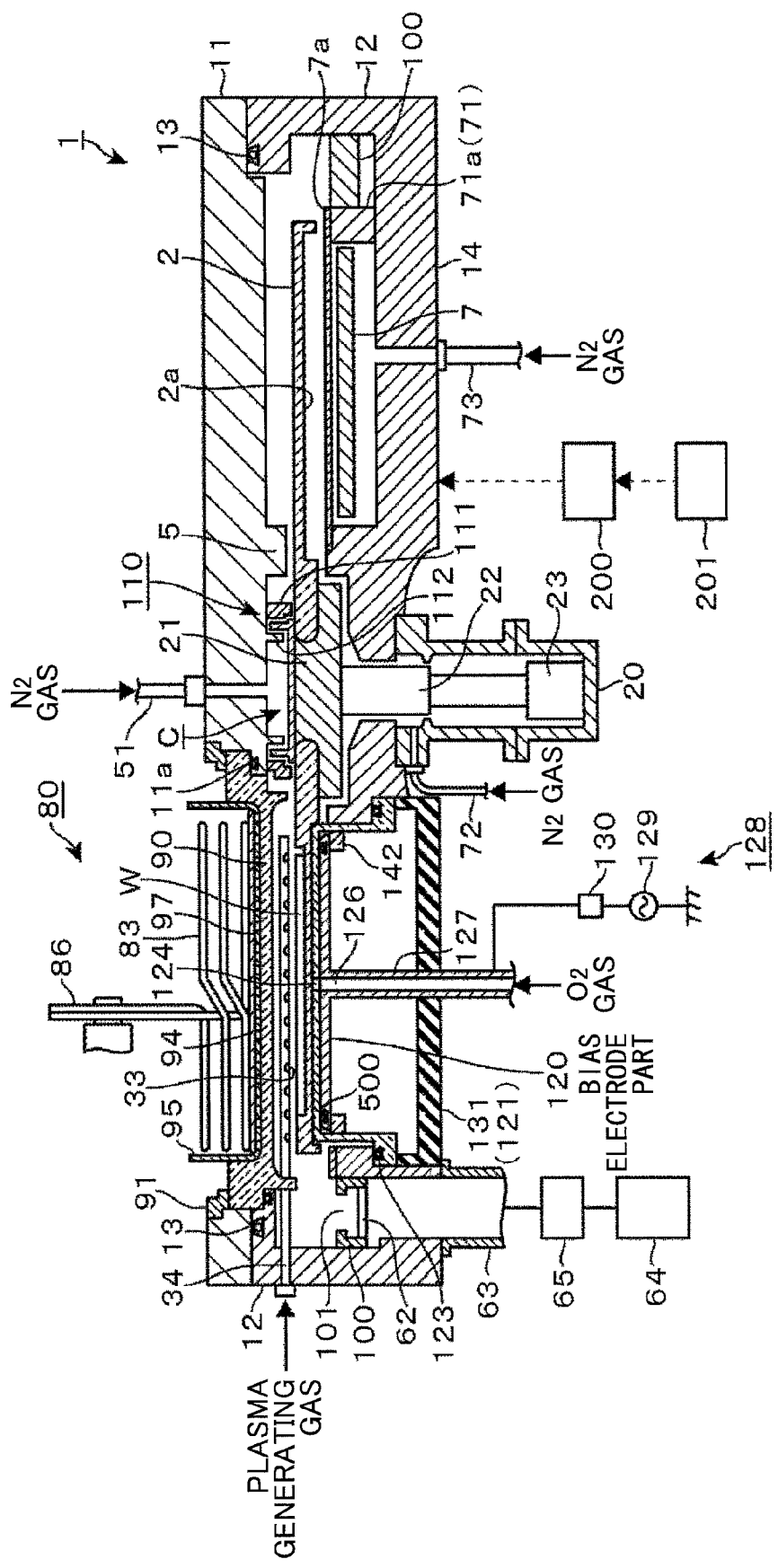
FIG. 20 is a vertical cross-sectional view illustrating another example of the film deposition apparatus.

Furthermore, the bias electrode part 120 may be formed into a plate-like shape instead of being formed into an approximately cylindrical shape. In this case, as shown in FIG. 20, for example, a supporting part 142 having a protruding shape for supporting the bias electrode part 120 from the lower side may be provided at a plurality of locations along the circumferential direction in the internal area of the insulating member 122, and the bias electrode part 120 may be arranged between these supporting part 142 and the upper surface of the bias electrode part 120. By forming the bias electrode part 120 into the plate-like shape, the following effects can be obtained in addition to the above-mentioned effects.

More specifically, when the radio frequency power source 129 supplies radio frequency power to the bias electrode part 120, an electrostatic induction is likely to occur not only between the bias electrode part 120 and the wafer W but also between the bias electrode part 120 and, for example, the side wall part of the vacuum chamber 1. Accordingly, part of the power supplied to the bias electrode part 120 is wasted. Therefore, by forming the bias electrode part 120 in the plate-like shape, in other words, by providing an opposite surface part only to the wafer W among conductive members around the bias electrode part 120 (e.g., respective members such as the side wall part or the bottom portion 14 of the vacuum chamber 1 or the wafers W), the energy loss can be reduced. FIG. 20 shows a seal member 500 such as an O-ring to seal a gap between the bias electrode part 120 and the insulating member 122.

Figure 21:
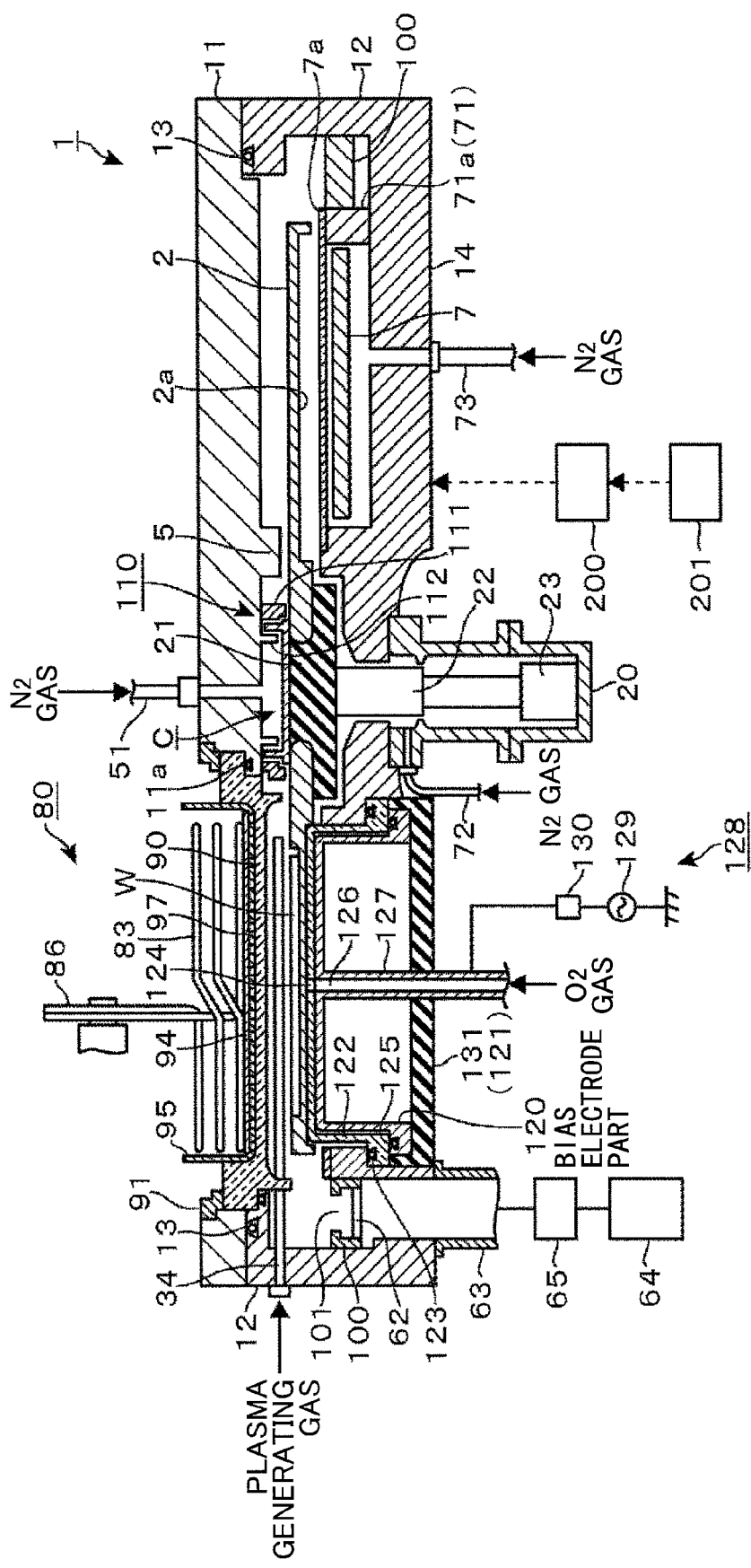
FIG. 21 is a vertical cross-sectional view illustrating another example of the film deposition apparatus.

In addition, as shown in FIG. 21, the turntable 2 may be made of a conductive member such as silicon carbide (SiC). In this case, the bias electrode part 120 is arranged apart from and under the turntable 2, and the core portion 21 is made of an insulator such as ceramic or quartz or the like so that the turntable 2 is electrically insulated from the bias electrode part 120 and the vacuum chamber 1. In this way, when the turntable 2 is made of the conductive material, the bias voltage is applied to the whole turntable 2 and transmitted to the wafers W.

Figure 22:
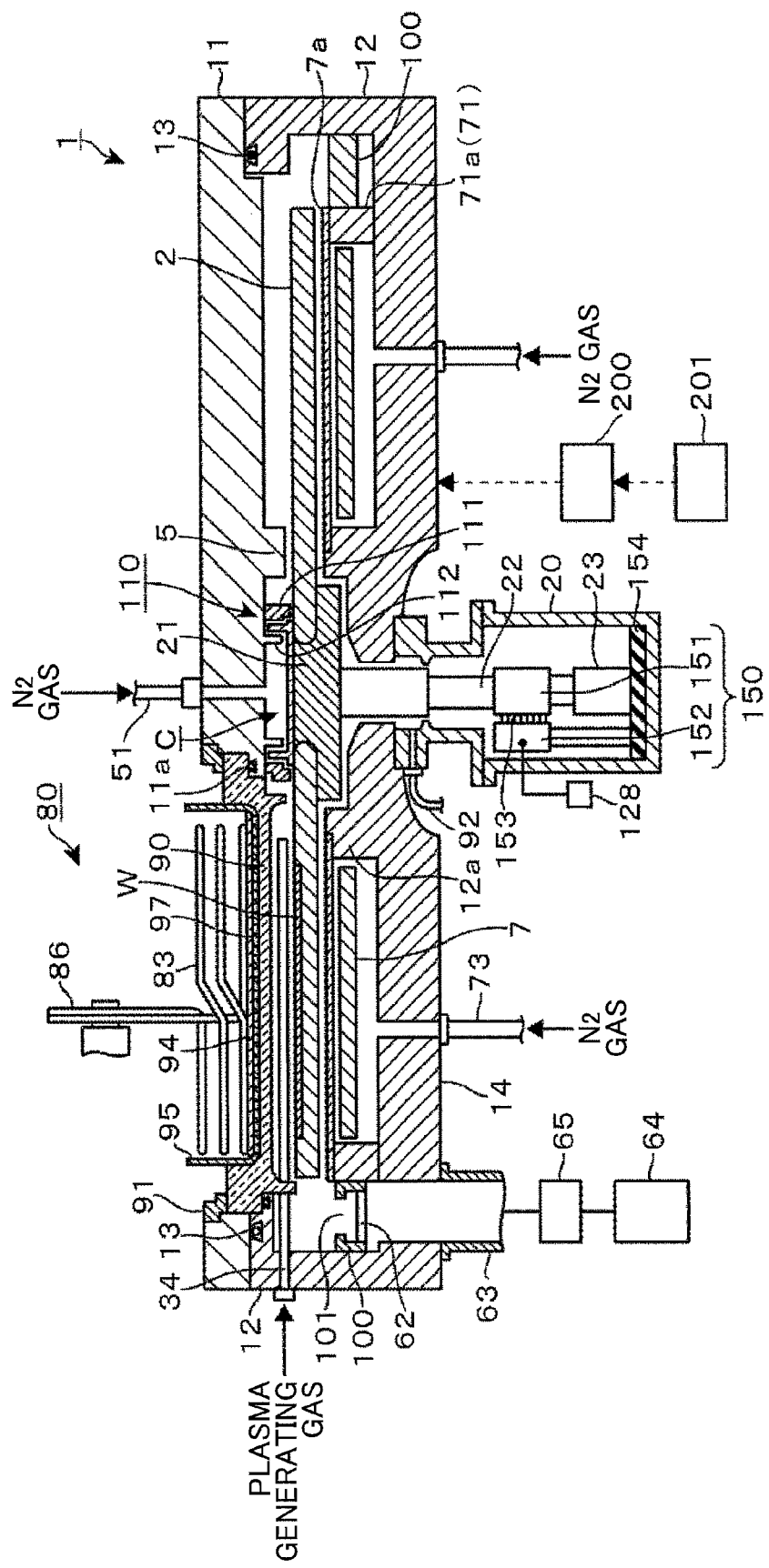
FIG. 22 is a vertical cross-sectional view illustrating another example of the film deposition apparatus.

Moreover, as shown in FIG. 22, the bias voltage may be directly applied to the bias electrode part 120 instead of providing the bias electrode part 120 for applying the bias voltage without contacting the wafer W. More specifically, the turntable 2, the core portion 21, and the rotational shaft 22 are each made of a conductive material, and a slipping mechanism 15 is provided under the rotational shaft 22. In other words, a conductive shaft 151 rotatable around the vertical axis with the rotational shaft 22 is arranged between the rotational shaft 22 and the drive part 23, and an outer circumference surface of the conductive shaft 151 is configured to be a power receiving surface. A power supply member 152 extending in the vertical direction along the rotational shaft 22 is arranged adjacent to the rotational shaft 22 to supply the power to the outer circumferential surface of the conductive shaft 151, and an lower end of the power supply member 152 is supported by the case body 20. Furthermore, an upper end of the power supply member 152 is made of a conductive material, and is connected to the bias voltage application part 128 (the radio frequency power source 129). On the conductive shaft 151 side of the power supply member 152, a sliding power supply member 153 such as a brush similarly made of a conductive material is provided. In FIG. 22, an insulator 154 is provided between the power supply part 152 and drive part 23 and the case body 20.

In the apparatus of this configuration, when the electricity is supplied from the bias voltage application part 128 to the conductive shaft 151 rotating around the vertical axis while the sliding power supply part 153 is sliding, the bias voltage is applied to the wafer W through the rotational shaft 22, the core portion 21 and the turntable 2. Here, as shown in FIGS. 21 and 22, when the bias voltage is applied to the whole turntable 2, the bias voltage is applied not only to the area under the plasma treatment part 80 but also to the wafers W on the lower side of the respective areas P1, P2 and D. This means that excessive power is supplied from the radio frequency power supply 129, and therefore, as discussed above, applying the bias voltage without contacting the wafer W is preferable.

Figure 23:
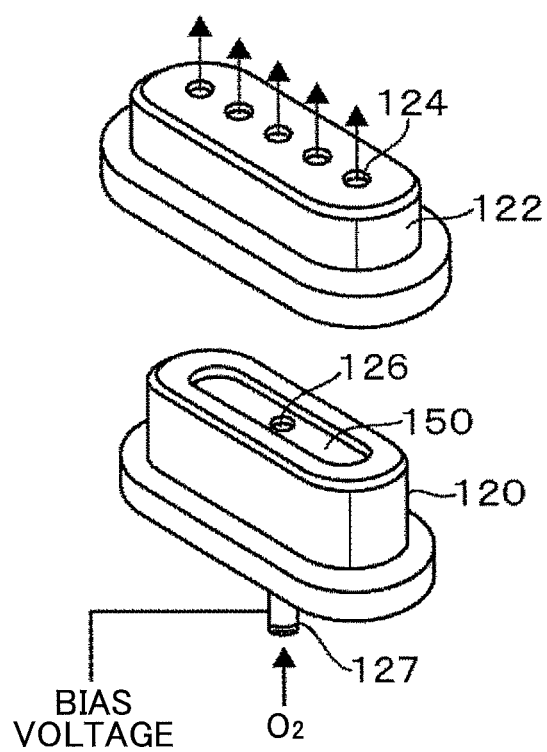
FIG. 23 is a vertical cross-sectional view illustrating another example of the film deposition apparatus.

In addition, in supplying the plasma prevention gas to the plasma unexcited area S2, as shown in FIG. 23, a slit-like depression 150 in communication with the gas supply passage and extending in the radial direction of the turntable 2 may be provided on the upper surface side of the bias electrode part 120. In this case, the above-mentioned plurality of gas discharge holes 124 may be formed so as to be along the depression 150 at a plurality of positions.

Figure 24:
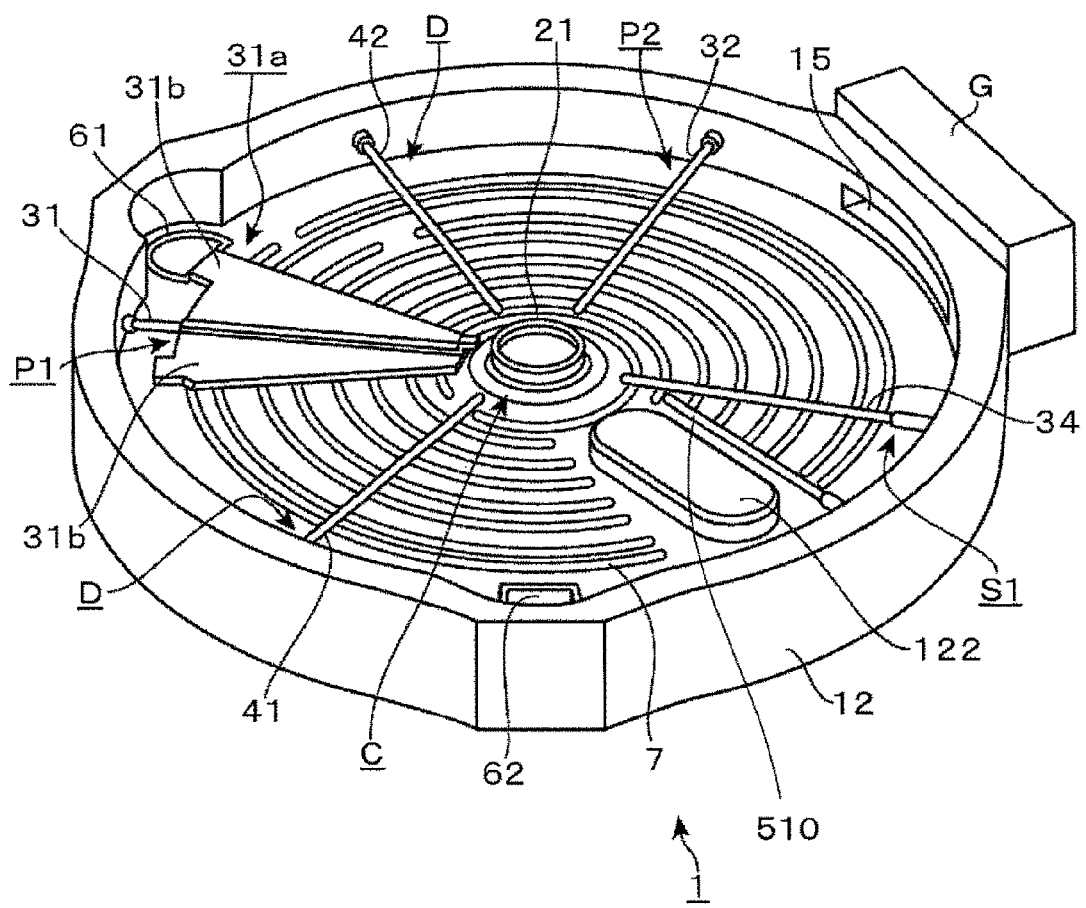
FIG. 24 is a perspective view illustrating another example of the film deposition apparatus.

Moreover, as shown in FIG. 24, plasma prevention gas nozzle 510 horizontally extending from the side wall of the vacuum chamber 1 toward the center area C may be provided instead of instead of providing the plasma prevention gas from the gas discharge holes 124 from the lower side of the bias electrode part 120. The plasma prevention gas nozzle 510 is arranged at a position on the upstream side in the rotational direction of the turntable 2 and slightly lower than the lower surface of the turntable 2. In this case, the plasma prevention gas is supplied to the above-discussed plasma unexcited area S2 throughout the radial direction of the turntable 2.

When the plasma prevention gas nozzle 510 is provided, the film deposition apparatus may be configured to lead the plasma prevention gas discharged from the plasma prevention gas nozzle 510 to the evacuation hole 62 by way of the plasma prevention unexcited area S2, in other words, configured to prevent the plasma prevention gas from directly going to the evacuation hole 62. More specifically, a plate-like gas flow restriction member (which is not shown in FIG. 24) extending along the lengthwise direction of the plasma gas prevention gas nozzle 510 is arranged under the plasma gas prevention gas nozzle 510. Furthermore, the gas flow restriction member is extended toward the downstream side in the rotational direction of the turntable 2, and an opening slightly larger than the insulating member 122 is formed in the extending portion. The insulating member 122 is arranged (housed) in the opening. In addition, by respectively folding a region on the upstream side in the rotational direction of the turntable 2 of the plasma gas prevention gas nozzle 510 in the gas flow restriction member, a region on the center area C and a region on the side wall side of the vacuum chamber 1 upward, the film deposition apparatus is configured to lead the plasma gas discharged from the plasma gas prevention gas nozzle 510 to flow to the downstream side toward the insulating member 122 along the gas flow restriction member. Moreover, in an upper surface of the extending portion, an area other than the region opposite to the plasma gas prevention gas nozzle 510 in the insulating member 122 (i.e., the downstream side in the rotational direction of the turntable 2, the center area C side and the side wall side of the vacuum chamber 1) is formed to be close to the lower surface of the turntable 2. The plasma prevention gas discharged from the plasma gas prevention gas nozzle 510 circulates through an extremely small gap area between the extending portion and the insulating member 122, and the unexcited area S2. Accordingly, the gas discharge holes 33 in the plasma gas prevention gas nozzle 510 are formed to face the upstream side or the downstream side in the rotational direction of the turntable 2.

Figure 25:
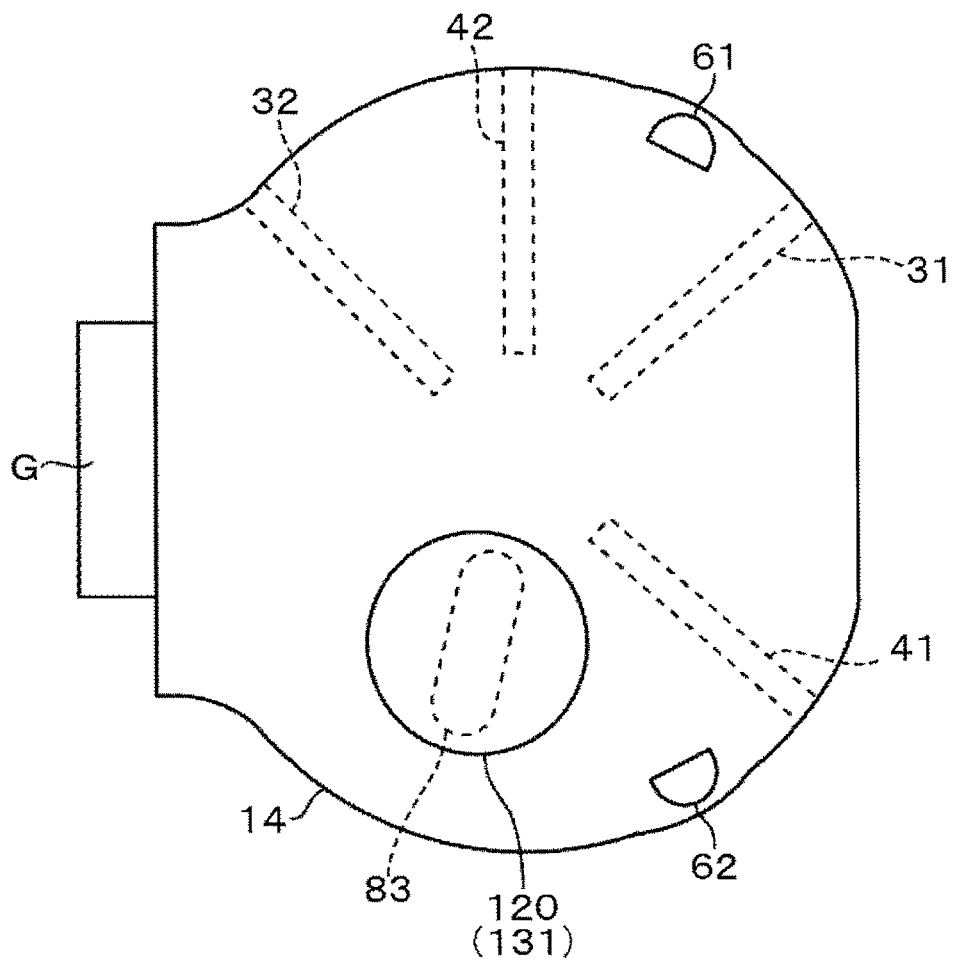
FIG. 25 is a plan view illustrating another example of the film deposition apparatus.

Furthermore, as shown in FIG. 25, when seen from a planar perspective, instead of forming the bias electrode part 120 into the elliptical shape so as to correspond to the installed area, the bias electrode part 120 may be formed, for example, into a circle to cross the installed area. In addition, the antenna 83 may be wound around in a circle form similarly to the antenna 83, or the antenna 83 may be wound around in an approximate sectorial shape similarly to the convex portion 4 while the bias electrode part 120 is formed into the circle. Here, FIG. 25 illustrates the plan view of the vacuum chamber 1 when seen from the lower side.

Figure 26:
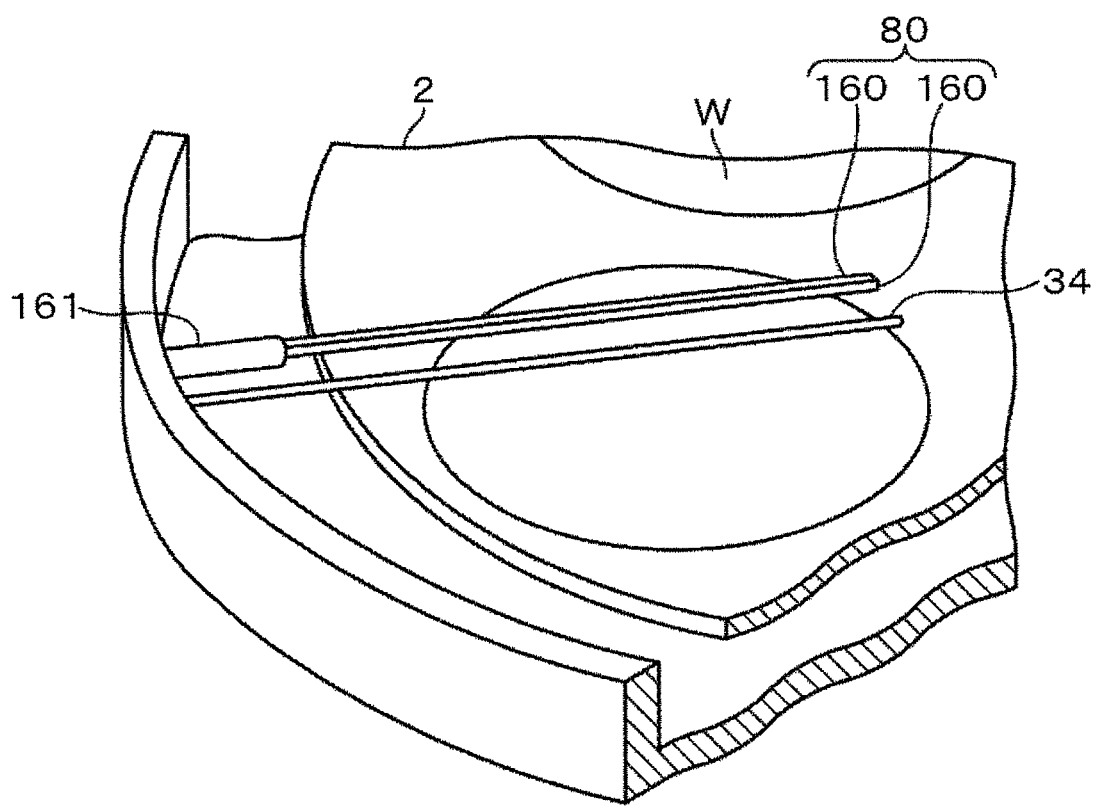
FIG. 26 is a perspective view illustrating another example of the film deposition apparatus.

Moreover, in each of the above-mentioned respective examples, inductively coupled plasma (ICP) is generated by winding around the antenna 83 as the plasma treatment part 80, but generating capacitively coupled plasma (CCP) is also possible. In this case, as shown in FIG. 26, a pair of electrodes 160 is arranged as parallel electrodes on the downstream side in the rotational direction of the turntable 2 relative to the plasma generating gas nozzle 34. These electrodes 160 are hermetically inserted from the side wall of the vacuum chamber 1, and the plasma generating gas is converted to the plasma between the pair of electrodes 160. In FIG. 26, a supporting part 161 is provided in the electrodes 160 at the base end portion of the side wall side of the vacuum chamber 1.

In the respective examples, the radio frequency power source 129 is taken as an example of the bias voltage application part 128, but providing a direct-current power source part that applies a negative direct-current voltage instead of the radio frequency power source 129 is possible. Furthermore, when the electric charge of the plasma used for the plasma treatment is negative, the positive bias voltage may be applied to the wafer W on the turntable 2.

When the distance dimension t between the turntable 2 and the insulating member 122 or the bias electrode part 120 is too large, the power value necessary for attracting the plasma toward the wafer W becomes too large. In contrast, when the distance dimension t is too small, the turntable 2 may collide with the insulating member 122 or the bias electrode part 120. Accordingly, setting the distance dimension t in the above-mentioned range is preferable.

As for the first process gas used in depositing a silicon oxide film, compounds in TABLE 1 may be used. Here, in respective tables hereinafter, "Source A Area" shows the first process area P1, and "Source B Area" shows the second process area P2. In addition, the following respective gases are only examples, and already described gases are shown together.

TABLE 1

Source A Area
Insulating Layer Formation Material

DCS(Dichlorosilane), Tetraethoxysilane(TEOS),
Tetramethylsilane(TMS), HCD(Hexachlorodisilane),
Monosilane[$SiH_4$], Disilane[$Si_2H_6$], HMDS(Hexamethyldisilazane),
TCS(Trichlorosilane), DSA(Disilylamine), TSA(Trisilylamine),
BTBAS(Bis(tertiary-butyl-amino)silane),
3DMAS(Tris(dimethylamino)silane),
4DMAS(Tetrakis(dimethylamino)silane),
TEMASiH(Tris(ethylmethylamino)silane),
TEMASi(Tetrakis(ethylmethylamino)silane),
Si(MMP)4(Tetrakis(methoxypropoxy)silane)

Moreover, compounds in TABLE 2 may be used as the second process gas to oxidize the first process gas in TABLE 1.

TABLE 2

Source B Area
Oxidizing Source $O_2$(Oxygen), $O_3$(Ozone)
$H_2O$(Water)
Plasma + $O_2$
Plasma + $O_3$ Here, "Plasma+$O_2$" or "Plasma+$O_3$" in TABLE 2 means, for example, that the above-mentioned plasma treatment part 80 is provided above the process gas nozzle 32, and that the oxygen gas or the ozone gas are converted to the plasma.

Furthermore, by using a compound in TABLE 1 as the first process gas, and by using a gas composed of a compound shown in TABLE 3 as the second process gas, a silicon nitride film (SiN film) may be deposited.

TABLE 3

Source B Area
Nitriding Source $NH_3$(Ammonia)
$N_2$(Nitrogen)
Plasma + $NH_3$
Plasma + $N_2$ Here, "Plasma" in TABLE 3 means that respective gases following the term of "Plasma" are converted to the plasma similarly to TABLE 2.

In addition, a silicon carbide (SiC) film may be deposited by using gases composed of a compound shown in TABLE 4 as the first process gas and the second process gas.

TABLE 4

| Source A Area Side SiC Film Formation Material (First Process Gas) | Source B Area Carbon Source (Second Process Gas) |
|---|---|
| $SiH_4$, $Si_2H_6$, Tetrachlorosilane($SiCl_4$), Trichlorosilane($SiHCl_3$), Dichlorosilane($SiH_2Cl_2$) | Propane($C_3H_8$), Ethylene($C_2H_4$), Acetylene($C_2H_2$), $C_2H_6$(Ethane) |

Figure 27:
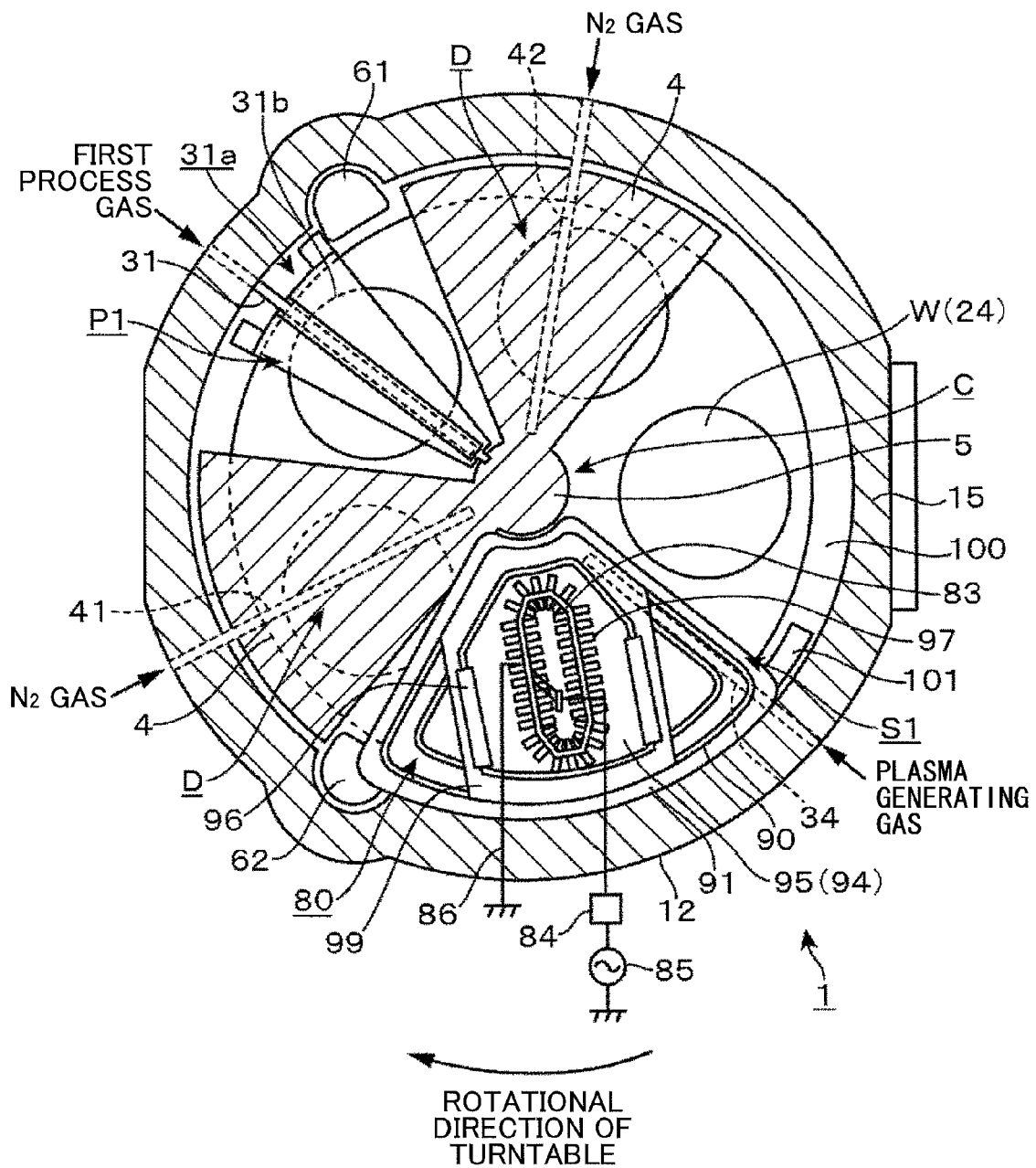
FIG. 27 is a horizontal cross-sectional view illustrating another example of the film deposition apparatus.

Moreover, a silicon film (Si film) may be deposited by using the first process gas cited in TABLE 4. More specifically, as shown in FIG. 27, the second process gas nozzle 32 is not provided in this case, and the wafer W on the turntable 2 alternately pass through the first process area (deposition area) and the modification area S1 by way of the separation areas D. Then the adsorbed layer 300 is deposited by allowing a component of the first process gas to be adsorbed on the surface of the wafers W in the first process area P1, while the turntable 2 rotates, pyrolysis is caused in the adsorbed layer 300 on the wafer W by the heat of the heater unit 7, and impurities such as hydrogen or chlorine are released. Accordingly, the reaction layer 301 is formed by the pyrolysis reaction of the adsorption layer 300.

However, since the turntable 2 rotates around the vertical axis, a time period after the wafer W on the turntable 2 has passed through the first process area and until the wafer W reaches the modification area S1, in other words, a time period for discharging the impurities, is very short. Because of this, the reaction layer 301 on the wafer W right before reaching the modification area S1 still contains the impurities. Therefore, by supplying the plasma of, for example, the argon gas, to the wafer W in the modification area S1, the impurities are removed from the reaction layer 301, and the reaction layer of a preferable film quality can be obtained. In this manner, by allowing the wafer W to pass through the area P1 and S1 alternately, the reaction layer 301 is deposited in a layer-by-layer manner, and a silicon film is deposited. Accordingly, in the embodiment of the present invention, the "plasma treatment" includes a treatment for reacting the adsorbed layer 300 (pyrolysis treatment) in addition to a treatment for removing the impurities from the reaction layer 301 and performing the modification of the reaction layer 301.

As for a plasma generating gas used for the plasma treatment of the silicon film, a gas that generates plasma that supplies energy of ions to the wafer W is available, and more specifically, an inactive gas such as helium (He) or a hydrogen gas other than the above-mentioned argon gas is used.

Furthermore, when depositing the silicon film, boron (B) or phosphorus (P) may de doped to the silicon film by using a dope material in TABLE 5 as the second process gas.

TABLE 5

| Source B Area Si Dope Material |
|---|
| $PH_3$(Phosphine), $B_2H_6$(Diborane), $BCl_3$ |

In addition, by using a gas composed of a compound shown in TABLE 6 as the first process gas, and by using the above-mentioned second process gas, a metal oxide film, a metal nitride film, a metal carbonization film or a high-k film (high dielectric constant film) may be deposited.

TABLE 6

| Source A Area Metal Layer Formation Material |
|---|
| TMA(Trimethylaluminium), Cu(hfac)TMVS(Hexafluoroacetylacetonato-Trimethyl(vinyl)silylcopper(I)), Cu(EDMDD)2, TBTDET(Tris(diethylamino)(tert-butylimido)tantalum), PET(Pentaethoxytantalum(V)), $TiCl_4$(Titanium(IV) chloride), $AlCl_3$(Aluminium chloride), TEH(Tetrakis(ethoxy)hafnium), Zr(OtBt)4, HTTB(Hafnium(IV) tert-butoxide), TDMAH(Tetrakis(diethylamino)hafnium), TDEAH(Tetrakis(diethylamino)hafnium), TEMAH(Tetrakis(ethylmethylamino)hafnium), Hf(MMP)4(Hafnium methoxymethylpropoxide), ZTTB(Zirconium(IV)tetra-tert-butoxide), TDMAZ(Tetrakis(dimethylamino)zirconium), |

TABLE 6-continued

| Source A Area Metal Layer Formation Material |
|---|
| TDEAZ(Tetrakis(diethylamino)zirconium), TEMAZ(Tetrakis(ethylmethylamido)zirconium), Zr(MMP)4(Tetrakis(1-methoxy-2-methyl-2-propoxy)zirconium) TEA(Tetraethylaluminum), Al(MMP)3(Tris(1-methoxy-2-methylpropoxy)aluminum) |

Moreover, a gas for the plasma composed of a compound in TABLE 7 may be used as the gas for plasma modification or the plasma ion doping gas used with the gas for plasma modification.

TABLE 7

| Plasma Area Side Modification Plasma Gas Plasma Ion Implantation Gas |
|---|
| $O_2$ Plasma, Ar Plasma, He Plasma, $H_2$ Plasma, $N_2$ Plasma, $N_3$ Plasma, $H_2O$ Plasma, $CH_4$ Plasma $N_2O$ Plasma $CO_2$ Plasma |

In TABLE 7, plasma containing an oxygen element, plasma containing a nitrogen element and plasma containing a carbon element may be respectively used only in processes of depositing an oxide film, a nitride film and a carbonized film.

The above-discussed plasma modification treatment is performed for each rotation of the turntable 2, in other words, for each deposition of the reaction layer 301, but, for example, may be performed for each 10-to-100-layer deposition of the reaction layers 301. In this case, the radio frequency power source 129 stops supplying the electricity when starting the film deposition. After rotating the turntable 2 to deposit a predetermined number of the reaction layers 301, the reaction gas nozzles 31 and 32 stops supplying the reaction gases, and the plasma modification is conducted by allowing the radio frequency power source 129 to supply the electricity. After that, the deposition of the reaction layers 300 and the plasma modification are repeated again. Furthermore, the plasma modification treatment may be performed on the wafer W on which the thin film is already deposited. In this case, the respective gas nozzles 31, 32, 41 and 42 are not provided in the vacuum chamber 1, and the plasma generating gas nozzle 34, the turntable 2, the bias electrode 120 and the like are provided. Thus, even when only the plasma modification treatment is carried out in the vacuum chamber 1, the bias electrode part 120 can pull the plasma (ions) into the concave portion 10, which can implement a uniform plasma modification treatment throughout the depth direction of the concave portion 10.

In addition, the plasma treatment for the wafer W may perform activation of the process gas instead of the modification treatment. More specifically, the plasma treatment part 80 is combined with the above-mentioned second reaction gas nozzle 32, and the bias electrode part 120 is arranged under the second reaction nozzle 32. In this case, the process gas (e.g., oxygen gas) discharged from the second reaction gas nozzle 32 is activated by the plasma treatment part 80 and converted to the plasma, and the plasma is attracted toward the wafer W. Accordingly, a film thickness and a film quality of the reaction layer 301 can be made uniform.

Thus, even when the process gas is converted to the plasma, the above-discussed plasma modification treatment may be performed together with the conversion from the process gas to the plasma. Moreover, the specific process of converting the process gas to the plasma may be applied to, for example, a thin film deposition of a Si—N (silicon nitride) system other than the above-discussed film deposition of the Si—O system. When depositing the thin film of the Si—N system, a gas containing nitrogen (N) such as an ammonia (NH$_3$) gas is used as the second process gas.

Figure 28:
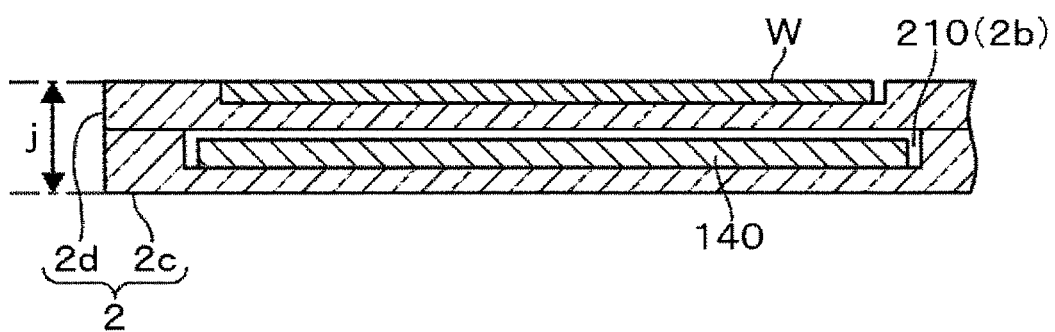
FIG. 28 is a vertical cross-sectional view illustrating another example of the film deposition apparatus.

Here, an additional description is given below of an arrangement layout of the above-discussed auxiliary electrode part 140 together with an atmosphere in which the turntable 2 is disposed and a pressure capacity. As shown in FIG. 15, in burying the auxiliary electrode part 140 within the turntable 2, the turntable 2 (which is made of quartz) and the auxiliary electrode part 140 (which is made of a conductive material such as carbon or copper) differ in coefficient of thermal expansion and contraction from each other. Hence, as shown in FIG. 28, the auxiliary electrode part 140 is formed to be a size smaller than an inner area 210 in which the auxiliary electrode part 140 is buried. More specifically, unless the clearance region is provided between the auxiliary electrode part 140 and the turntable 2, at least one of the auxiliary electrode part 140 and the turntable 2 is liable to be damaged by the thermal expansion and contraction of the auxiliary electrode part 140 and the turntable 2 when the temperature of the vacuum chamber 1 is increased or decreased. Therefore, the clearance region is formed between the auxiliary electrode part 140 and the turntable 2.

A description is given below of a method of manufacturing the turntable 2 more specifically. In FIG. 28, the turntable 2 is constituted of a disk-shaped lower member 2c including a depressed portion 2b forming the above-mentioned inner area 210 on its upper surface, and an upper member 2d similarly formed into a disk shape. The auxiliary electrode part 140 is disposed within the depressed portion 2b, and the lower member 3c and the upper member 2d are welded to each other, by which the turntable 2 is formed.

Accordingly, when the weld is performed in the air atmosphere, the inner area 210 becomes the air atmosphere. In this manner, when the turntable 2 in which the inner area 210 is set at the air atmosphere is arranged in the vacuum chamber 1, and the vacuum chamber 1 is set at the above-discussed film deposition pressure (i.e., vacuum atmosphere), a large pressure difference is caused between the outside of the turntable 2 (inside the vacuum chamber 1) and the inner area 210 of the turntable 2. Because of this, a thickness dimension of the turntable 2 (i.e., board thickness dimension) j has to be set to be thick to some degree so that the turntable 2 can withstand the stress caused by the pressure difference.

On the other hand, when the weld of the turntable 2 is performed in a vacuum atmosphere, the inner area 210 becomes the vacuum atmosphere. In this case, a large pressure difference between the inside of the vacuum chamber 1 and the inner area 210 is not caused in the film deposition atmosphere, but, for example, the inside of the vacuum chamber 1 is returned to the air atmosphere when maintenance of the film deposition apparatus is performed. Due to this, when the inside of the vacuum chamber 1 is set at the air atmosphere, a large pressure difference is caused between the inner area 210 of the turntable 2 and the outside of the turntable 2.

Thus, when the auxiliary electrode part 140 is buried in the turntable 2, even if the pressure of the inner area 210 is set at either the air atmosphere or the vacuum atmosphere, the thickness dimension j of the turntable 2 has to be set to be thicker to some degree than that of the turntable 2 formed into solid. Accordingly, considering the purpose of the auxiliary electrode part 140 intended to electrically approach the bias electrode part 120 to the wafer W on the turntable 2, forming the turntable 2 as shown in FIG. 28 may not be so advantageous.

Figure 29:
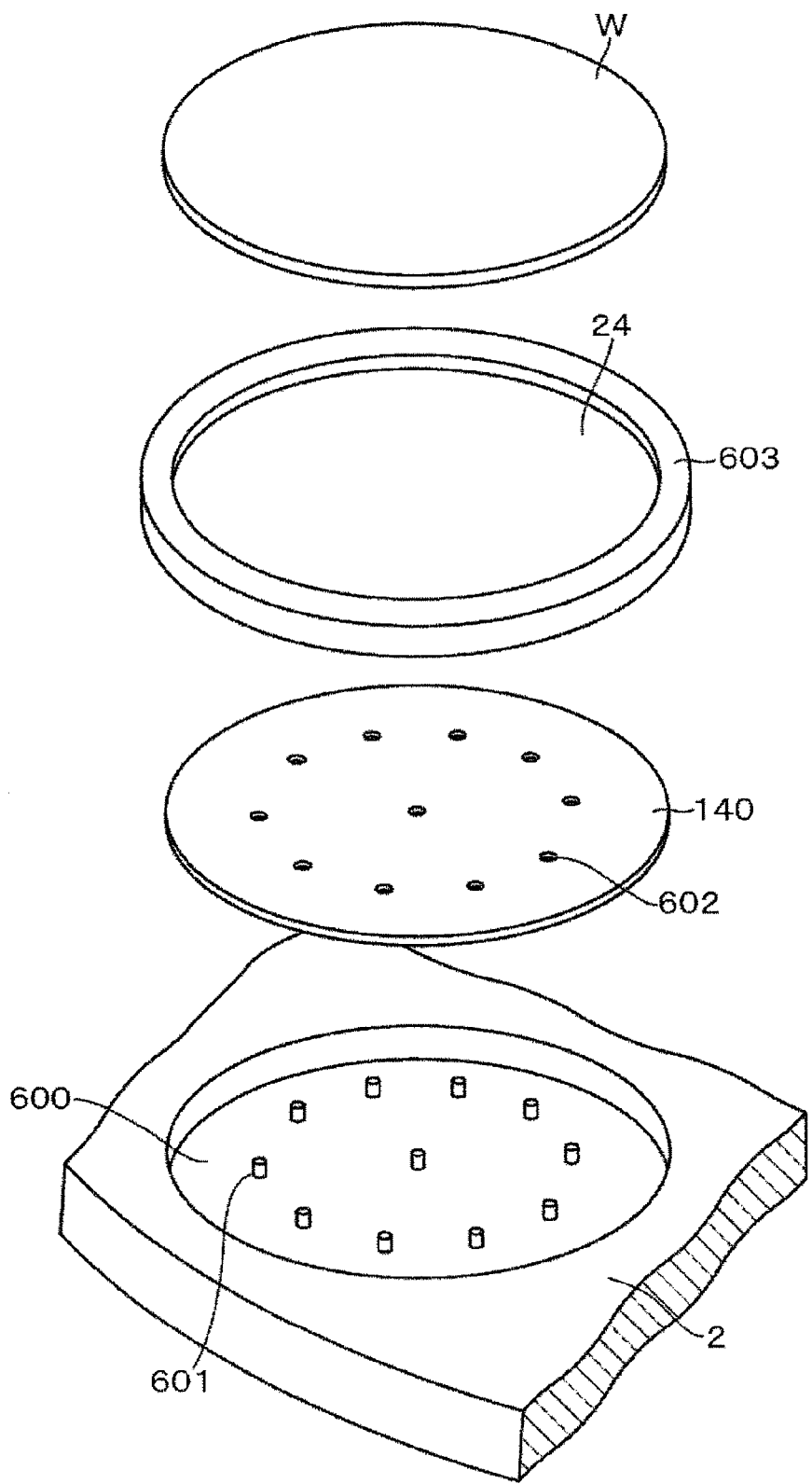
FIG. 29 is an exploded perspective view illustrating another example of the film deposition apparatus.
Figure 30:
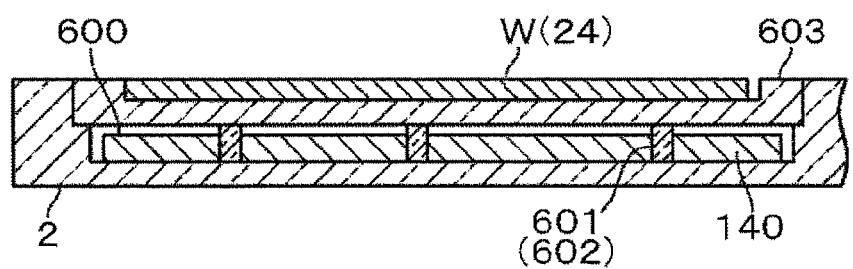
FIG. 30 is a vertical cross-sectional view illustrating another example of the film deposition apparatus.

Therefore, in respective examples described below, by providing the auxiliary electrode part 140 between the wafer W on the turntable 2 and the bias electrode part 120, and further by ensuring the pressure capacity of the turntable 2, the thickness dimension j of the turntable 2 is set at a small dimension of, for example, 5 mm to 20 mm. More specifically, as shown in FIGS. 29 and 30, concave portions 600 having a deeper dimension than the thickness dimension of the wafer W and the auxiliary electrode part 140 are formed at respective locations where the wafers W are loaded in the surface of the turntable 2 (i.e., the formation area of the above-mentioned concave portions 24). On the bottom surfaces of the respective concave portions 600, for example, pin-like projection portions 601, for example, made of quartz are arranged as props at plurality of locations. In this example, a projection portion 601 is arranged at the center of the concave portion 600 as seen from a planar perspective, and a plurality of projection portions 601 are arranged so as to surround the concave portion 601 at the center throughout the circumferential direction at, for example, nine locations. Height dimensions of the respective projection portions 601 are set to be larger than the thickness dimension d of the auxiliary electrode part 140, and to be equal to each other among the projection portions 601.

Moreover, through-holes 602 that penetrate the auxiliary electrode part 140 in the vertical direction are formed at a plurality of locations, ten locations in this example, corresponding to the arrangement layout of the respective projection portions 601 so that the respective projection portions 601 are inserted in the through-holes 602 of the auxiliary electrode part 140. Furthermore, a disk-shaped lid body 603 made of, for example, quartz, is arranged on the upper side of the auxiliary electrode 140, and the concave portions 24 to receive the wafers W are formed in the surface of the lid body 603. In this manner, by putting the auxiliary electrode part 140 and the lid body 603 within the concave portion 600 in this order, and by welding the lid body 603 to the turntable 2 in, for example, the vacuum atmosphere or the air atmosphere, the lower surface of the lid body 603 is supported by the respective projection portions 601. Hence, by configuring the turntable 2 in such a way, the auxiliary electrode part 140 can be buried in the turntable 2 while ensuring the pressure capacity of the turntable 2 and reducing the thickness dimension j of the turntable 2. Here, in addition to welding the lid body 603 and the turntable 2 to each other, welding the lid body 603 and the respective projection portions to each other is possible. Also, instead of providing the through-holes 602 to let the projection portions 601 through in the auxiliary electrode part 140, by constituting the auxiliary electrode part 140 of a plurality of members made of a conductive material (e.g., metal pieces or metal powder), the projection portions 601 may be arranged between members adjacent to each other.

Figure 31:
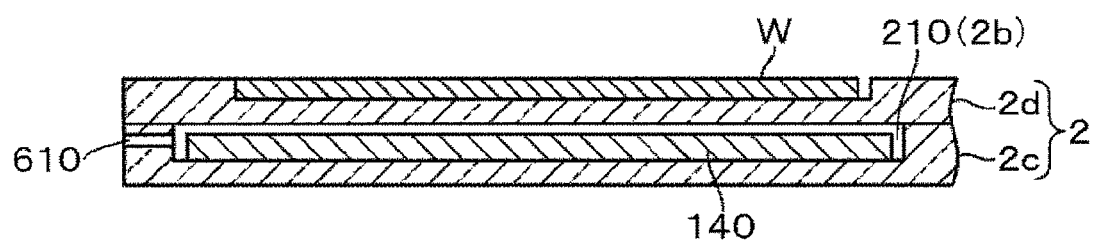
FIG. 31 is a vertical cross-sectional view illustrating another example of the film deposition apparatus.

FIG. 31 illustrates an example of forming a ventiduct 610 to communicate the inner area 210 with the outside of the turntable 2 such as an area on the lateral side of the turntable 2 instead of providing the projection portions 610 in the turntable 2. More specifically, as described with reference to FIG. 28, when the inner area 210 is hermetically formed, and the pressure difference is caused between the inner area 210 and the outside area of the turntable 2, the stress is applied to the turntable 2 depending on the pressure difference.

Therefore, in FIG. 31, the turntable 2 is configured so that the pressure difference is not caused, or the pressure difference does not become so large. More specifically, one end of the ventiduct 610 is open at a region to which the auxiliary electrode part 140 does not contact in the inner surface of the inner area 210, for example, at a location on the upper end side in the side circumferential surface. As described above, the other end of the ventiduct 610 is open in the side wall surface to prevent the gas from flowing around into the inner area 210. An opening size of the ventiduct 610 is, for example, equal to or more than 1.5 mm in diameter dimension. The ventiduct 610 may be open in the lower surface of the turntable 2.

Accordingly, when the film deposition process is performed by using the turntable 2 configured in such a way, if the inside of the vacuum chamber 1 is set at the vacuum atmosphere, the atmosphere in the inner area 210 is evacuated through the ventiduct 610. On the other hand, when the inside of the vacuum chamber 1 is returned to the air atmosphere in doing maintenance and the like, the atmosphere outside the vacuum chamber 1 flows into the inner area 210 through the ventiduct 610. Thus, because the generation of the pressure difference is reduced inside and outside the inner area 210, the auxiliary electrode part 140 can be buried while ensuring the pressure capacity of the turntable 2 and reducing the thickness dimension j of the turntable 2. The other end of the ventiduct 601 may be open in the side circumferential surface of the turntable 2. In providing such a ventiduct 610, the above-discussed projection portions 601 may be arranged with the ventiduct 610.

Figure 32:
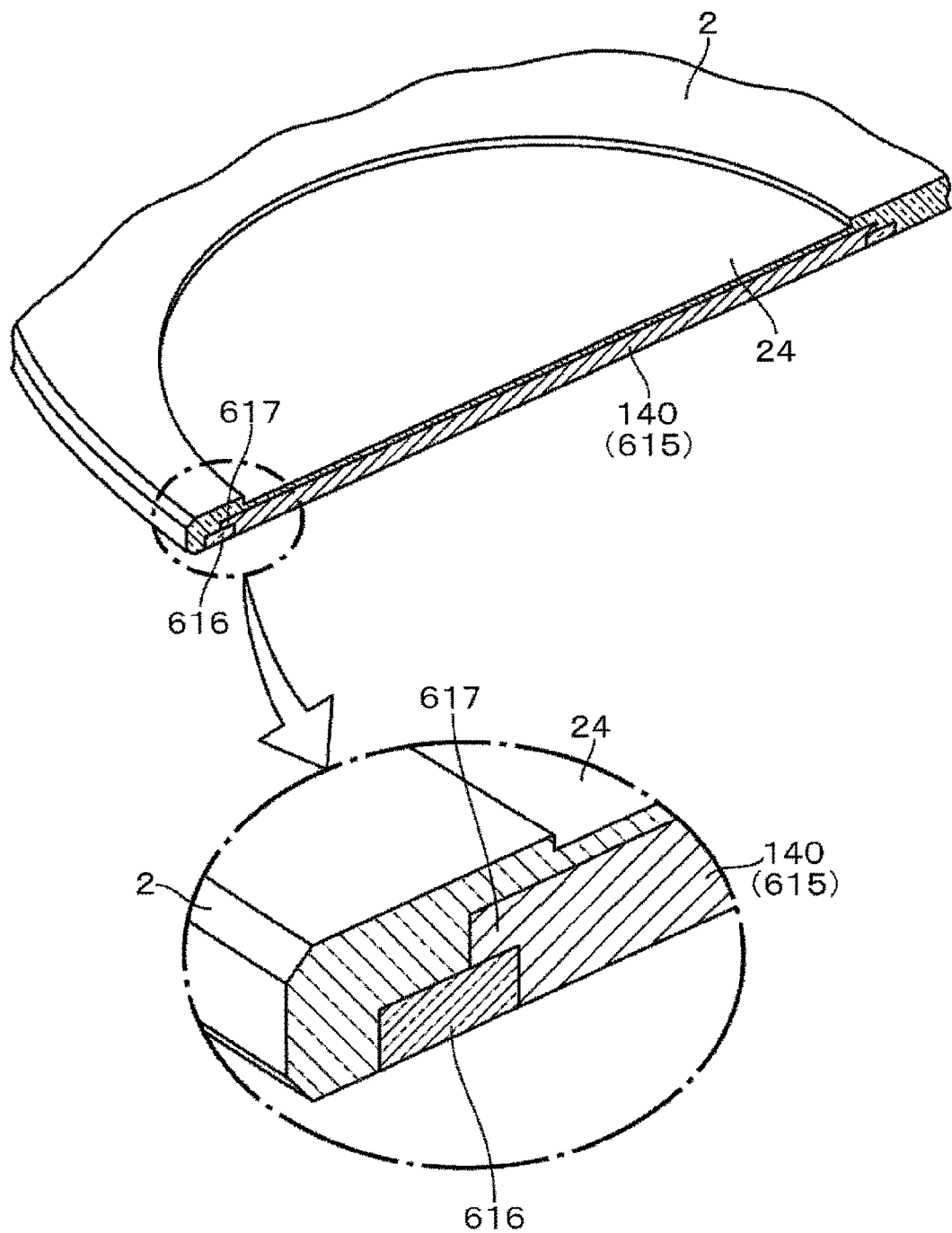
FIG. 32 is a perspective view illustrating another example of the film deposition apparatus.

FIG. 32 illustrates an example of an auxiliary electrode part 140 thermally expandable and contractible and arranged on the lower surface of the turntable 2 instead of burying the auxiliary electrode in the turntable 2. More specifically, regions under the respective concave portions 24 in the turntable 2 form housing portions 615, being depressed upward, for example, in a circular shape, and the auxiliary electrode parts 140 are housed in the housing portions from the lower side. The outer edge portion on the upper surface side of the auxiliary electrode part 140 horizontally extends outwards throughout the circumferential direction, and forms a flange portion 617. Furthermore, an approximately ring-shaped holding member 616, for example, made of quartz, is arranged outside the auxiliary electrode part 140, and the lower surface of the turntable 2 on the outer edge side of the auxiliary electrode part 140 is depressed in a ring shape along the circumferential direction of the auxiliary electrode part 140 to allow the holding member 616 to set in. Then, as shown in FIG. 33, by putting the auxiliary electrode part 140 in the housing portion 615, and by welding the holding member 616 to the flange portion 617 and the turntable 2, the auxiliary electrode portion 140 is arranged in the turntable 2 in an integrated manner.

Figure 34:
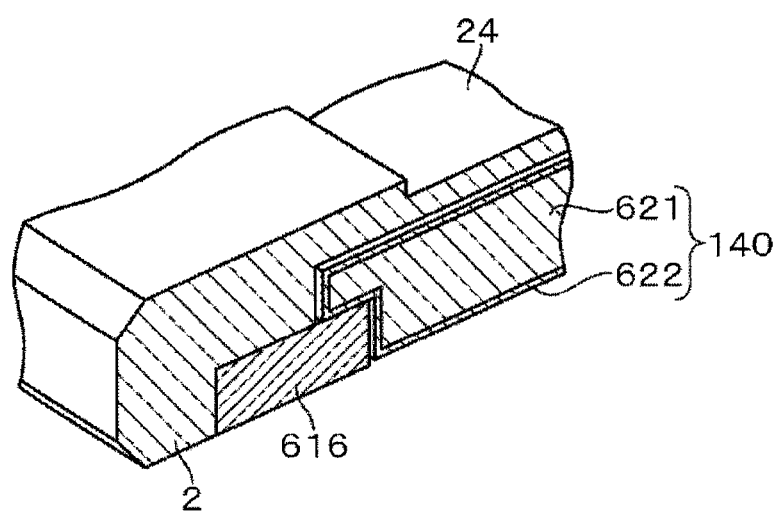
FIG. 34 is a perspective view illustrating another example of the film deposition apparatus.

In addition, FIG. 34 illustrates an example of the auxiliary electrode part 140 constituted of a body member 621 made of a dielectric material or an insulator such as quartz and an electrode film 622 formed along the outer surface of the body member 621, in arranging the auxiliary electrode part 140 on the lower surface side of the turntable 2 as described above. In other words, the body member 621 is covered with the electrode film 622. Even in this case, since the bias voltage can be applied to the wafer W through the electrode film 622, effects similar to the above-described respective examples.

Figure 35:
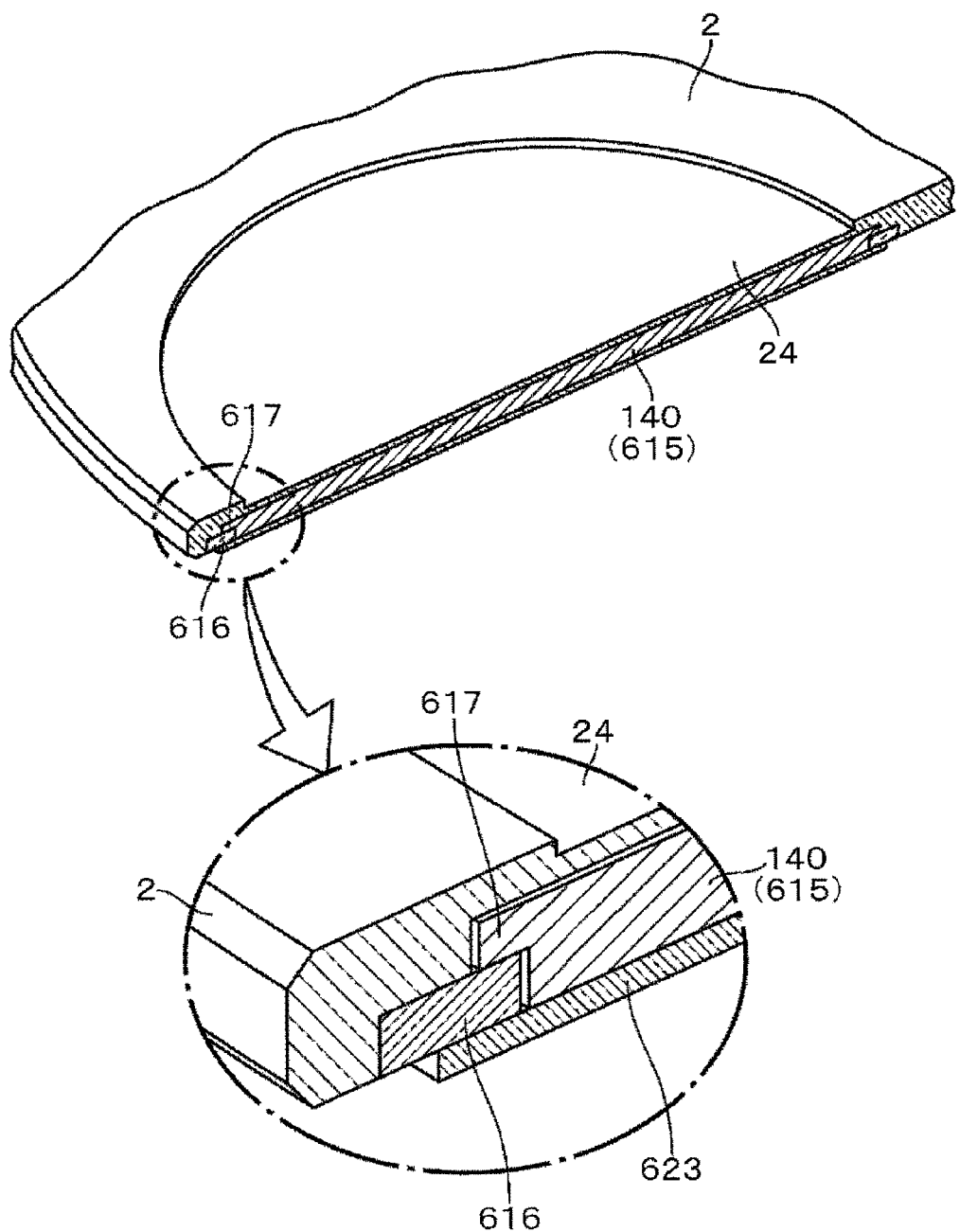
FIG. 35 is a perspective view illustrating another example of the film deposition apparatus.

Thus, when the electrode film 622 is formed on the surface of the body member 621, the electrode film 622 may be formed only on the upper surface side (i.e., the surface of the body member 621 on the wafer W side). Moreover, as shown in FIG. 35, an insulating plate 623 such as quartz may be arranged on the lower side of the auxiliary electrode part 140 and the electrode film 622, so that the auxiliary electrode part 140 or the electrode film 622 is not exposed in the vacuum chamber 1 as shown in FIGS. 32 through 34.

Figure 33:
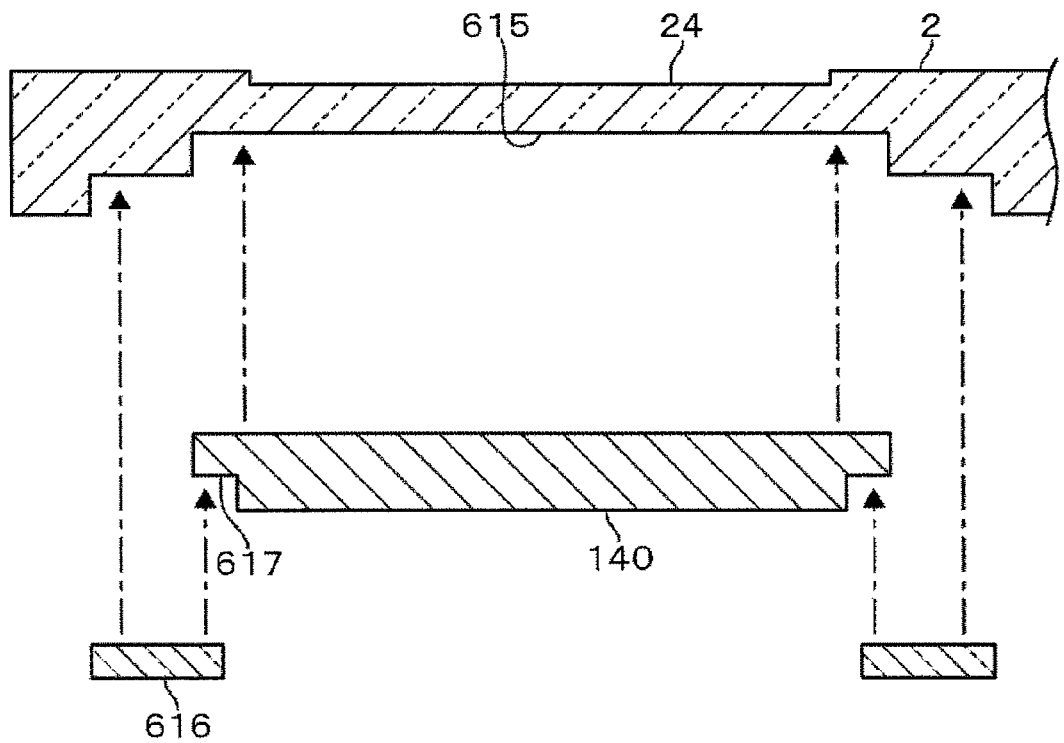
FIG. 33 is a vertical cross-sectional view illustrating another example of the film deposition apparatus.
Figure 36:
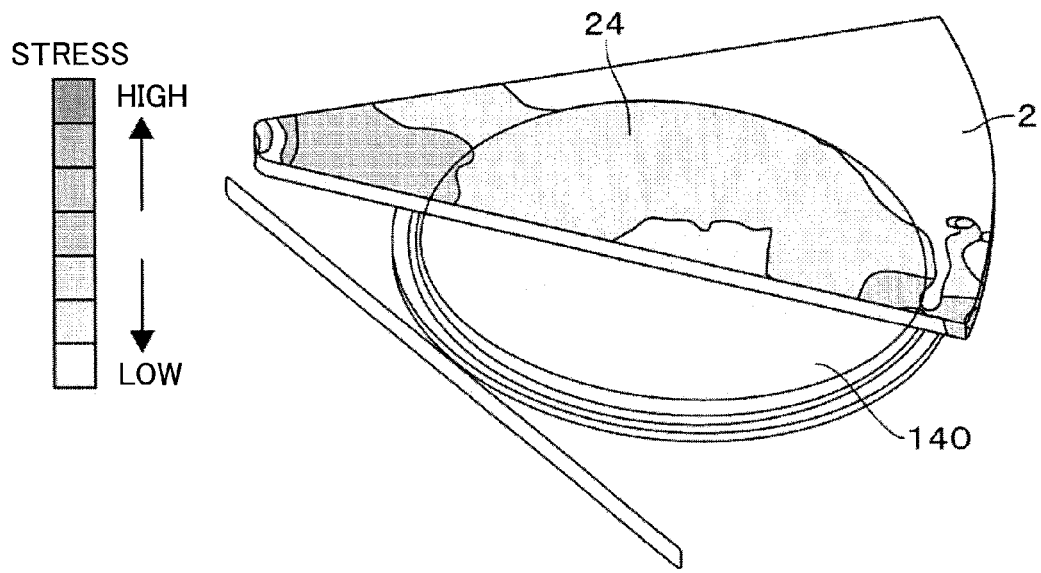
FIG. 36 is a property diagram showing a result of a simulation performed in an embodiment of the present invention.
Figure 37:
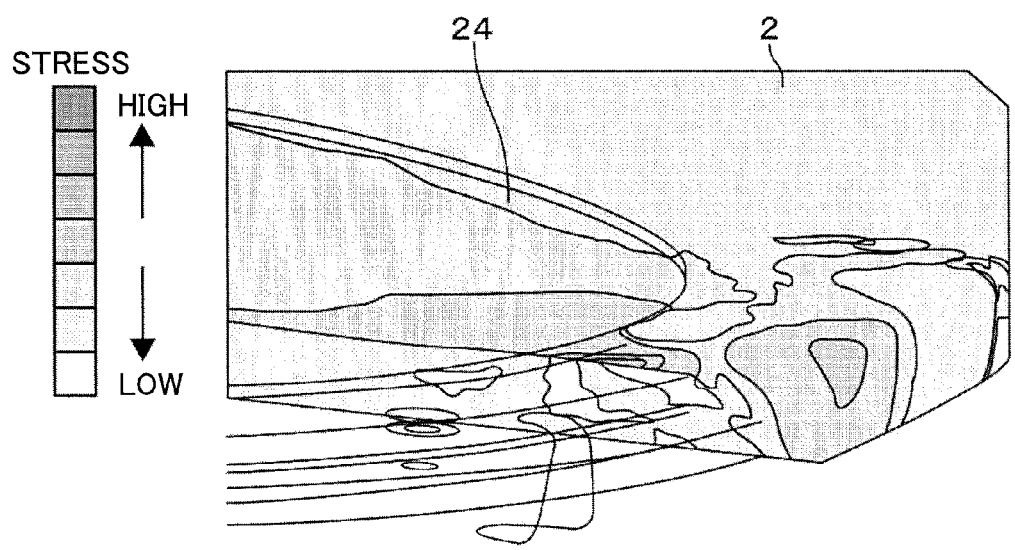
FIG. 37 is a property diagram showing a result of a simulation performed in an embodiment of the present invention.
Figure 38:
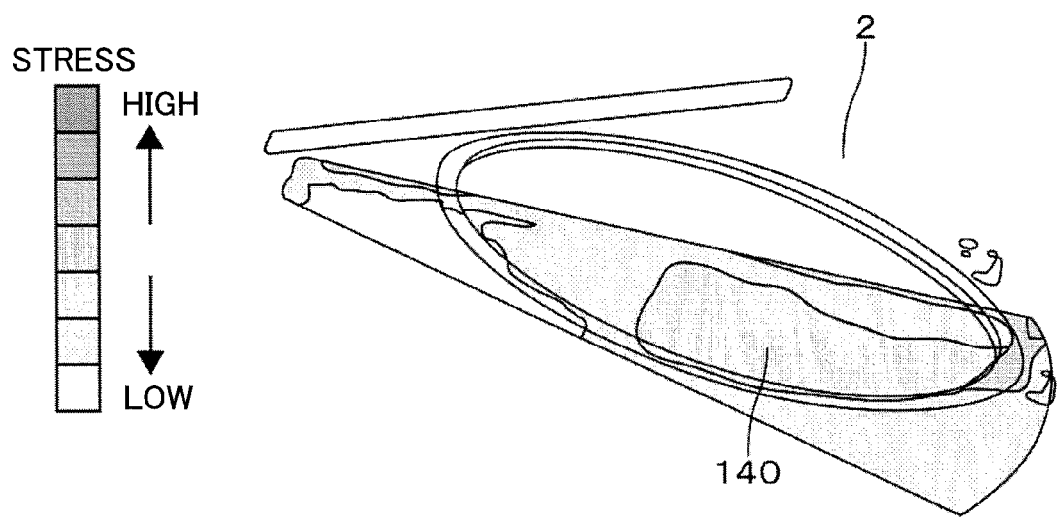
FIG. 38 is a property diagram showing a result of a simulation performed in an embodiment of the present invention.

FIGS. 36 through 38 show simulation results of loads (i.e., stresses) applied to the turntable 2 when setting the thickness dimension j of the turntable 2 at the above-described values, in providing the auxiliary electrode part 140 on the lower surface side of the turntable 2 as shown in FIGS. 32 through 34. In these simulations, a rotational speed of the turntable 2 is set at 300 rpm, and a heating temperature of the wafer W is set at 600 degrees.

As a result, the stress applied to the wafer W is about 2.8 MPa at most, and is considerably lower than 50 MPa of a stress capacity of quartz in either the upper surface side (FIGS. 36 and 37) or the lower surface side (FIG. 38) of the turntable 2. Here, FIG. 37 enlarges a region where the stress is the highest (i.e., outer edge side of the turntable 2) in FIG. 36.

At least the surface of the auxiliary electrode part 140 in FIGS. 32 through 34 is made of a conductor, and contacts the area where the respective gases are supplied above the turntable 2 through the lower area of the turntable 2. Accordingly, for example, when the apparatus is cleaned, for example, if a cleaning gas (e.g., fluorine ($F_2$) gas, chlorine ($Cl_2$) gas, a gas containing the fluorine and the chlorine ($ClF_3$) or the like) supplied from the nozzle 43 contacts the auxiliary electrode part 140 by flowing around the side circumferential surface of the turntable 2, the auxiliary electrode part 140 is liable to be eaten away. Therefore, a simulation is performed with respect to whether the cleaning gas flows around to the auxiliary electrode part 140 or not as described below.

More specifically, a simulation is conducted about a cleaning gas concentration at a level of 1 mm above the covering member 7a stacked on the heater unit 7 or the insulating member 122. In this simulation, the cleaning gas is supplied from the separation gas nozzle 41 into the vacuum chamber 1 at 1 slm, and nitrogen gases set at a variety of flow rates are used as the other gases. The rotational speed of the turntable 2 is set at 5 rpm (see FIG. 39A), 20 rpm (see FIG. 39B), 60 rpm (see FIG. 39C) and 120 rpm (see FIG. 39D), and the turntable 2 is rotated in a counterclockwise fashion in any of the examples. Also, a distance dimension in an area between the covering member 7a or insulating member 122 and the turntable 2 is set at 3 mm or less, and a gas (e.g., a nitrogen gas) of about 13 slm is supplied from the gas discharge holes 124. With respect to the other simulation conditions, the same conditions are used in the respective examples.

As a result, as shown in FIGS. 39A through 39D, even when the rotational speeds of the turntable 2 are set at as any examples, flowing around to the auxiliary electrode part 140 of the cleaning gas is not found.

In addition, FIGS. 40A through 40D show a simulation result of a concentration distribution of a cleaning gas at the level of 1 mm above the turntable 2 when the rotational speed of the turntable 2 is set at 5 rpm (see FIG. 40A), 20 rpm (see FIG. 40B), 60 rpm (see FIG. 40C) and 120 rpm (see FIG. 40D) as well as FIG. 39A through 39D. Moreover, FIGS. 41A through 41D show a simulation result of a concentration distribution of a cleaning gas at the level of 1 mm above the nozzle cover 31a (i.e., 7 mm above the turntable 2) when the rotational speed of the turntable 2 is set at 5 rpm (see FIG. 41A), 20 rpm (see FIG. 41B), 60 rpm (see FIG. 41C) and 120 rpm (see FIG. 41D). In any examples of FIGS. 40A through 40D and 41A through 41D, the cleaning gas distributes in the vicinity of the separation gas nozzle 41. Accordingly, the cleaning gas is thought to flow toward the evacuation openings 61 and 62 and to be rapidly evacuated without flowing to the auxiliary electrode part 140.

Figure 42:
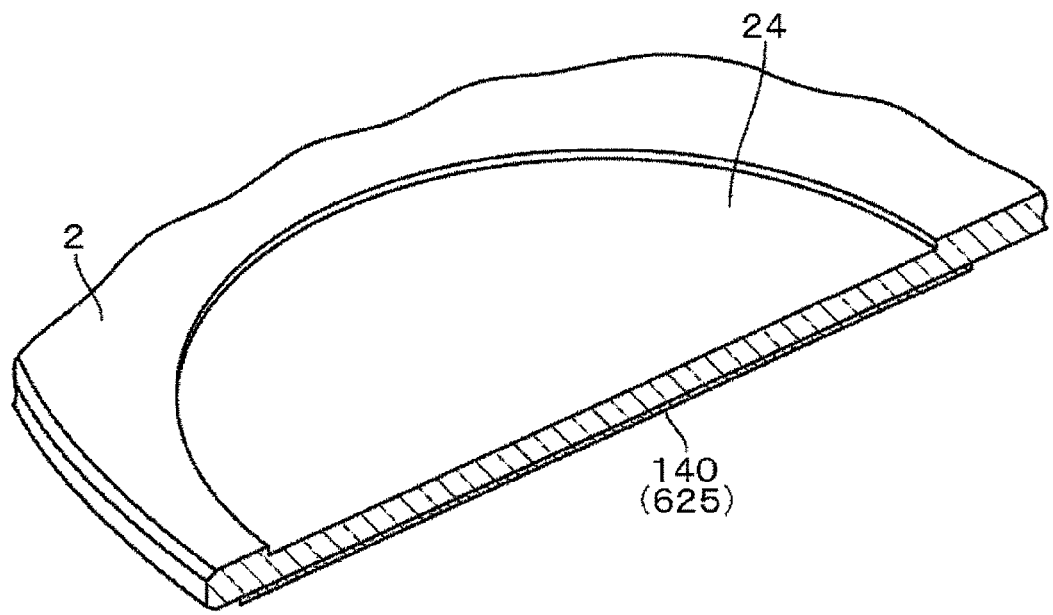
FIG. 42 is a perspective view illustrating another example of the film deposition apparatus.

As described above, in providing the auxiliary electrode part 140 between the wafer W on the turntable 2 and the bias electrode part 120, as shown in FIG. 42, instead of burying the auxiliary electrode part 140 in the turntable 2, depositing a metal film 625 on the lower surface of the turntable 2 is possible.

Figure 43:
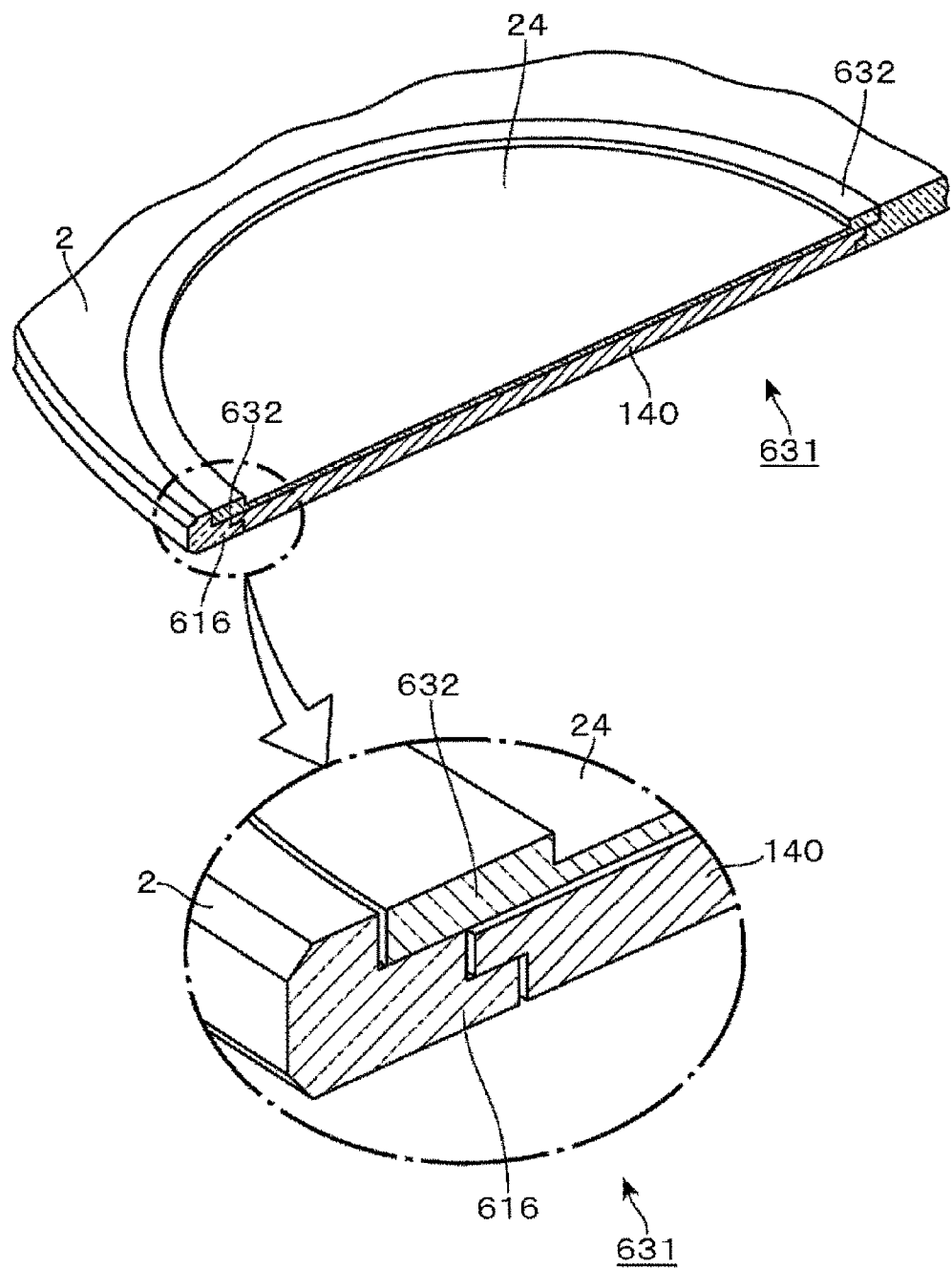
FIG. 43 is a perspective view illustrating another example of the film deposition apparatus.
Figure 44:
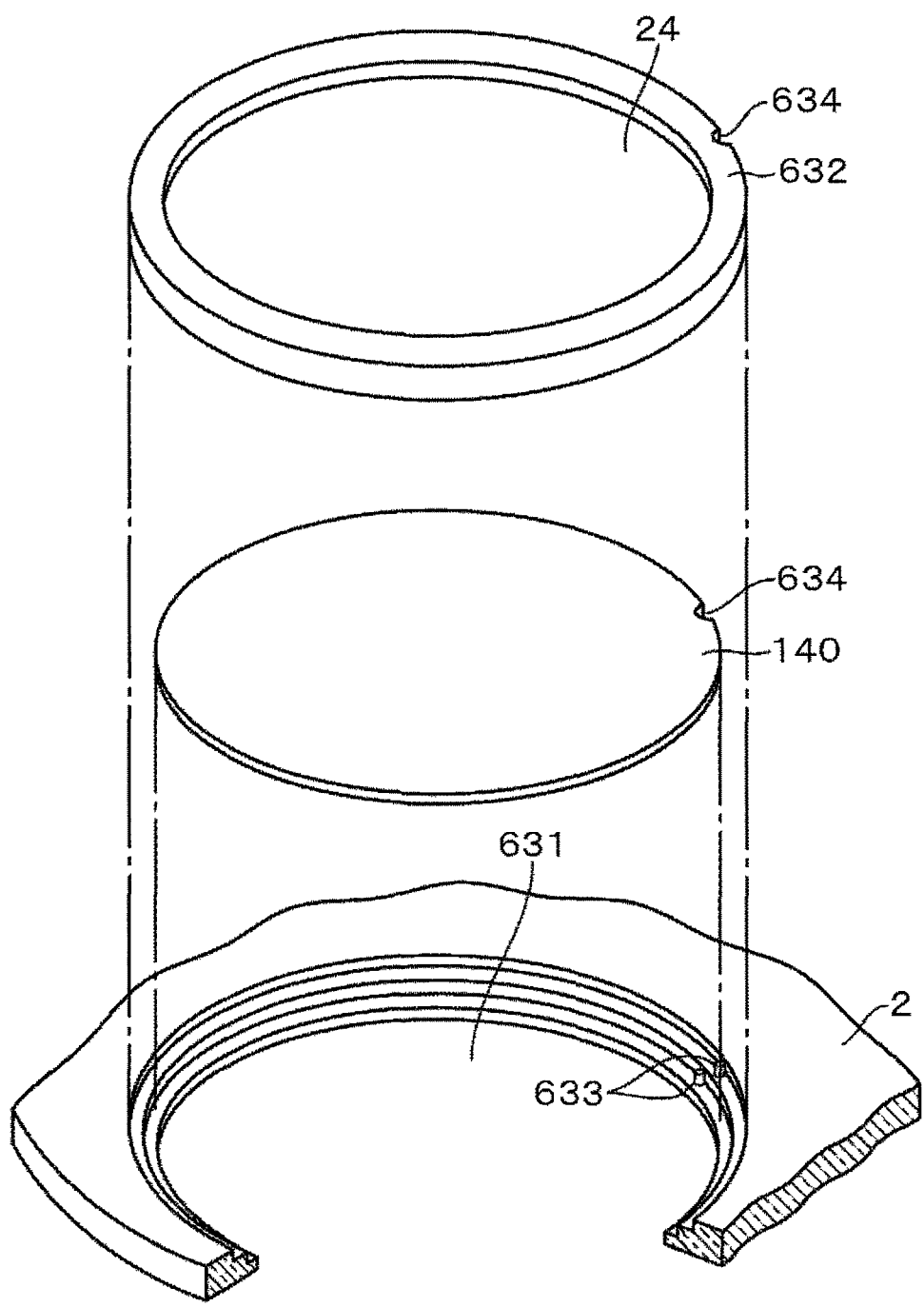
FIG. 44 is an exploded perspective view illustrating another example of the film deposition apparatus.

Furthermore, in forming the auxiliary electrode part 140 on the lower surface side of the turntable 2, taking down the auxiliary electrode part 140 from the upper side of the turntable 2 is possible. More specifically, as shown in FIGS. 43 and 44, through-holes 631 having a larger dimension than the diameter dimension of the wafers W as seen from a planar perspective are formed at the areas where the wafers W are loaded in the turntable 2. Then the auxiliary electrode parts 140 are taken down into the through-holes 631, and the outer periphery of the auxiliary electrode parts 140 and the inner periphery of the through-holes 631 are engaged with each other. In addition, a disk-shaped plate-like body 632 made of, for example, quartz, is formed to be a size larger than the auxiliary electrode part 140 as seen from a planar perspective, and the concave portion 24 to receive the wafers W is formed in the surface of the plate-like body 632. Next, the plate-like body 632 is stacked on the auxiliary electrode part 140, and the outer periphery of the plate-like body 632 and the inner periphery of the through-hole 631 on the upper side are engaged with each other. As shown in the lower part of FIG. 43 by being enlarged, a level of the upper surface of the plate-like body 632 and the upper surface of the turntable 2 are the same as each other. In such an example, effects similarly to the above-discussed respective examples can be obtained.

Pins 633 in FIG. 44 are provided to position the auxiliary electrode part 140 and the plate-like body 632 and to prevent the auxiliary electrode part 140 and the plate-like body 632 from slipping relative to the turntable 2. The pins 633 are configured to be engaged with cutout portions 644 formed at positions corresponding to the pins 633 in the periphery portion of the auxiliary electrode parts 140 and the plate-like body 632. More specifically, in performing the film deposition process on the wafer W, the turntable 2 is rotated around the vertical axis, and the wafer on the turntable 2 is lifted up and down by the lift pins through the through-holes (which are not shown in the drawings) formed in the turntable 2. Because of this, unless members constituted of the auxiliary electrode part 140 and the plate-like body 632 are configured to prevent a position gap relative to the turntable, the turntable 2 and the members are liable to slide, and not liable to be able to lift up and down the wafers W. Therefore, to prevent the auxiliary electrode part 140 and the plate-like body 632 from sliding or being out of position relative to the turntable 2, these pins 633 and cutout portions 644 are formed as a positioning mechanism. Here, such a positioning mechanism is also provided in the auxiliary electrode part 140 in FIGS. 15, 28 and 31 through 35. In addition, FIG. 44 illustrates the turntable 2, a part of which is cut out.

Figure 45:
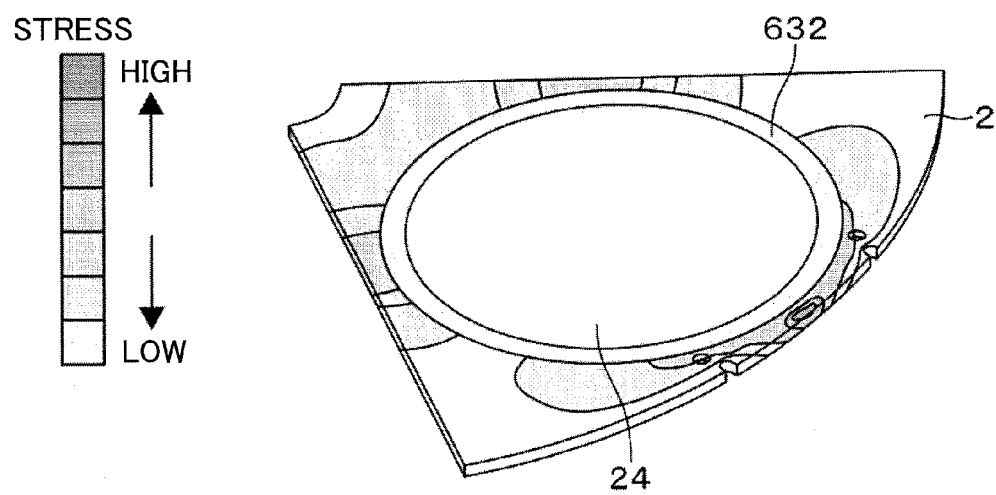
FIG. 45 is a property diagram showing a result of a simulation performed in an embodiment of the present invention.
Figure 46:
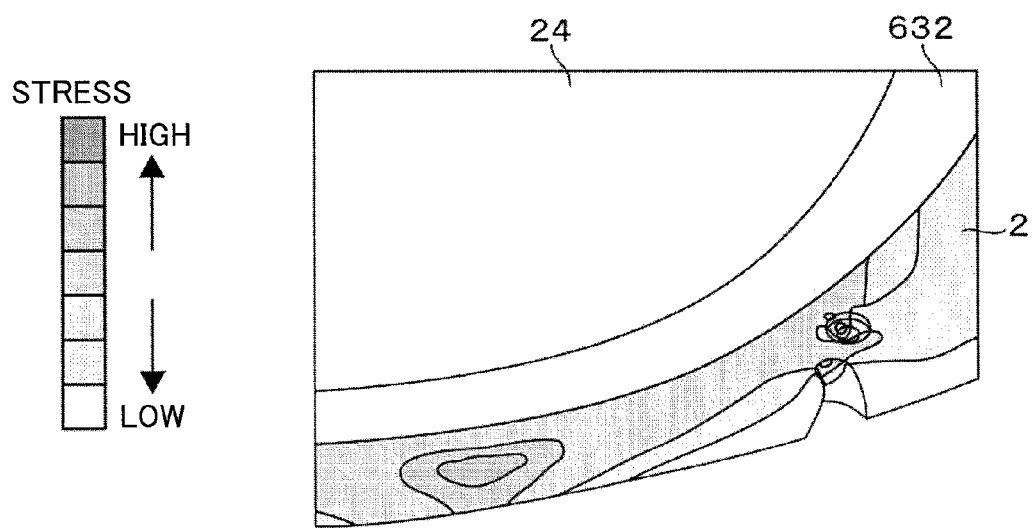
FIG. 46 is a property diagram showing a result of a simulation performed in an embodiment of the present invention.
Figure 47:
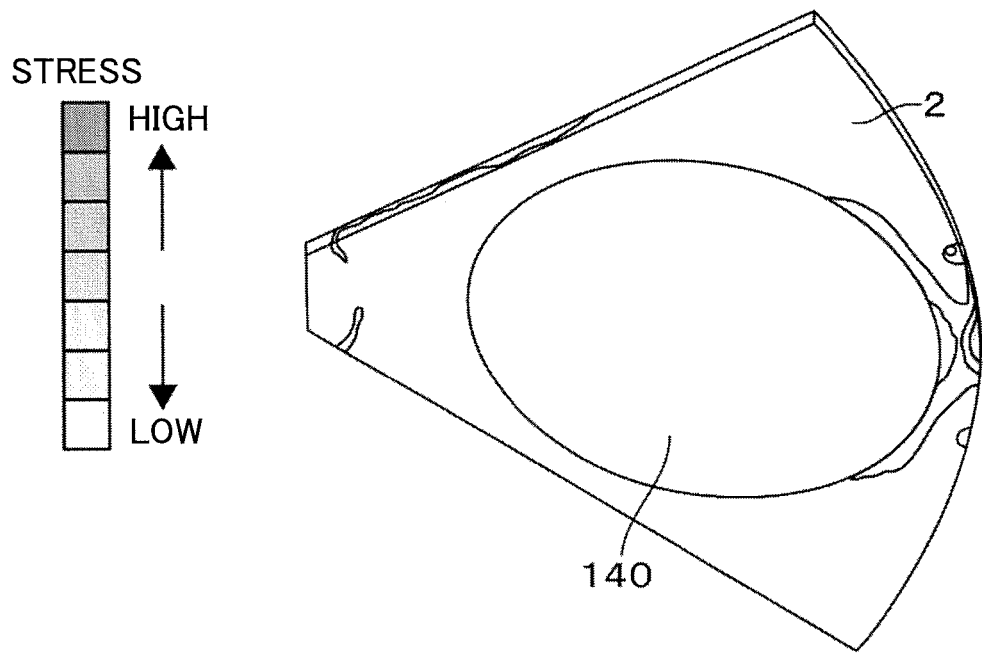
FIG. 47 is a property diagram showing a result of a simulation performed in an embodiment of the present invention.

FIGS. 45 through 47 show results of simulating the stress applied to the turntable 2 similarly to the above examples when the auxiliary electrode parts 140 are arranged as shown in FIGS. 43 and 44. According to FIGS. 45 through 47, it is noted that the stress over the stress capacity of quartz is not applied to the turntable 2 in either the upper surface side (which is shown in FIGS. 45 and 46) or the back surface side (which is shown in FIG. 47) of the turntable 2. More specifically, the highest value of the stress applied to the turntable 2 was 7.8 MPa in this simulation. Here, FIG. 46 enlarges an area around the outer edge portion of the turntable 2 in FIG. 45.

A description is given below of preferable examples of a material that configures an installation place of the bias electrode part 120 or the turntable 2. As noted from the above description, a capacitance is formed between the bias electrode part 120 and the plasma in the vacuum chamber 1. More specifically, a capacity Cp of sheath of the plasma, a capacity Ct of the turntable 2, and a capacity Cs formed by a clearance are between the turntable 2 and the bias electrode part 120 lie between the bias electrode part 120 and the plasma. Accordingly, increasing a synthetic capacity of the capacity Ct and the capacity Cs as much as possible is preferable to increase a force of attracting the plasma to the wafer W side when any value of the radio frequency power is supplied to the bias electrode part 120. In other words, configuring the turntable 2 and the bias electrode part 120 so that a high voltage is not applied to the region forming the capacity Ct and Cs. The capacitance is generally expressed in the following formula (1).

$$C1 = \in \times S/k \qquad (1)$$

C1: capacitance of capacitor, $\in$: dielectric constant, S: surface area of the capacitor, k: a pair of opposite electrodes forming the capacitor Accordingly, it is noted that a distance k is made small, and a dielectric constant $\in$ is made large when a high capacity value C1 is desired to be obtained. A description is given below corresponding to the respective capacity values Ct and Cs in more detail. A board thickness dimension t of the turntable 2 is preferably formed as thin as possible, and the turntable 2 is preferably made of a high-dielectric material (e.g., a dielectric material such as crystal, alumina ($Al_2O_3$), or aluminum nitride (AlN)). With respect to an area between the turntable 2 and the bias electrode par 120, a clearance dimension of the area is preferably formed as small as possible, in other words, the bias electrode part 120 is preferably arranged as close to the turntable as possible. Hence, a boar thickness of the above-mentioned insulating member 122 is preferably formed to be thin. Moreover, supplying a high-dielectric gas to the area between the turntable 2 and the bias electrode 120 (i.e., unexcited area S2), and increasing the dielectric constant by adjusting the pressure of the area are also possible. More specifically, when the high-dielectric gas is supplied to the lower surface side of the turntable 2, the pressure of the area is preferably high. In contrast, when a low-dielectric gas is supplied to the lower surface side of the turntable 2, the pressure of the area is preferably low.

In reducing the board thickness dimension of the turntable 2, if the actual board thickness is reduced, the strength of the turntable 2 is weakened. Therefore, as described above, by arranging the auxiliary electrode parts 140 in the turntable 2, the electrical board thickness dimension is preferably made thin. For example, at least one kind of conductive material (i.e., a conductor made of metal or a semiconductor) made of copper (Cu), iron (Fe), aluminum (Al), carbon (C) and silicon (Si) or the like is cited as a material that forms the auxiliary electrode part 140.

Figure 48:
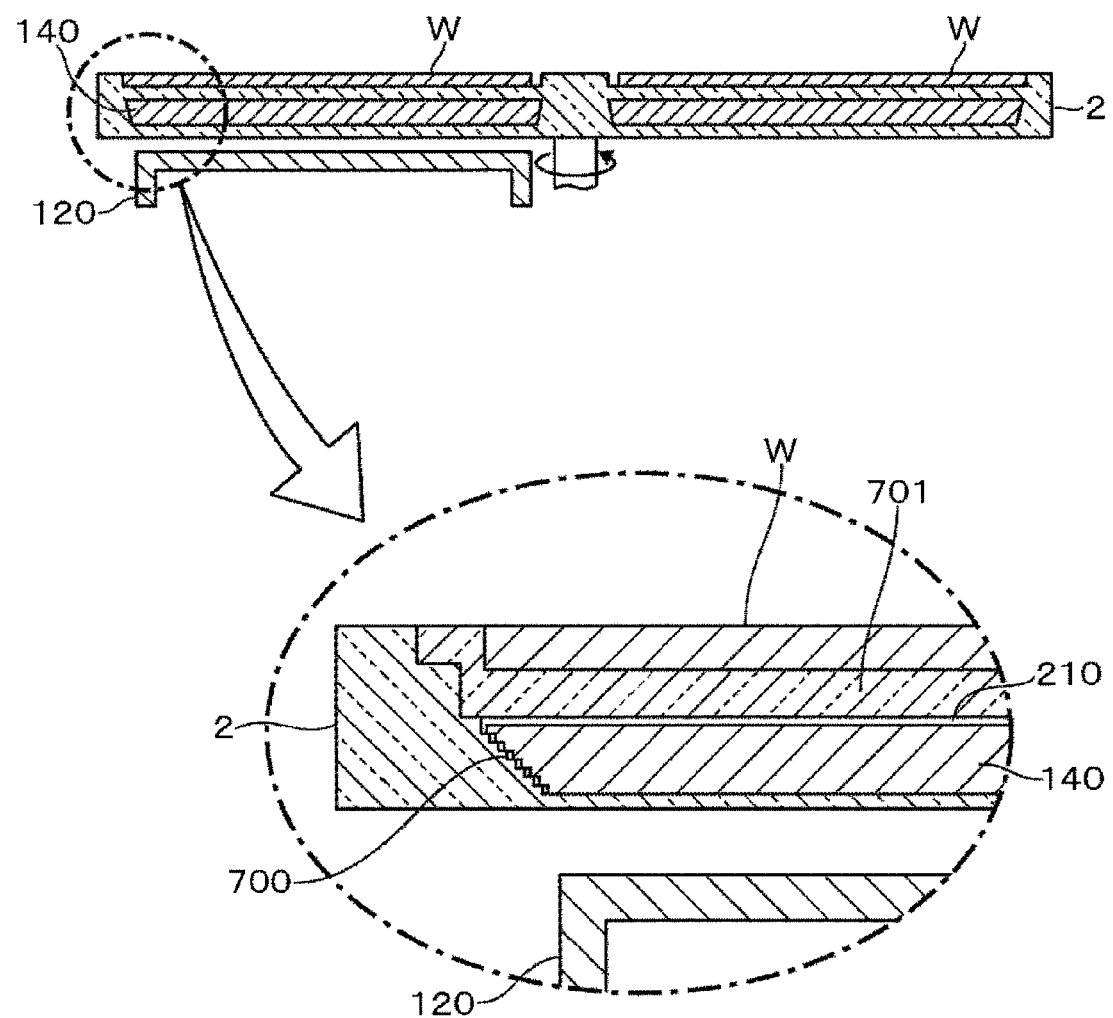
FIG. 48 is a vertical cross-sectional view illustrating another example of the film deposition apparatus.

As for a configuration of the auxiliary electrode part 140, a stair-like stepped portion 700 is preferably formed in the lateral circumferential surface of the auxiliary electrode parts 140 in the circumferential direction, and the stepped portions 700 are preferably provided at a plurality of regions throughout the vertical direction to prevent the generation of an abnormal electrical discharge (plasma) between the turntable 2 and the bias electrode part 120. In other words, when the vertical surface is continuously and long formed throughout the vertical direction in the lateral circumferential surface, the abnormal electrical discharge is likely to occur. Therefore, as shown in FIG. 48, the stepped portions 700 are preferably formed between horizontal surfaces vertically adjacent to each other so that the vertical surfaces are, in a sense, formed intermittently.

Accordingly, the auxiliary electrode part 140 is a part of a conductive member of an approximate conical shape that reduces its diameter from the upper side to the lower, and the part is formed by horizontally cutting the conductive member at a certain level in the height direction, and by picking up the upper part higher than the cutting level (i.e., the part having a larger diameter). An inner wall surface of the inner area 210 of the turntable 2 in which the auxiliary electrode part 140 is buried faces the auxiliary electrode part 140 through a clearance area, and reduces its diameter in a step-like form from the upper side toward the lower side so as to be along the outer peripheral surface of the auxiliary electrode part 140 similarly. Thus, by forming the stepped portion 700 in the auxiliary electrode part 140, because an area where the electric field is formed between the turntable 2 and the bias electrode part 120 when seen from a planar perspective becomes small, the abnormal electrical discharge is unlikely to occur from this aspect.

The above-mentioned bias electrode part 120 is formed to have the same size as the lower surface of the auxiliary electrode part 140 at a position where the bias electrode part 120 and the auxiliary electrode part 140 overlap one another when seen from a planar perspective. In FIG. 48, a lid body 701 is provided to cover the upper end surface in which the auxiliary electrode part 140 is housed and to form a loading area for wafer W (i.e., concave portion 24).

Thus, in configuring the auxiliary electrode part 140 so as to reduce its outer peripheral surface from the upper side toward the lower side, instead of forming the plurality of stepped portions 700 in the outer peripheral surface, the outer peripheral surface of the auxiliary electrode part 140 may be formed into a taper shape so that the outer peripheral surface reduces its diameter linearly from the upper side toward the lower side.

Figure 49:
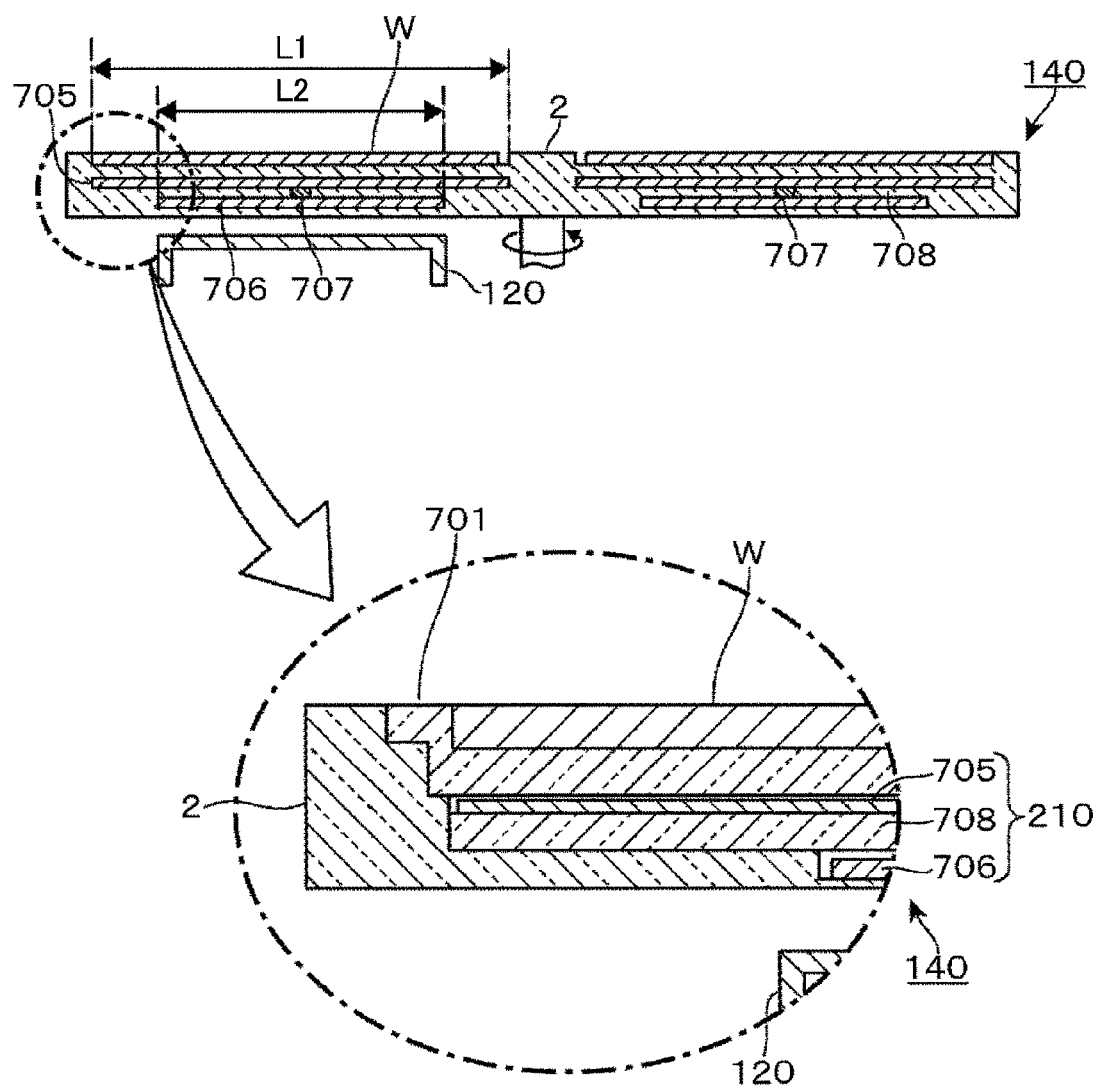
FIG. 49 is a vertical cross-sectional view illustrating another example of the film deposition apparatus.

Moreover, FIG. 49 illustrates an example of the auxiliary electrode part 140 constituted of an upper side electrode plate 705 arranged on the upper side of the inner area 210, and a lower side electrode plate 706 arranged on the lower side relative to the upper side electrode plate 705 and away from the upper side electrode plate 705. These electrode plates 705 and 706 are, for example, respectively formed concentrically to the outer edge of the wafer W. Furthermore, a linear dimension L1 of the upper side electrode plate 705 in the horizontal direction when seen from the rotational direction of the turntable 2 is set to be the same as the linear dimension of the wafer W (300 mm) or more. A linear dimension L2 of the lower side electrode plate 706 when seen from the rotational direction of the turntable 2 is formed to be shorter than the linear dimension L1. The bias electrode part 120 is formed to overlap with the lower side electrode plate 706 and to have the same size as the lower side electrode plate 706 when seen from a planar perspective.

In addition, rod-like supporting columns 707 made of a conductive material are, for example, arranged at a plurality of locations between the electrode plates 705 and 706 to electrically connect the electrode plates 705 and 706 with each other. Moreover, a stiffened member 708 made of a compound having the approximate same coefficient of thermal expansion and contraction as a material forming the turntable 2 (e.g., quartz) is arranged around the supporting column 707 between these electrode plates 705 and 706.

More specifically, the stiffened member 708 forms an approximate disk shape, and a through-hole to penetrate the stiffened member 708 in the vertical direction is formed at an area where the supporting column is arranged. In this example, the stiffened member 708 is made of quartz.

A description is given below of why the stiffened member 708 is arranged. In arranging the auxiliary electrode part 140 in the inner area 210 of the turntable 2, the turntable 2 and the auxiliary electrode part 140 are different in coefficient of thermal expansion and contraction from each other. Hence, the above-mentioned clearance area has to be provided between the inner wall surface of the turntable 2 and the auxiliary electrode part 140. Accordingly, in a sense, since an extra (unnecessary) cavity is formed inside the turntable 2, the strength of the turntable 2 becomes weakened compared to a case without forming such a cavity.

Therefore, by arranging the electrode plates 705 and 706 vertically away from each other, and by arranging the stiffened member 708 between these electrode plates 705 and 706, the coefficient of expansion and contraction of the stiffened member 708 and the coefficient of expansion and contraction of the turntable 2 are made the same. Accordingly, the clearance area does not have to be provided between the inner wall surface of the turntable 2 and the lateral circumferential surface of the stiffened member 708, or requires only a volume smaller than that of the clearance area between the inner wall surface of the turntable 2 and the auxiliary electrode part 140 (electrode plates 705 and 706). This can improve the strength of the turntable 2 better than a case without providing the stiffened member 708.

In addition, the lower surface portion of the auxiliary electrode part 140 (i.e, the lower side electrode plate 706) is made smaller than the upper side electrode plate 705 while forming a capacitive coupling throughout the surface of the wafer W by the auxiliary electrode parts 140. Accordingly, as discussed above, the abnormal electrical discharge between the turntable 2 and the bias electrode 120 can be suppressed. Moreover, because the distance between the auxiliary electrodes 140 adjacent to each other in the rotational direction of the turntable 2 can be ensured, the abnormal electrical discharge between the auxiliary electrode parts 140 can be also prevented.

Figure 50:
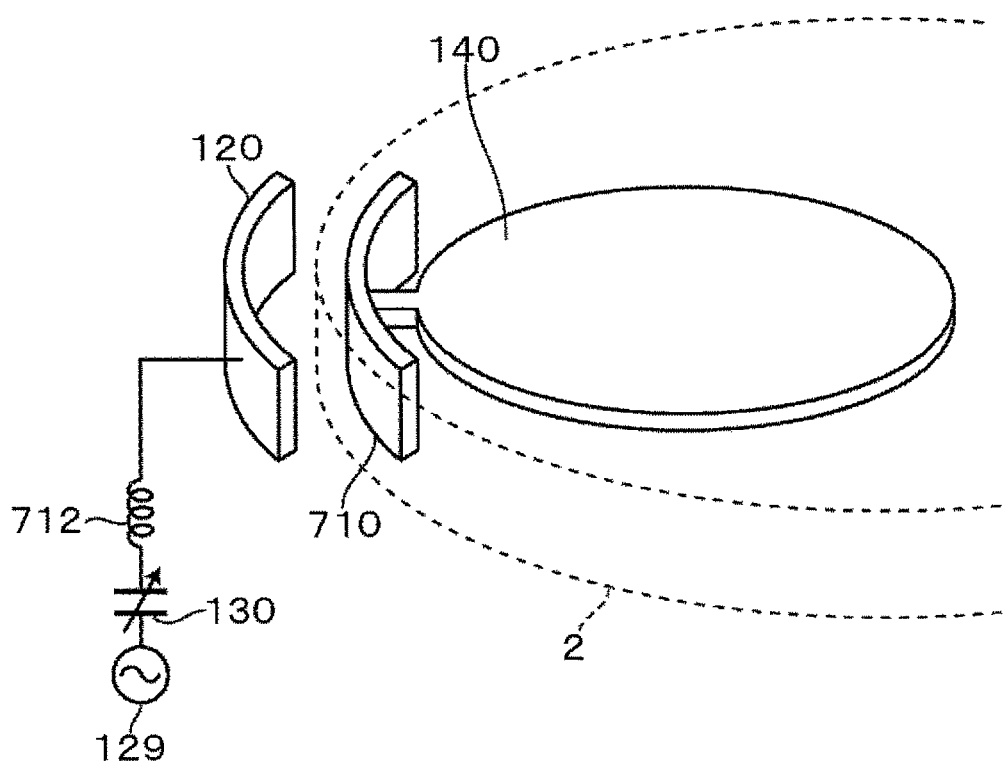
FIG. 50 is a perspective view schematically illustrating another example of the film deposition apparatus.

In the above-described respective examples, in forming the capacitive coupling between the auxiliary electrode part 140 and the bias electrode 120, the bias electrode part 120 is arranged under the turntable 2, but arranging the bias electrode part 120 on the lateral side of the turntable 2 is possible. FIG. 50 schematically illustrates such a configuration, in which the bias electrode part 120 is formed into an arc-like shape so as to be along the lateral circumferential surface of the turntable 2, and is arranged close to the lateral circumferential surface. Furthermore, an opposite electrode part 710 formed into an arc-like shape along the outer periphery surface of the turntable 2 is buried in the turntable 2 so as to face the bias electrode part 120, and this opposite electrode part 710 is electrically connected to the auxiliary electrode part 140. In FIG. 50, an inductor 712 is shown. Here, in FIG. 50, the turntable 2 is shown by dashed lines.

Figure 51:
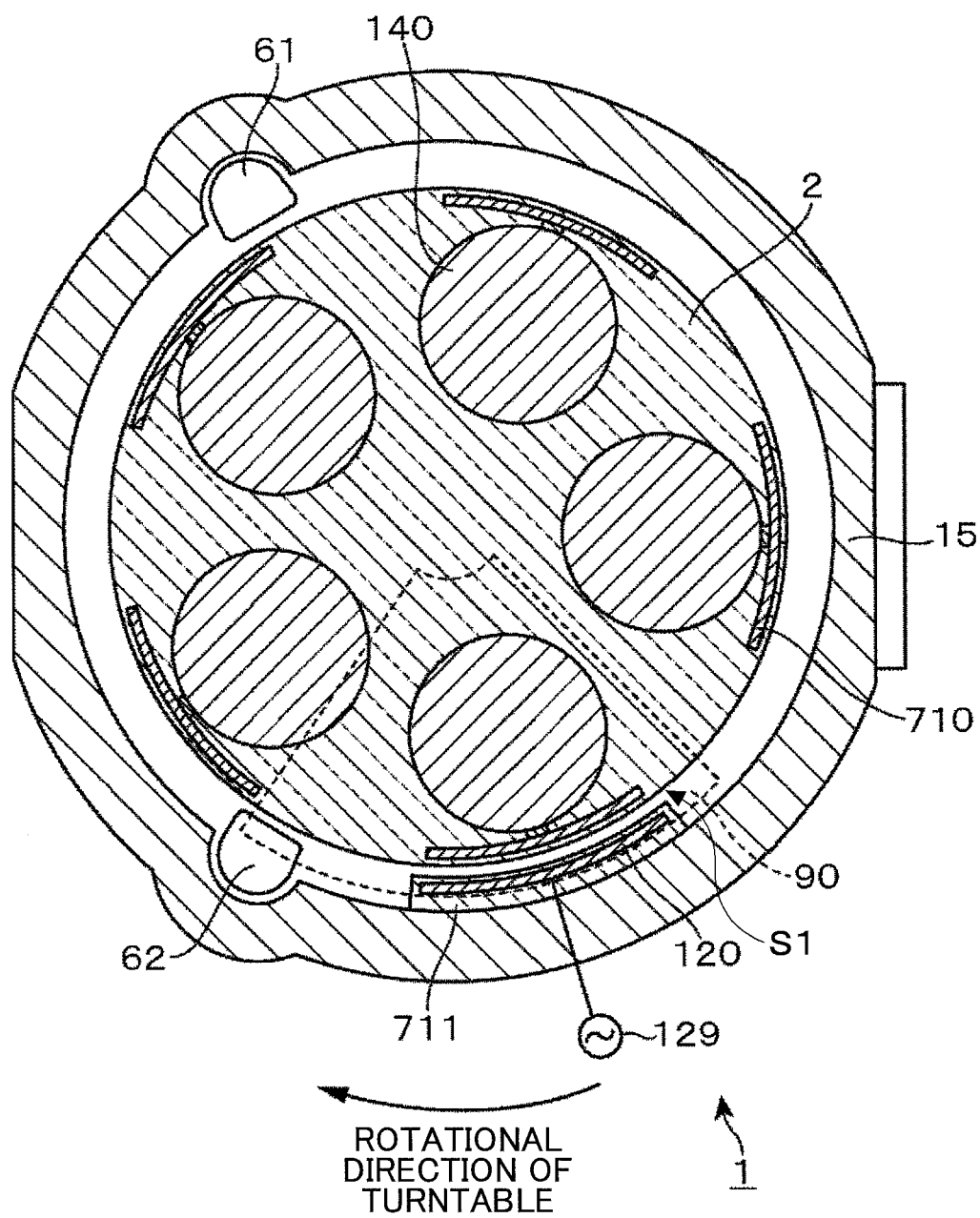
FIG. 51 is a horizontal cross-sectional view illustrating another example of the film deposition apparatus.
Figure 52:
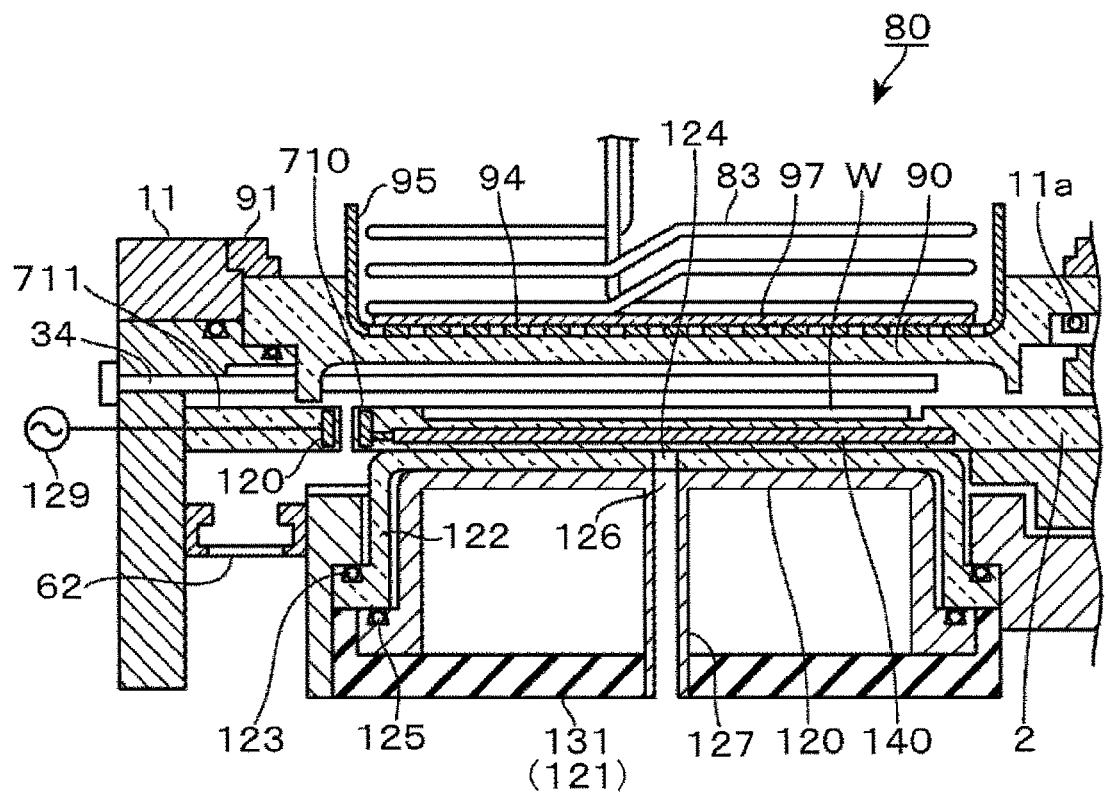
FIG. 52 is a vertical cross-sectional view illustrating another example of the film deposition apparatus.

A description is given below of a specific apparatus when the bias electrode part 120 is arranged on the lateral side of the turntable 2. As illustrated in FIGS. 51 and 52, the bias electrode 120 is arranged on the outer edge side of the turntable 2 relative to the modification area S1 and with a clearance area from the side surface portion of the turntable 2 when seen from a planar perspective. In addition, the bias electrode part 120 is buried in a retention member 711, for example, made of an insulator such as quartz, and is supported on the inner wall surface of the vacuum chamber 1 through the retention member 711 so as to be arranged close to the lateral circumferential surface of the turntable 2. Here, FIG. 51 is shows a view when the turntable 2 is cut in a horizontal direction.

When the bias electrode 120 is arranged on the lateral side of the turntable 2, a capacitive coupling is generated between the bias electrode 120 and the opposite electrode part 710, and a capacitive coupling is similarly generated between the auxiliary electrode part 140 and the wafer W through the opposite electrode part 710, by which the ions are attracted toward the wafer W as described in the above examples.

A description is given below of a preferable height position of the bias electrode part 120 when the bias electrode part 120 is arranged under the turntable 2 without contacting the turntable 2. In arranging the bias electrode part 120 away from the turntable 2, if the turntable 2 and the bias electrode part 120 are too far away from each other, the plasma (i.e., abnormal electrical discharge) is liable to be generated in the unexcited area S2. Hence, it is natural that the bias electrode part 120 is preferably arranged as close to the bias electrode part 120 as possible in order to suppress the abnormal electrical discharge. However, because the amount of thermal expansion of the turntable 2 varies depending on the heating temperature in the vacuum chamber 1, an optimum height position of the bias electrode part 120 can be said to vary at each process recipe. Moreover, for example, possibility of occurrence of the abnormal electrical discharge varies depending on a degree of the vacuum. Furthermore, the optimum height position may vary depending on the rotational speed of the turntable 2 (possibility of wobbling of the turntable 2), processing accuracy of the lower surface of the turntable 2 or the like.

Figure 53:
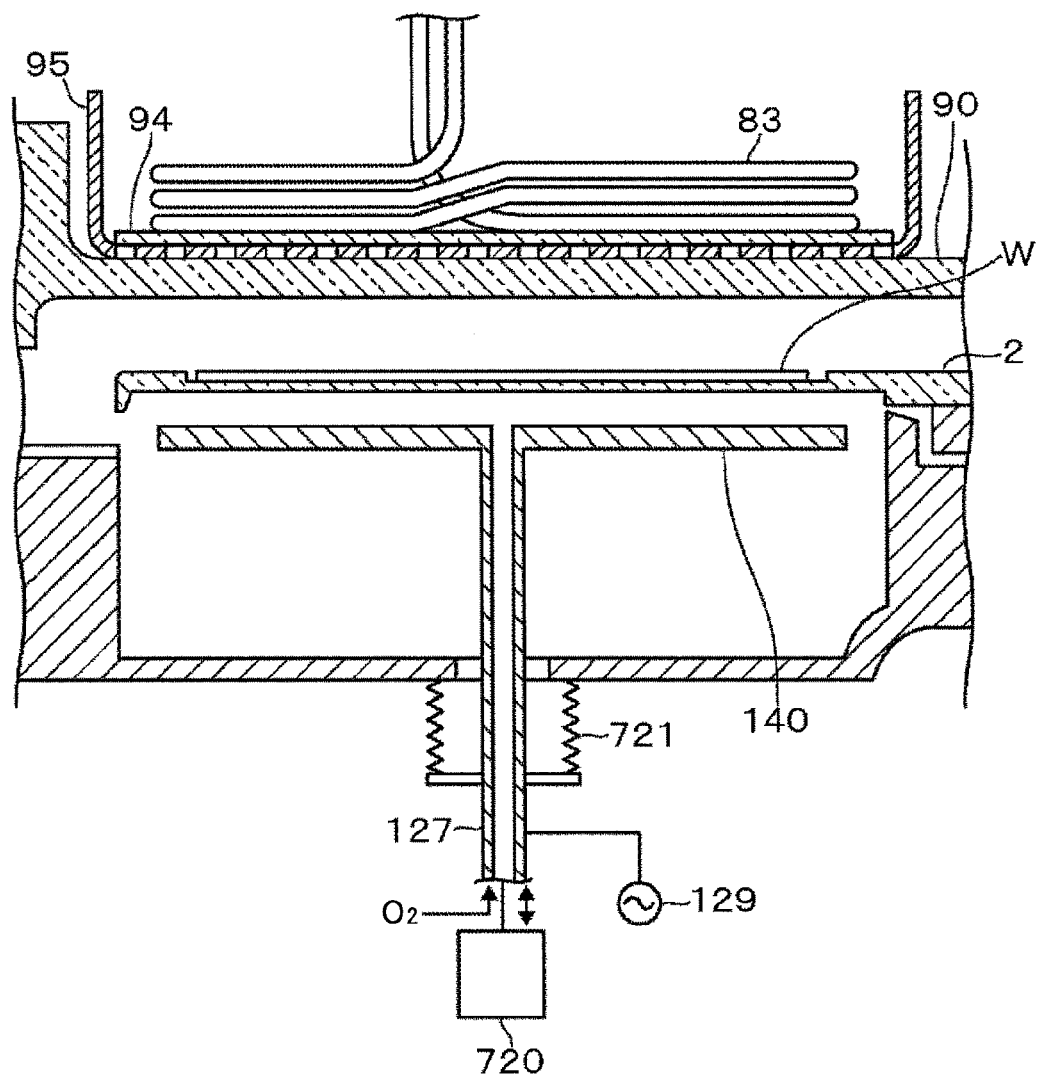
FIG. 53 is a vertical cross-sectional view illustrating another example of the film deposition apparatus.

Therefore, the bias electrode part 120 is preferably configured to be movable up and down. FIG. 53 illustrates such an example, in which a flow passage member forming the gas supply passage 127 is connected to a lifting mechanism 720 on the lower side of the vacuum chamber 1. In FIG. 53, a bellows 721 is provided to hermetically close a space between the gas supply passage 127 and the bottom of the vacuum chamber 1. Here, by providing the above-mentioned insulating member 122 on the upper side of the bias electrode part 120, the insulating member 122 and the bias electrode part 120 may be configured to be movable up and down together, or a coating film using an insulating material such as quartz may be formed on the surface of the bias electrode part 120.

The following TABLE 8 shows a result confirming a plasma generation state (voltage) in a gap distance between the turntable 2 and the bias electrode part 120 when varying a distance between the lower surface of the turntable 2 and the upper surface of the bias electrode part 120, and a radio frequency power value supplied to the bias electrode part 120. In TABLE 8, when the gap distance was 1.4 mm and the radio frequency power value was 700 W, and when the gap distance was 3 mm and the radio frequency power value was 200 W, the plasma was generated in the unexcited area S2 according to the conditions. When the gap distance was 1.4 mm and the radio frequency power value was 800 W or more, and when the gap distance was 3 mm and the radio frequency power value was 300 W or more, the plasma was generated in the unexcited area S2. When the gap distance was 0.8 mm in any radio frequency value; when the gap distance was 1.4 mm and the radio frequency power value was 600 W or less; and when the gap distance was 3 mm and the radio frequency power value was 100 W, the plasma was not generated in the unexcited area S2.

TABLE 8

| | | Gap (mm) | |
|---|---|---|---|
| | 0.8 | 1.4 | 3 |
| Bias Radio Frequency Power (W) | 100 | N.A. | 285 | 313 |
| | 200 | | | 263 |
| | 300 | N.A. | 530 | 333 |
| | 400 | N.A. | N.A. | 402 |
| | 500 | 675 | 618 | 449 |
| | 600 | N.A. | N.A. | 600 |
| | 700 | N.A. | 852 | N.A. |
| | 800 | N.A. | 754 | N.A. |
| | 1500 | 1496 | N.A. | N.A. |
| | 2700 | 2315 | N.A. | N.A. |

In this experiment in TABLE 8, the radio frequency power supplied to the antenna 83 is set at 1500 W, and the bias electrode part 120 is connected to the radio frequency power source 129 of the frequency of 40 MHz. A combination gas of an Ar gas and an $O_2$ gas (Ar: 700 sccm, $O_2$: 70 sccm) is used as the gas supplied to the area under the turntable 2.

As a result, it is noted that the smaller the gap distance between the turntable 2 and the bias electrode part 120 becomes, the less likely the plasma in the unexcited area S2 is to be generated. Moreover, the lower the radio frequency power value becomes, the more likely the abnormal electrical discharge is to be prevented.

Furthermore, when the frequency of the radio frequency power source 129 connected to the bias electrode part 120 is set at 3.2 MHz, as shown in TABLE 9, similar results were obtained.

TABLE 9

| | | Gap (mm) | |
|---|---|---|---|
| | 0.8 | 1.4 | 3 |
| Bias Radio Frequency Power (W) | 50 | N.A. | N.A. | 751 |
| | 100 | N.A. | N.A. | 787 |
| | 200 | N.A. | 1305 | 771 |
| | 300 | N.A. | 1403 | N.A. |
| | 400 | N.A. | 1527 | N.A. |
| | 500 | 1726 | 1000 | N.A. |
| | 800 | 1980 | N.A. | N.A. |
| | 1200 | 2280 | N.A. | N.A. |
| | 1400 | 2300 | N.A. | N.A. |

In configuring the bias electrode part 120 to be movable up and down, by introducing an inactive gas to an area (i.e., unexcited area S2) between the turntable 2 and the bias electrode part 120, the pressure in the unexcited area S2 may be higher than the pressure of the inner atmosphere of the vacuum chamber 1. Furthermore, by opening the evacuation port extending from the not shown vacuum pump in the unexcited area S2, the unexcited area S2 may be set at a pressure lower than the inner area of the vacuum chamber 1.

The above-described bias electrode part 120 or the auxiliary electrode part 140 may be formed into a quadrangle shape, a sectorial shape, or a comb shape instead of forming into a circular shape as seen from a planar perspective. Such a shape of bias electrode part 120 or an auxiliary electrode part 140 may be inclined, for example, downward from the center to the outer edge of the turntable 2, or upward from the center to the outer edge of the turntable 2. In other words, the bias electrode part 120 or the auxiliary electrode part 140 may be formed into a proper shape so as to a degree of the plasma treatment on the wafer W becomes uniform across the surface.

Figure 54:
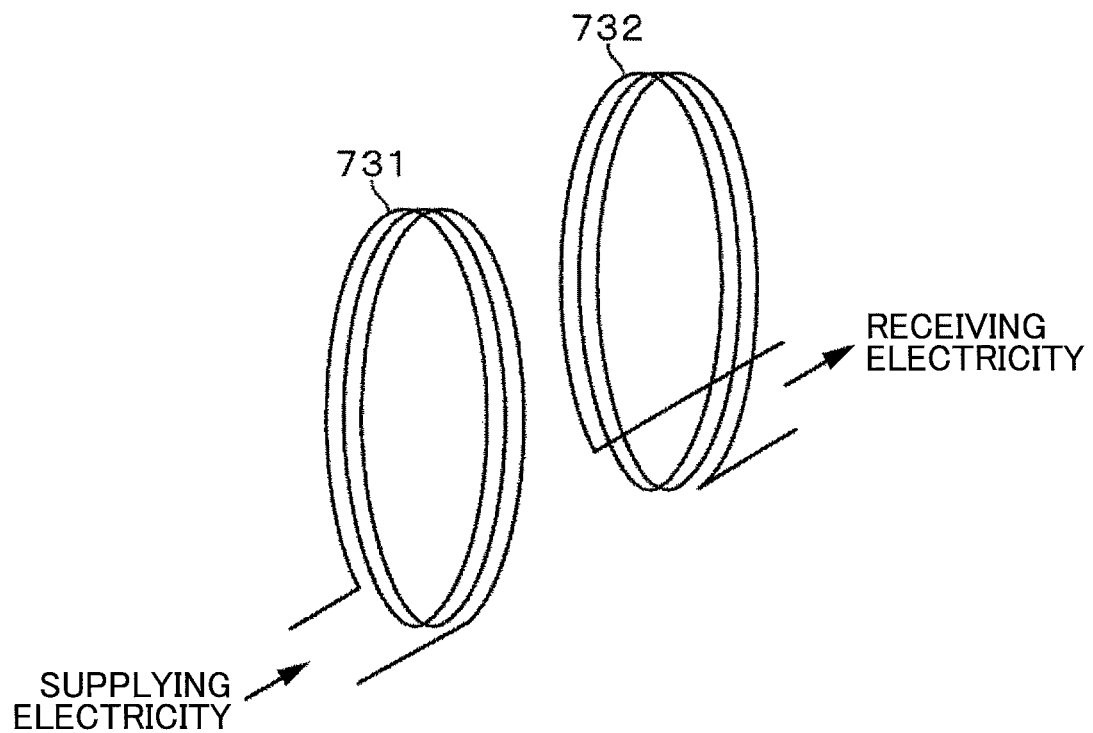
FIG. 54 is a conceptual diagram for explaining another example of the film deposition apparatus.

In addition, the electrostatic induction between the bias electrode part 120 and the wafer W is utilized as a method of supplying the radio frequency power for bias to the wafer W on the turntable 2 without contact in examples in FIG. 1 and the like. However, an induced electromagnetic field resonance may be utilized instead of such an electrostatic induction. FIG. 54 schematically illustrates a mechanism supplying electricity to the wafer W by utilizing the induced electromagnetic field resonance, in which a pair of inductors 731 and 732 that resonates at a common resonance frequency are arranged close to each other, and the axis direction wound around by the inductors 731 and 732 is aligned with each other (i.e., aligned in a straight line). Then, when the radio frequency power is supplied to one inductor 731 (power supply side), the inductors 731 and 732 resonate with each other, and radio frequency power is supplied to the other inductor 732 (power receiving side) without contact.

Figure 55:
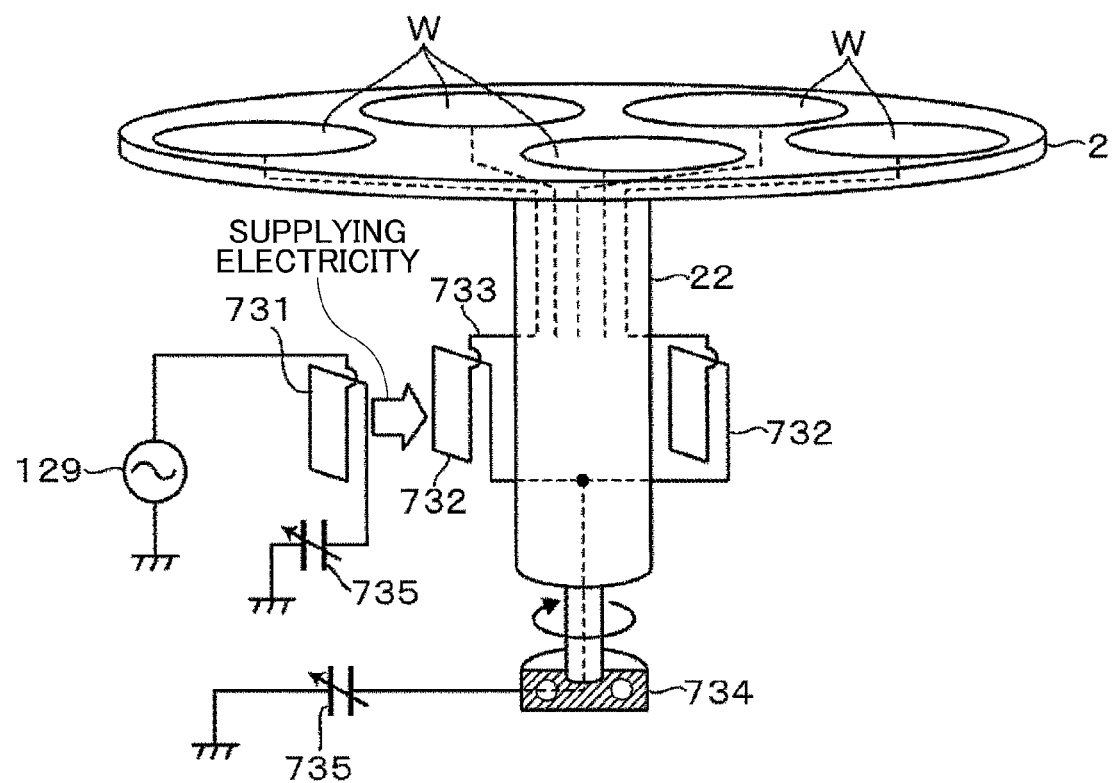
FIG. 55 is a schematic diagram when the conceptual diagram is applied to the film deposition apparatus.

FIG. 55 schematically illustrates a configuration of applying this induced electromagnetic field resonance to the above-described film deposition apparatus, in which the inductor 731 on the power supply side is, for example, arranged at a position facing the rotational shaft 22 under the antenna 83 (inside the case body 20). The inductor 731 on the power supply side is arranged so that the axial direction around which the inductor 731 is wound faces the rotational shaft 22 side and a horizontal direction. On the other hand, the inductors 732 on the power receiving side are arranged at five locations on the lateral surface of the rotational shaft 22 along the rotational direction of the rotational shaft 22 at the same height position as the inductor 731 on the power supply side. Furthermore, these five inductors 732 on the power receiving side are arranged so that the axial directions around which the five inductors 732 are wound respectively face outward when seen from the rotational center of the rotational shaft 22, and horizontal directions.

Figure 56:
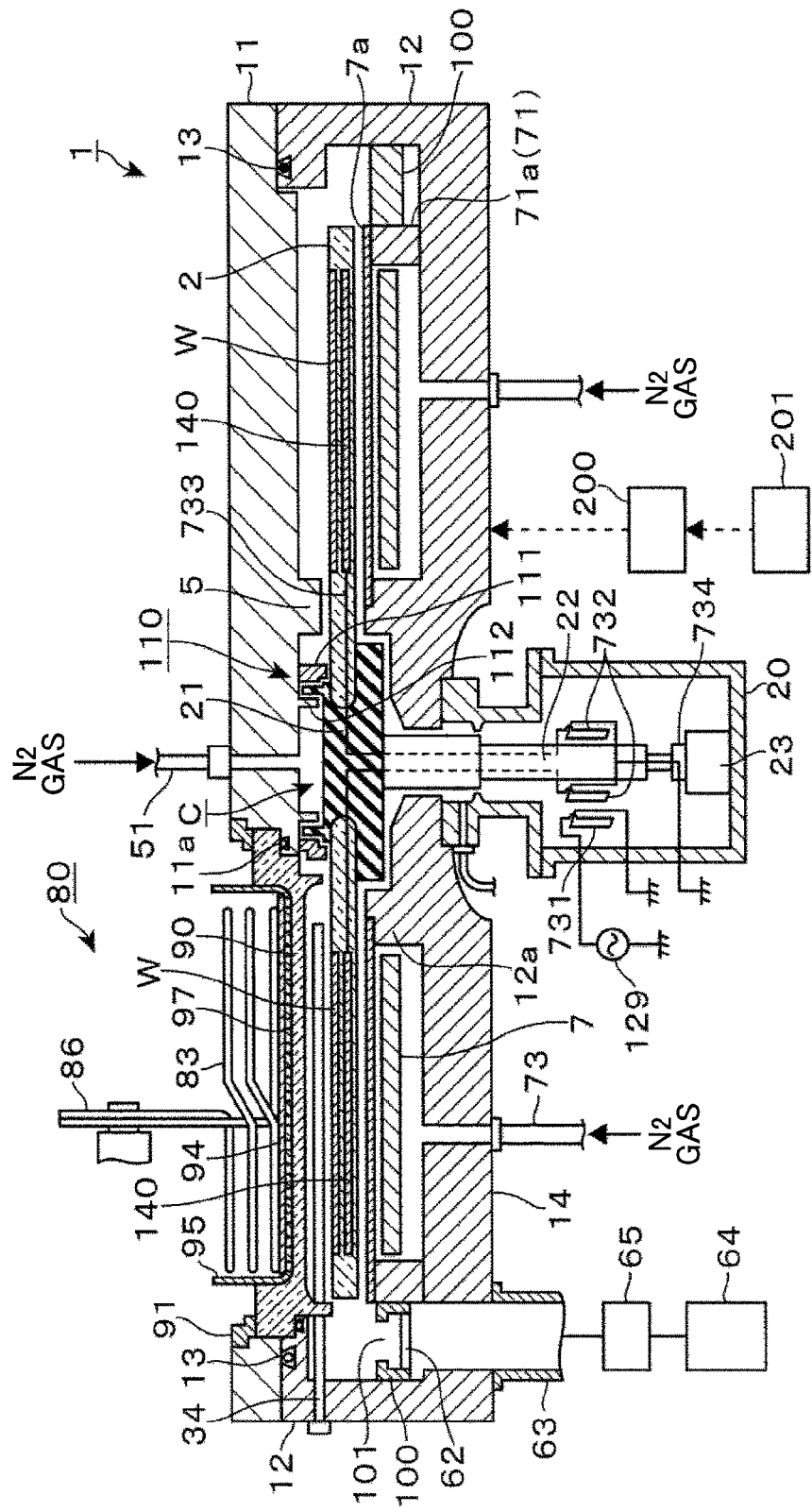
FIG. 56 is a vertical cross-sectional view illustrating a film deposition apparatus in the example.

In addition, these five inductors 732 on the power receiving side are individually connected to the respective wafers W so that when the respective inductors 732 face the inductor 731 on the power supply side, the inductor 732 facing the inductor 731 is connected to the wafer W under the antenna 83. In this manner, the electricity is supplied to the inductor 732 on the power receiving side while being in the area under the antenna 83 (which means the area opposite to the inductor 731 on the power supply side), and is not supplied to the other four inductors 732. Accordingly, along with the rotation of the rotational shaft 22, the bias voltage is individually applied to the five wafers W along the circumferential direction in sequence. However, FIG. 55 depicts only two of the five wafers W. FIG. 56 described below is similar in this regard.

An example is taken below of a method of individually connecting the respective inductors 732 on the power receiving side to the respective wafers W. More specifically, an apical end of a conductive path 733 extending from one end of both ends of the inductors 732 on the power receiving side may be exposed in a contact surface with the back surface of the wafer W in the turntable 2. Alternatively, a conductive plate (not shown in the drawing) connected to the apical end of the conductive path 733 is arranged in the concave portion 24, and the wafers W are respectively loaded on the conductive plate. FIG. 56 illustrates an example of using the above-mentioned auxiliary electrodes 140 as a configuration of individually connecting the inductors 732 on the power supply side to the wafers W. More specifically, the inductors 732 on the power receiving side are respectively connected to the auxiliary electrode parts 140 through the conductive paths 733 provided inside the rotational shaft 22 and the turntable 2.

As described in detail, the power is supplied through the electrostatic induction between the auxiliary electrodes 140 and the wafers W.

In FIGS. 55 and 56, a bearing part 734 is provided at the lower end of the rotational shaft 22 to connect the inductors 732 on the power receiving side to the ground. This bearing part 734 includes a slip ring, a rotary connector, a conductive bearing or the like, and is configured to connect the other end other than the wafer W side of both sided of the respective inductors 732 on the power receiving side to the ground. In FIG. 55, a variable capacitor or a fixed capacitor 735 is provided, and depiction of the capacitor 735 is omitted in FIG. 56. In FIG. 56, the rotational shaft 22, the core portion 21 and the turntable 2 are respectively made of an insulator such as quartz.

By utilizing the above-mentioned inducted electromagnetic field resonance, individual power supplying circuits are formed for the respective wafers W. This prevents the bias voltage from being applied to the wafers W adjacent to each other so as to cross therebetween, by which the abnormal electrical discharge can be prevented as described in FIG. 50. Moreover, when using radio frequency of a MHz band (e.g., 13.56 MHz) as the radio frequency power source 129, a winding around area of the inductors 731 and 732 needs a smaller area than that in a case, for example, of using a frequency band of a degree of tens Hz. More specifically, the area of these inductors 731 and 732 when seen from the winding axis direction is only a few dozens of square millimeters. Hence, when the power supply is performed by the induced electromagnetic field resonance by using the radio frequency power source 129 of the MHz band, the power supply mechanism to the respective wafers W (i.e., inductors 731 and 732) can be downsized.

Figure 57:
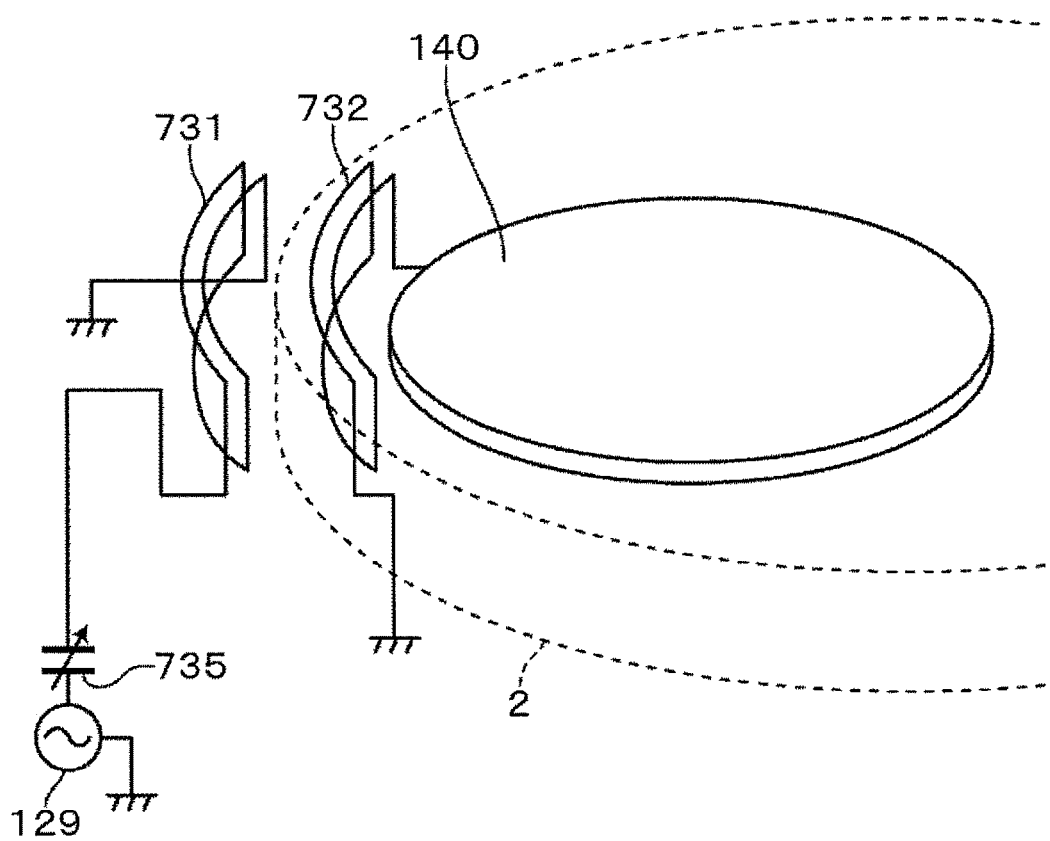
FIG. 57 is a perspective view schematically illustrating another example of the film deposition apparatus.

Accordingly, since the inductors 731 and 732 need a smaller size, these inductors 731 and 732 may be arranged as described below, instead of providing the inductors 731 and 732 on the rotational shaft 22 side. More specifically, as shown in FIG. 57, the inductor 731 on the power supply side is arranged at a position facing the lateral circumferential surface of the turntable 2 and away from the antenna 83 on the outer edge side of the turntable 2 as seen from a planar perspective. On the other hand, the inductor 732 on the power receiving side is arranged at a position facing the lateral circumferential surface of the turntable 2 inside the turntable 2. In other words, the inductors 731 and 732 can be said to be arranged by utilizing the layout shown in FIG. 50. In such a configuration, the similar effect can be obtained. A terminal on the ground side of the inductor 732 on the power receiving side, as described above, is grounded through the bearing part 734 provided on the lower end side of the rotational shaft 22.

In the above examples utilizing the induced electromagnetic field resonance, the radio frequency power is individually supplied to five wafers W on the turntable 2, but, as shown in FIG. 22, while respectively constructing the rotational shaft 22, the core portion 21 and the turntable 2 of a conductor, and the power may be supplied to the five wafers W together.

Furthermore, as for the configuration of attracting the ions in the plasma toward the wafer W, for example, instead of generating the electrostatic induction, by causing the capacitive coupling between the bias electrode 120 and the Faraday shield 95, utilizing the voltage difference between the bias electrode part 120 and the Faraday shield is possible.

In addition, in the induced electromagnetic field resonance, because supplying the power is possible without getting the inductors 731 and 732 close to each other, the inductors 731 may be arranged outside the case body 20.

As described above, according to some embodiments of the present invention, in performing a plasma treatment on a substrate rotating on a turntable, a bias voltage is applied to the substrate on the turntable. This makes it possible to attract the plasma toward the wafer, by which high-density plasma can be formed in the vicinity of the substrate. Accordingly, even if a concave portion with a high aspect ratio is formed in a surface of the substrate, a degree of the plasma treatment can be made uniform.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A film deposition apparatus configured to perform a film deposition process on a substrate in a vacuum chamber, the film deposition apparatus comprising:
    a turntable configured to rotate a substrate loading area to receive the substrate;
    a film deposition area including at least one process gas supplying part configured to supply a process gas onto the substrate loading area and configured to form a thin film by depositing at least one of an atomic layer and a molecular layer along with a rotation of the turntable;
    a plasma treatment part provided away from the film deposition area in a rotational direction of the turntable and configured to treat the at least one of the atomic layer and the molecular layer for modification by plasma generated by converting a plasma generating gas to the plasma;
    a bias electrode part provided under the turntable without contacting the turntable and configured to generate bias potential to attract ions in the plasma toward the substrate;
    an insulating member provided between the turntable and the bias electrode part; and
    an evacuation mechanism configured to evacuate the vacuum chamber.

2. The film deposition apparatus as claimed in claim 1,
    wherein the film deposition area includes a plurality of process areas each including the process gas supplying part provided away from each other in the rotational direction of the turntable to supply a plurality process gases that react each other to the substrate loading area, each of the plurality of process areas having a first ceiling surface, and
    wherein a plurality of separation gas areas are provided between the plurality of process areas to separate the plurality of process areas from each other by supplying a separation gas respectively, each of the plurality of separation gas areas having a second ceiling surface lower than the first ceiling surface of each of the plurality of process areas.

3. The film deposition apparatus as claimed in claim 1, further comprising:
    a plasma prevention gas supplying part configured to supply a plasma prevention gas to a gap between the turntable and the bias electrode part in order to prevent generation of the plasma in the gap.

4. The film deposition apparatus as claimed in claim 1, wherein a concave portion configured to allow the bias electrode part to be arranged thereunder is formed in a lower surface of the turntable in a ring form along a circumferential direction of the turntable.

5. A film deposition apparatus configured to perform a film deposition process on a substrate in a vacuum chamber, the film deposition apparatus comprising:
    a turntable configured to rotate a substrate loading area to receive the substrate;
    a film deposition area including at least one process gas supplying part configured to supply a process gas onto the substrate loading area and configured to form a thin film by depositing at least one of an atomic layer and a molecular layer along with a rotation of the turntable;
    a plasma treatment part provided away from the film deposition area in a rotational direction of the turntable and configured to treat the at least one of the atomic layer and the molecular layer for modification by plasma generated by converting a plasma generating gas to the plasma;
    a bias electrode part provided under the turntable without contacting the turntable and configured to generate bias potential to attract ions in the plasma toward the substrate; and
    an evacuation mechanism configured to evacuate the vacuum chamber,
    wherein the turntable is made of an insulator, and
    wherein at least one auxiliary electrode part is buried in the turntable at a position under the substrate loading area in order to subserve the electrostatic induction generated between the bias electrode part and the substrate.

6. The film deposition apparatus as claimed in claim 5,
    wherein the at least one auxiliary electrode part is arranged in an inner space in the turntable so as to form gaps relative to an inner wall surface and a ceiling surface of the inner space to allow the at least one auxiliary electrode part to expand by thermal expansion, and
    wherein at least one supporting column is provided in the inner space and is configured to connect the ceiling surface and a bottom surface of the inner space.

7. The film deposition apparatus as claimed in claim 5,
    wherein the at least one auxiliary electrode part is arranged in an inner space in the turntable so as to form gaps relative to an inner wall surface and a ceiling surface of the inner space to allow the at least one auxiliary electrode part to expand by thermal expansion, and
    wherein a ventiduct is formed configured to communicate the inner space with outside of the turntable.

8. The film deposition apparatus as claimed in claim 1,
    wherein the turntable is made of an insulator, and
    wherein at least one auxiliary electrode part including at least one of a conductor and a semiconductor is arranged on one of an upper surface and a lower surface of the turntable at a position under the wafer loading area in order to subserve the electrostatic induction generated between the bias electrode part and the substrate on the substrate loading area.

9. The film deposition apparatus as claimed in claim 1, wherein a thickness dimension of the turntable is from 5 mm to 20 mm.

10. The film deposition apparatus as claimed in claim 1,
    wherein the plasma treatment part includes an antenna wound around a vertical axis and configured to allow radio frequency power to be supplied, and wherein an area of the bias electrode part is equal to or more than an area of the antenna as seen from a planar perspective.

11. A substrate processing apparatus comprising:
a turntable configured to rotate a substrate loading area to receive the substrate;
a plasma treatment part configured to convert a plasma generating gas to plasma and configured to supply the plasma to the substrate loading area in order to perform a plasma treatment on the substrate;
a bias electrode part provided under the turntable without contacting the turntable and configured to generate bias potential to attract ions in the plasma toward the substrate;
an insulating member provided between the turntable and the bias electrode part; and
an evacuation mechanism configured to evacuate the vacuum chamber.

12. A film deposition method to deposit a film on a substrate using the film deposition apparatus as claimed in claim 1, the film deposition method comprising steps of:
loading a substrate on a substrate loading area on a turntable, the substrate including at least one concave portion formed in a surface thereof;
rotating the substrate loading area by rotating the turntable;
depositing at least one of a molecular layer and an atomic layer on the substrate by supplying the process gas onto the substrate on the substrate loading area;
supplying a plasma generating gas in the vacuum chamber and converting the plasma generating gas to plasma, thereby performing a modification treatment of at least one of the molecular layer and the atomic layer;
attracting ions in the plasma toward the substrate by generating and apply a bias voltage to the substrate by electrostatic induction, using a bias electrode part covered with an insulating member provided between the turntable and the bias electrode part; and
evacuating the vacuum chamber.

13. The film deposition method as claimed in claim 12, wherein the film deposition area includes a plurality of process areas each including the process gas supplying part provided away from each other in the rotational direction of the turntable, and the at least one molecular layer and the atomic layer is deposited by supply a plurality process gases that react each other to the substrate loading area from the respective process gas supplying part, each of the plurality of process areas having a first ceiling surface, and
wherein a plurality of separation gas areas are provided between the plurality of process areas, and a separation gas is supplied in the plurality of separation gas areas respectively to separate the plurality of process areas from each other, each of the plurality of separation gas areas having a second ceiling surface lower than the first ceiling surface of each of the plurality of process areas.

14. The film deposition method as claimed in claim 12, further comprising a step of supplying a plasma prevention gas to a gap between the turntable and the bias electrode part in order to prevent generation of plasma in the gap.

15. A film deposition method to deposit a film on a substrate using the film deposition apparatus configured to perform a film deposition process on the substrate in a vacuum chamber, the film deposition apparatus including,
a turntable configured to rotate a substrate loading area to receive the substrate;
a film deposition area including at least one process gas supplying part configured to supply a process gas onto the substrate loading area and configured to form a thin film by depositing at least one of an atomic layer and a molecular layer along with a rotation of the turntable;
a plasma treatment part provided away from the film deposition area in a rotational direction of the turntable and configured to treat the at least one of the atomic layer and the molecular layer for modification by plasma generated by converting a plasma generating gas to the plasma;
a bias electrode part provided under the turntable without contacting the turntable and configured to generate bias potential to attract ions in the plasma toward the substrate; and
an evacuation mechanism configured to evacuate the vacuum chamber,
the film deposition method comprising steps of:
loading a substrate on a substrate loading area on a turntable, the substrate including at least one concave portion formed in a surface thereof;
rotating the substrate loading area by rotating the turntable;
depositing at least one of a molecular layer and an atomic layer on the substrate by supplying the process gas onto the substrate on the substrate loading area;
supplying a plasma generating gas in the vacuum chamber and converting the plasma generating gas to plasma, thereby performing a modification treatment of at least one of the molecular layer and the atomic layer;
attracting ions in the plasma toward the substrate by generating and apply a bias voltage to the substrate by electrostatic induction, using a bias electrode part; and
evacuating the vacuum chamber,
wherein the concave portion has an aspect ratio from ten to two hundred.

16. A film deposition method comprising steps of:
loading a substrate on a substrate loading area on a turntable, the substrate including at least one concave portion formed in a surface thereof;
rotating the substrate loading area by rotating the turntable;
depositing at least one of a molecular layer and an atomic layer on the substrate by supplying the process gas onto the substrate on the substrate loading area;
supplying a plasma generating gas in the vacuum chamber and converting the plasma generating gas to plasma, thereby performing a modification treatment of at least one of the molecular layer and the atomic layer;
attracting the plasma toward the substrate by applying a bias voltage to the substrate by using a bias electrode part covered with an insulating member provided between the turntable and the bias electrode part; and
evacuating the vacuum chamber.

17. The film deposition method as claimed in claim 16, further comprising:
supplying a separation gas to the substrate in a separation area having a first ceiling between the step of depositing at least one of the molecular layer and the atomic layer on the substrate and the step of supplying the plasma generation gas in the vacuum chamber in order to purge the substrate,
wherein the step of depositing at least one of the molecular layer and the atomic layer on the substrate is performed in a film deposition area having a second ceiling, the first ceiling of the separation area being lower than the second ceiling of the film deposition area.

* * * * *